(12) United States Patent
Shibata et al.

(10) Patent No.: US 10,679,700 B2
(45) Date of Patent: Jun. 9, 2020

(54) SEMICONDUCTOR MEMORY DEVICE

(71) Applicant: TOSHIBA MEMORY CORPORATION, Minato-ku (JP)

(72) Inventors: Noboru Shibata, Kawasaki (JP); Kazuaki Isobe, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 122 days.

(21) Appl. No.: 16/048,912

(22) Filed: Jul. 30, 2018

(65) Prior Publication Data

US 2019/0122734 A1 Apr. 25, 2019

(30) Foreign Application Priority Data

Oct. 23, 2017 (JP) ................................. 2017-204702

(51) Int. Cl.
*G11C 11/00* (2006.01)
*G11C 16/04* (2006.01)
(Continued)

(52) U.S. Cl.
CPC ........ *G11C 16/0483* (2013.01); *G11C 7/1006* (2013.01); *G11C 11/5628* (2013.01); *G11C 11/5635* (2013.01); *G11C 11/5642* (2013.01); *G11C 16/0408* (2013.01); *G11C 16/0466* (2013.01); *G11C 16/08* (2013.01); *G11C 16/10* (2013.01); *G11C 16/14* (2013.01); *G11C 16/26* (2013.01); *H01L 23/528* (2013.01);
(Continued)

(58) Field of Classification Search
CPC ............ G11C 16/0483; G11C 11/4096; G11C 11/5628; G11C 16/26; G11C 7/00; G11C 8/12; G11C 11/4076; G11C 8/08; G11C 11/4026; G11C 16/28; G11C 7/1045; G11C 7/1087; G11C 8/16
See application file for complete search history.

(56) References Cited

U.S. PATENT DOCUMENTS 9,379,130 B2 6/2016 Mikajiri
9,466,611 B2 10/2016 Komori et al.
(Continued)

FOREIGN PATENT DOCUMENTS

JP 2012-33216 2/2012
JP 2015-149413 8/2015
(Continued)

*Primary Examiner* — Hien N Nguyen
(74) *Attorney, Agent, or Firm* — Oblon, McClelland, Maier & Neustadt, L.L.P.

(57) ABSTRACT

According to one embodiment, a semiconductor memory device includes first to nth string units (n being a natural number of 3 or more), a plurality of layers of word lines, and (n−1) layers of select gate layers. The first to nth string units each includes a memory string. The memory string includes a plurality of memory cells and a plurality of select transistors connected in series in a first direction. The (n−1) layers of select gate layers include first to (2×(n−1))th select gates electrically isolated from each other. The first string unit is selected by the first to (n−1)th select gates. The kth string unit (k being not less than 1 and not more than n) is selected by the kth to (n+k−2)th select gates. The nth string unit is selected by the nth to (2×(n−1))th select gates.

16 Claims, 46 Drawing Sheets

(51) Int. Cl.
- *H01L 23/528* (2006.01)
- *H01L 27/11556* (2017.01)
- *G11C 16/26* (2006.01)
- *H01L 27/1157* (2017.01)
- *H01L 27/11582* (2017.01)
- *G11C 16/14* (2006.01)
- *H01L 27/11524* (2017.01)
- *G11C 7/10* (2006.01)
- *G11C 11/56* (2006.01)
- *G11C 16/10* (2006.01)
- *G11C 16/08* (2006.01)
- *H01L 21/768* (2006.01)
- *H01L 29/788* (2006.01)
- *H01L 29/792* (2006.01)
- *H01L 21/311* (2006.01)
- *H01L 21/285* (2006.01)

(52) U.S. Cl.
CPC .... *H01L 27/1157* (2013.01); *H01L 27/11524* (2013.01); *H01L 27/11556* (2013.01); *H01L 27/11582* (2013.01); *H01L 21/28568* (2013.01); *H01L 21/31116* (2013.01); *H01L 21/76802* (2013.01); *H01L 21/76879* (2013.01); *H01L 29/7883* (2013.01); *H01L 29/7889* (2013.01); *H01L 29/7926* (2013.01)

(56) References Cited

U.S. PATENT DOCUMENTS

| | | | |
|---|---|---|---|
| 9,520,407 B2 | 12/2016 | Fukuzumi et al. | |
| 9,666,296 B1* | 5/2017 | Maejima | G11C 16/0483 |
| 2012/0026775 A1 | 2/2012 | Yamada et al. | |
| 2012/0268992 A1* | 10/2012 | Kim | G11C 16/0483 |
| | | | 365/185.11 |
| 2014/0247658 A1* | 9/2014 | Hosono | G11C 16/24 |
| | | | 365/185.11 |
| 2015/0003157 A1* | 1/2015 | Aritome | G11C 16/0408 |
| | | | 365/185.11 |

FOREIGN PATENT DOCUMENTS

| | | |
|---|---|---|
| JP | 2015-176923 | 10/2015 |
| JP | 2016-62952 | 4/2016 |

* cited by examiner

FIG. 22A

|       | SU0 SELECTED | SU1 SELECTED | SU2 SELECTED | SU3 SELECTED |
|-------|--------------|--------------|--------------|--------------|
| SGS0A | "L"          | "H"          | "L"          | "L"          |
| SGS1A | "H"          | "L"          | "L"          | "L"          |
| SGS0B | "L"          | "L"          | "L"          | "H"          |
| SGS1B | "L"          | "L"          | "H"          | "L"          |

FIG. 22B

|      | SU0 SELECTED | SU1 SELECTED | SU2 SELECTED | SU3 SELECTED |
|------|--------------|--------------|--------------|--------------|
| SGS0 | "L"          | "H"          | "H"          | "H"          |
| SGS1 | "H"          | "L"          | "H"          | "H"          |
| SGS2 | "H"          | "H"          | "L"          | "H"          |
| SGS3 | "H"          | "H"          | "H"          | "L"          |

FIG. 22C

|      | SU0 SELECTED | SU1 SELECTED | SU2 SELECTED | SU3 SELECTED | SU4 SELECTED | SU5 SELECTED |
|------|--------------|--------------|--------------|--------------|--------------|--------------|
| SGS0 | "L"          | "L"          | "L"          | "H"          | "H"          | "H"          |
| SGS1 | "L"          | "H"          | "H"          | "L"          | "L"          | "H"          |
| SGS2 | "H"          | "L"          | "H"          | "L"          | "H"          | "L"          |
| SGS3 | "H"          | "H"          | "L"          | "H"          | "L"          | "L"          |

FIG. 34A

|      | SU0 SELECTED | SU1 SELECTED | SU2 SELECTED | SU3 SELECTED |
|------|------|------|------|------|
| SGD0 | "L" | "H" | "H" | "H" |
| SGD1 | "H" | "L" | "H" | "H" |
| SGD2 | "H" | "H" | "L" | "H" |
| SGD3 | "H" | "H" | "H" | "L" |
| SGS0 | "L" | "H" | "H" | "H" |
| SGS1 | "H" | "L" | "H" | "H" |
| SGS2 | "H" | "H" | "L" | "H" |
| SGS3 | "H" | "H" | "H" | "L" |

FIG. 34B

|      | SU0 SELECTED | SU1 SELECTED | SU2 SELECTED | SU3 SELECTED | SU4 SELECTED | SU5 SELECTED |
|------|------|------|------|------|------|------|
| SGD0 | "L" | "L" | "L" | "H" | "H" | "H" |
| SGD1 | "L" | "H" | "H" | "L" | "L" | "H" |
| SGD2 | "H" | "L" | "H" | "L" | "H" | "L" |
| SGD3 | "H" | "H" | "L" | "H" | "L" | "L" |
| SGS0 | "L" | "L" | "L" | "H" | "H" | "H" |
| SGS1 | "L" | "H" | "H" | "L" | "L" | "H" |
| SGS2 | "H" | "L" | "H" | "L" | "H" | "L" |
| SGS3 | "H" | "H" | "L" | "H" | "L" | "L" |

FIG. 34C

|      | SU0 SELECTED | SU1 SELECTED | SU2 SELECTED | SU3 SELECTED |
|------|------|------|------|------|
| SGD0 | "L" | "H" | "H" | "H" |
| SGD1 | "H" | "L" | "H" | "H" |
| SGD2 | "H" | "H" | "L" | "H" |
| SGD3 | "H" | "H" | "H" | "L" |

FIG. 34D

|      | SU0 SELECTED | SU1 SELECTED | SU2 SELECTED | SU3 SELECTED | SU4 SELECTED | SU5 SELECTED |
|------|------|------|------|------|------|------|
| SGD0 | "L" | "L" | "L" | "H" | "H" | "H" |
| SGD1 | "L" | "H" | "H" | "L" | "L" | "H" |
| SGD2 | "H" | "L" | "H" | "L" | "H" | "L" |
| SGD3 | "H" | "H" | "L" | "H" | "L" | "L" |

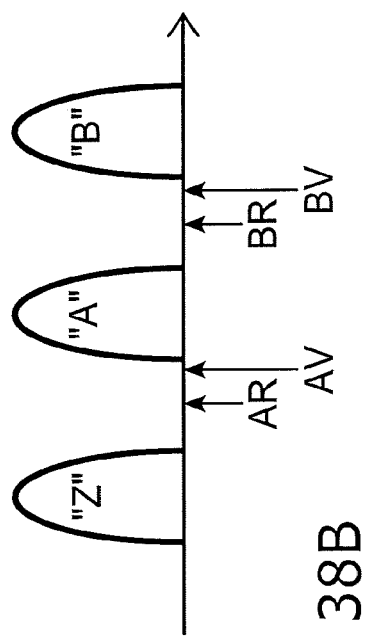
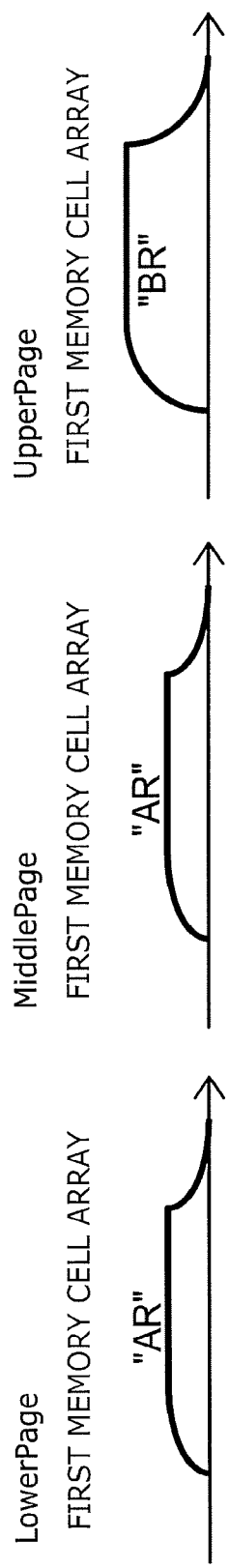
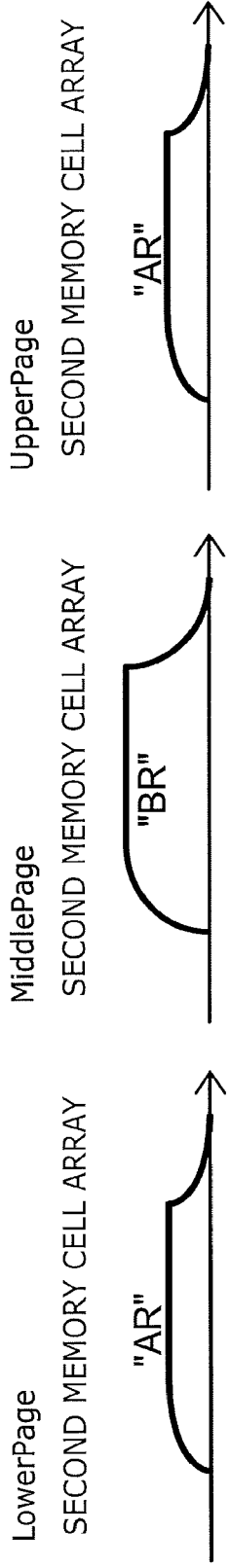

FIG. 39A

| Vth OF MEMORY CELL | | LowerPage READ LEVEL | | MiddlePage READ LEVEL | | UpperPage READ LEVEL | | DATA READ TO THE OUTSIDE | | |
|---|---|---|---|---|---|---|---|---|---|---|
| FIRST MEMORY CELL ARRAY | SECOND MEMORY CELL ARRAY | FIRST MEMORY CELL ARRAY (AR) | SECOND MEMORY CELL ARRAY (AR) | FIRST MEMORY CELL ARRAY (AR) | SECOND MEMORY CELL ARRAY (BR) | FIRST MEMORY CELL ARRAY (BR) | SECOND MEMORY CELL ARRAY (AR) | Lower Page | Middle Page | Upper Page |
| N | N | L | L | L | L | L | L | 1 | 1 | 1 |
| N | A | L | L | L | L | L | H | 1 | 1 | 0 |
| N | B | L | H | L | H | L | L | 1 | 0 | 0 |
| A | N | H | L | H | L | L | H | 1 | 0 | 1 |
| A | A | H | H | H | L | L | H | 0 | 0 | 0 |
| A | B | H | L | H | H | L | L | 0 | 1 | 0 |
| B | N | H | H | H | L | H | H | 1 | 0 | 0 |
| B | A | H | H | H | L | H | L | 0 | 0 | 1 |
| B | B | H | H | H | H | H | H | 0 | 1 | 1 |

FIG. 39B

| LowerPage READ LEVEL | | MiddlePage READ LEVEL | | UpperPage READ LEVEL | | DATA READ TO THE OUTSIDE |
|---|---|---|---|---|---|---|
| FIRST MEMORY CELL ARRAY (AR) | SECOND MEMORY CELL ARRAY (AR) | FIRST MEMORY CELL ARRAY (AR) | SECOND MEMORY CELL ARRAY (BR) | FIRST MEMORY CELL ARRAY (BR) | SECOND MEMORY CELL ARRAY (AR) | DATA INPUT FROM THE OUTSIDE |
| L | L | L | L | L | L | 1 |
| L | H | H | L | H | H | 0 |
| H | L | | | | | |
| H | H | | | | | |

| DATA INPUT FROM THE OUTSIDE | | | WHEN PROGRAMMING | |
|---|---|---|---|---|
| | | | PUT SAME LMU DATA ONCE IN FIRST & SECOND MEMORY CELL ARRAYS AND MODIFY DL DATA AFTER DATA LOAD BUSY | |
| Lower Page | Middle Page | Upper Page | FIRST MEMORY CELL ARRAY | SECOND MEMORY CELL ARRAY |
| 1 | 1 | 1 | Inhibit | Inhibit |
| 1 | 1 | 0 | Inhibit | A |
| 1 | 0 | 0 | Inhibit | B |
| 1 | 0 | 1 | A | Inhibit |
| 0 | 0 | 0 | A | A |
| 0 | 1 | 0 | A | B |
| 1 | 0 | 0 | B | Inhibit |
| 0 | 0 | 1 | B | A |
| 0 | 1 | 1 | B | B |

| Vth OF MEMORY CELL | | LowerPage | | MiddlePage | | UpperPage | | DATA READ TO THE OUTSIDE | | |
|---|---|---|---|---|---|---|---|---|---|---|
| | | READ LEVEL | | READ LEVEL | | READ LEVEL | | | | |
| FIRST MEMORY CELL ARRAY | SECOND MEMORY CELL ARRAY | FIRST MEMORY CELL ARRAY AR | SECOND MEMORY CELL ARRAY BR | FIRST MEMORY CELL ARRAY BR | SECOND MEMORY CELL ARRAY AR | FIRST MEMORY CELL ARRAY BR | SECOND MEMORY CELL ARRAY BR | Lower Page | Middle Page | Upper Page |
| Z | Z | L | L | L | L | L | L | 1 | 1 | 1 |
| Z | A | L | L | L | H | L | L | 1 | 0 | 1 |
| Z | B | L | H | L | H | L | H | 0 | 0 | 0 |
| A | Z | H | L | L | L | L | L | 0 | 1 | 1 |
| A | A | H | H | L | H | H | L | 1 | 0 | 1 |
| A | B | H | L | H | H | H | L | 1 | 0 | 0 |
| B | Z | H | L | H | L | H | L | 0 | 0 | 0 |
| B | A | H | H | H | H | H | L | 0 | 1 | 0 |
| B | B | H | H | H | H | H | H | 1 | 1 | 0 |

FIG. 42B

| 1 | L H | L H | L H | L |
|---|---|---|---|---|
| 0 | H L | H L | H L | L H / H H |

| DATA INPUT FROM THE OUTSIDE | | | WHEN PROGRAMMING | |
|---|---|---|---|---|
| | | | PUT SAME LMU DATA ONCE IN FIRST & SECOND MEMORY CELL ARRAYS AND MODIFY DL DATA AFTER DATA LOAD BUSY | |
| Lower Page | Middle Page | Upper Page | FIRST MEMORY CELL ARRAY | SECOND MEMORY CELL ARRAY |
| 1 | 1 | 1 | Inhibit | Inhibit |
| 1 | 0 | 1 | Inhibit | A |
| 0 | 0 | 0 | Inhibit | B |
| 0 | 1 | 1 | A | Inhibit |
| 0 | 0 | 1 | A | A |
| 1 | 0 | 0 | A | B |
| 0 | 0 | 0 | B | Inhibit |
| 0 | 1 | 0 | B | A |
| 1 | 1 | 0 | B | B |

SEMICONDUCTOR MEMORY DEVICE

CROSS-REFERENCE TO RELATED APPLICATION

This application is based upon and claims the benefit of priority from Japanese Patent Application No. 2017-204702, filed on Oct. 23, 2017; the entire contents of which are incorporated herein by reference.

FIELD

Embodiments described herein relate generally to a semiconductor memory device.

BACKGROUND

A memory device that has a three-dimensional structure including a stacked body including multiple layers of conductive layers stacked with an insulator interposed, a semiconductor body provided inside a memory hole piercing the stacked body, and a charge storage portion provided between the semiconductor body and the conductive layers has been proposed. The multiple layers of conductive layers include multiple word lines functioning as control gates of memory cells, and select gates functioning as control gates of select transistors.

BRIEF DESCRIPTION OF THE DRAWINGS

FIGS. 22A to 22C are figures illustrating potential controls of source-side select gates of the semiconductor memory device of the second embodiment;

FIGS. 34A to 34D are figures illustrating potential controls of select gates of the semiconductor memory devices of the third and fourth embodiments;

FIG. 38A is a drawing showing a relationship of thresholds of a memory cell of the fifth embodiment, and FIGS. 38B and 38C are drawings showing a voltage of a word line connected to a gate of a memory cell when reading in the fifth embodiment;

FIG. 39A is a figure showing a relationship between memory cells and a data that is read in the fifth embodiment, and FIG. 39B is a figure showing a definition of a data that is read;

FIG. 40 is an explanation drawing of a data program operation in the fifth embodiment;

FIG. 42A is a figure illustrating a relationship between memory cells and a data that is read in the modification of the fifth embodiment, and FIG. 42B is a figure showing a definition of the data that is read in the modification of the fifth embodiment;

DETAILED DESCRIPTION

Figure 1:
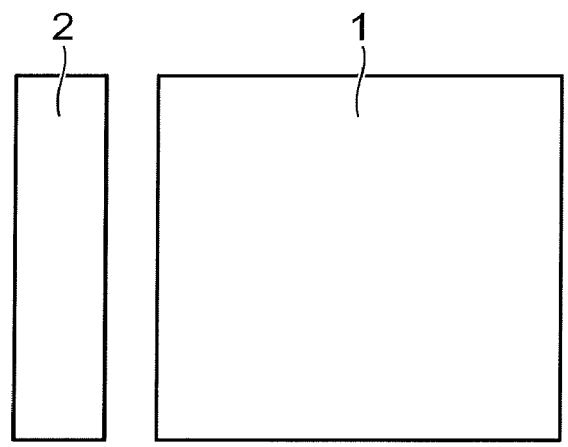
FIG. 1 is a block diagram showing a configuration of a semiconductor memory device of an embodiment.

According to one embodiment, a semiconductor memory device includes first to nth string units (n being a natural number of 3 or more), a plurality of layers of word lines, and (n−1) layers of select gate layers. The first to nth string units each includes a memory string. The memory string includes a plurality of memory cells and a plurality of select transistors connected in series in a first direction. The layers of word lines are stacked in the first direction. The (n−1) layers of select gate layers are stacked in the first direction. The (n−1) layers of select gate layers include first to (2×(n−1))th select gates electrically isolated from each other. The first string unit is selected by the first to (n−1)th select gates. The kth string unit (k being not less than 1 and not more than n) is selected by the kth to (n+k−2)th select gates. The nth string unit is selected by the nth to (2×(n−1))th select gates.

Embodiments will now be described with reference to the drawings. The same components in the drawings are marked with the same reference numerals.

FIG. 1 is a block diagram showing the configuration of a semiconductor memory device of an embodiment.

The semiconductor memory device of the embodiment includes a memory cell array 1 having a three-dimensional structure, and a control circuit 2 controlling the memory cell array 1. The control circuit 2 includes a row decoder that controls word lines and select gates described below.

Figure 2:
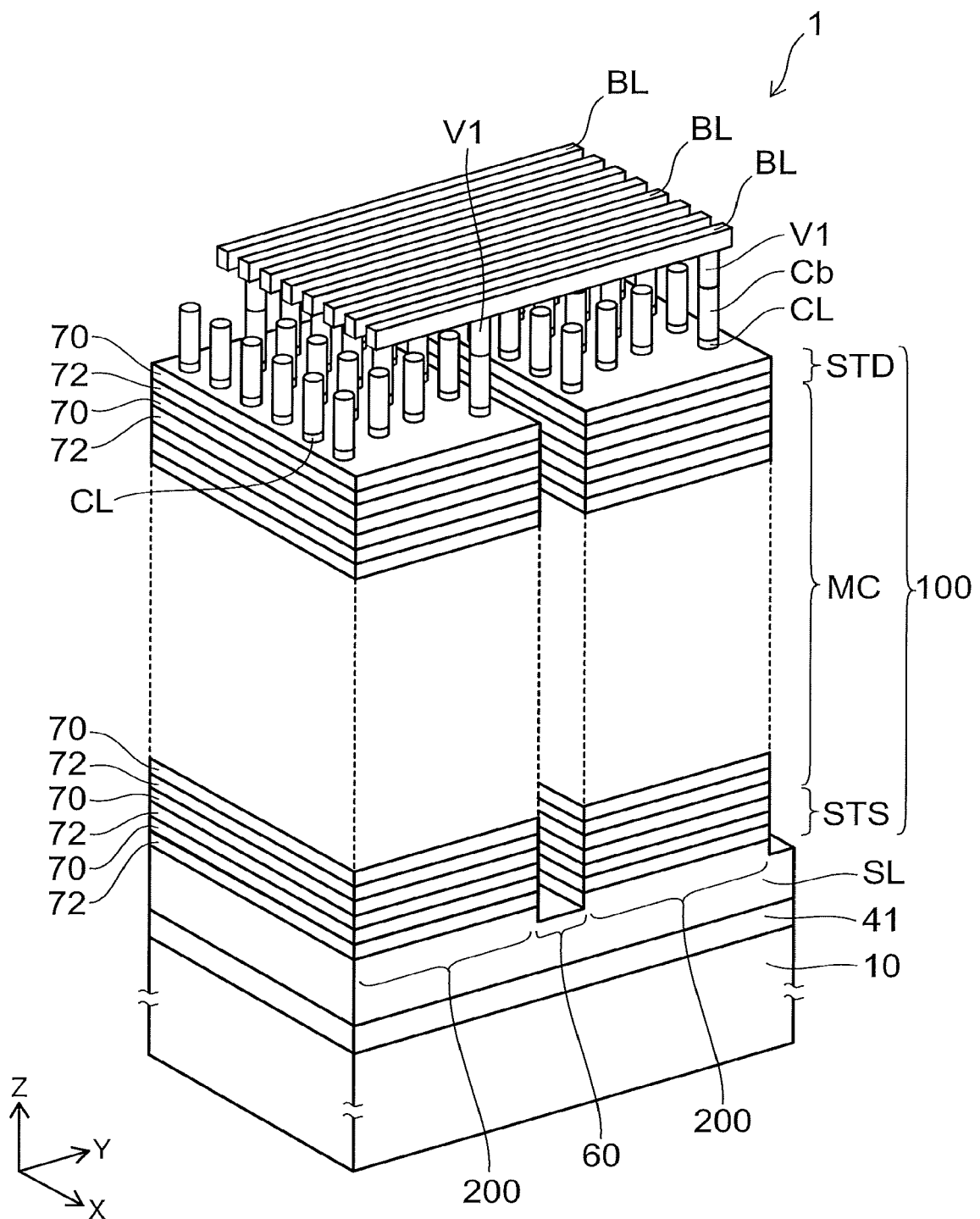
FIG. 2 is a schematic perspective view of the semiconductor memory device of the embodiment.

FIG. 2 is a schematic perspective view of the memory cell array 1.

Figure 3:
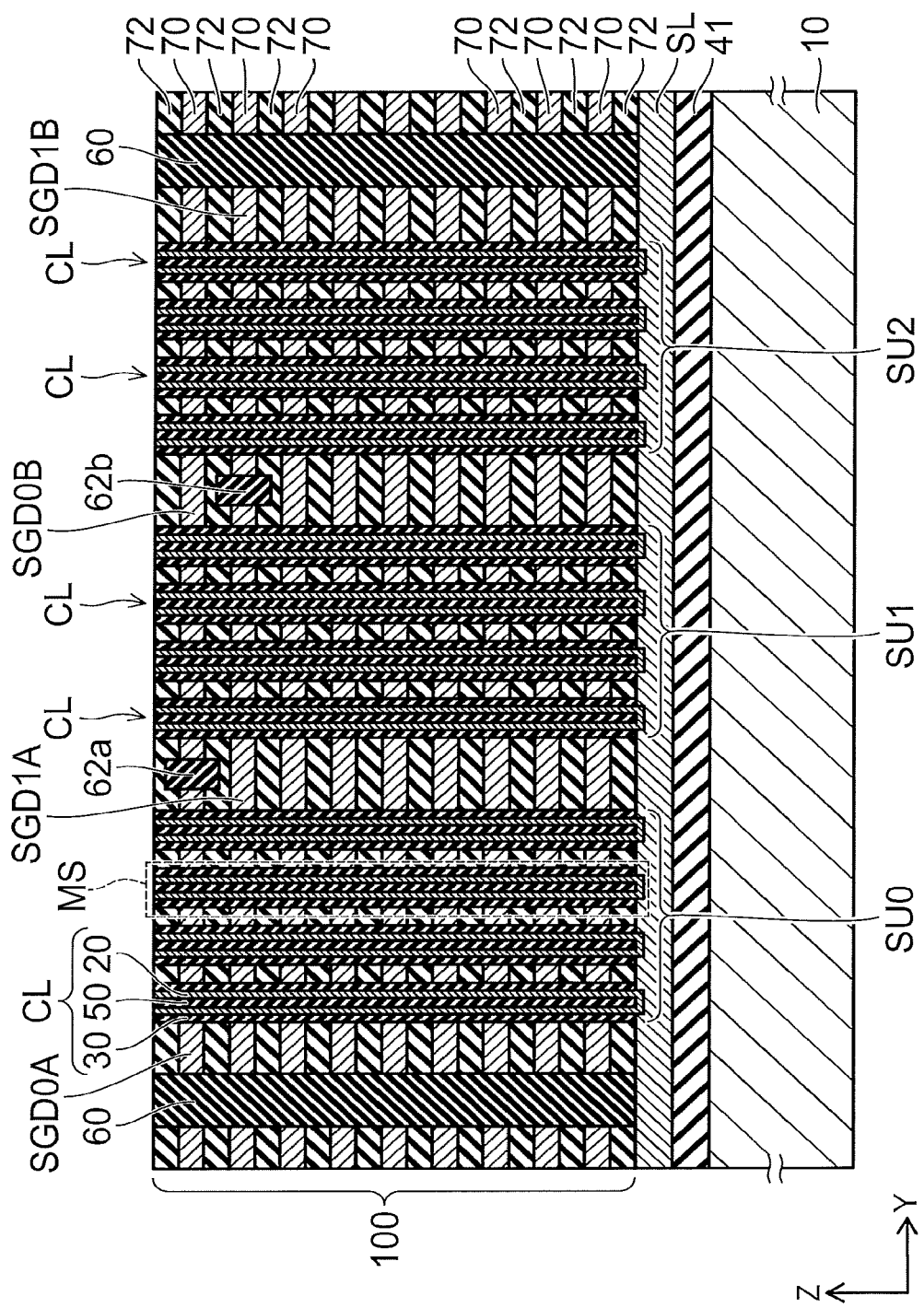
FIG. 3 is a schematic cross-sectional view of the semiconductor memory device of the embodiment.

FIG. 3 is a schematic cross-sectional view of the memory cell array 1.

In FIG. 2, two mutually-orthogonal directions parallel to a major surface of a substrate 10 are taken as an X-direction and a Y-direction; and a direction orthogonal to both the X-direction and the Y-direction is taken as a Z-direction (a stacking direction).

The memory cell array 1 includes the substrate 10, a source layer (or source line) SL provided on the substrate 10, a stacked body 100 provided on the source layer SL, multiple columnar portions CL, and multiple bit lines BL provided above the stacked body 100.

The substrate 10 is, for example, a silicon substrate. The source layer SL includes a semiconductor layer doped with an impurity and may further include a layer including a metal. An insulating layer 41 is provided between the substrate 10 and the source layer SL.

The stacked body 100 is divided into multiple blocks 200 by a separation portion 60. The separation portion 60 extends in the stacking direction (the Z-direction) and reaches the source layer SL. Further, the separation portion 60 extends in the X-direction and divides the stacked body 100 into the multiple blocks 200 in the Y-direction. For example, an erase operation is executed by block unit.

The separation portion 60 is, for example, an insulating film provided inside a slit piercing the stacked body 100. FIG. 3 illustrates one block 200 between two separation portions 60.

The columnar portions CL are formed in substantially circular columnar configurations extending through the stacked body 100 in the stacking direction (the Z-direction).

The columnar portions CL pierce the stacked body 100 and reach the source layer SL. For example, the multiple columnar portions CL have a staggered arrangement. Or, the multiple columnar portions CL may be arranged in a square lattice along the X-direction and the Y-direction.

As shown in FIG. 2, the multiple bit lines BL are metal films extending in the Y-direction. The multiple bit lines BL are separated from each other in the X-direction. The upper end portions of semiconductor bodies 20 of the columnar portions CL described below are connected to the bit lines BL via contacts Cb and V1.

As shown in FIG. 3, the stacked body 100 is provided on the source layer SL. The stacked body 100 includes multiple conductive layers 70 stacked in a direction (the Z-direction) perpendicular to the major surface of the substrate 10 with insulating layers 72 interposed. The conductive layers 70 are, for example, metal layers. The insulating layer 72 is provided also between the source layer SL and the conductive layer 70 of the lowermost layer. A gap may be used as the insulator between the conductive layers 70.

Figure 4:
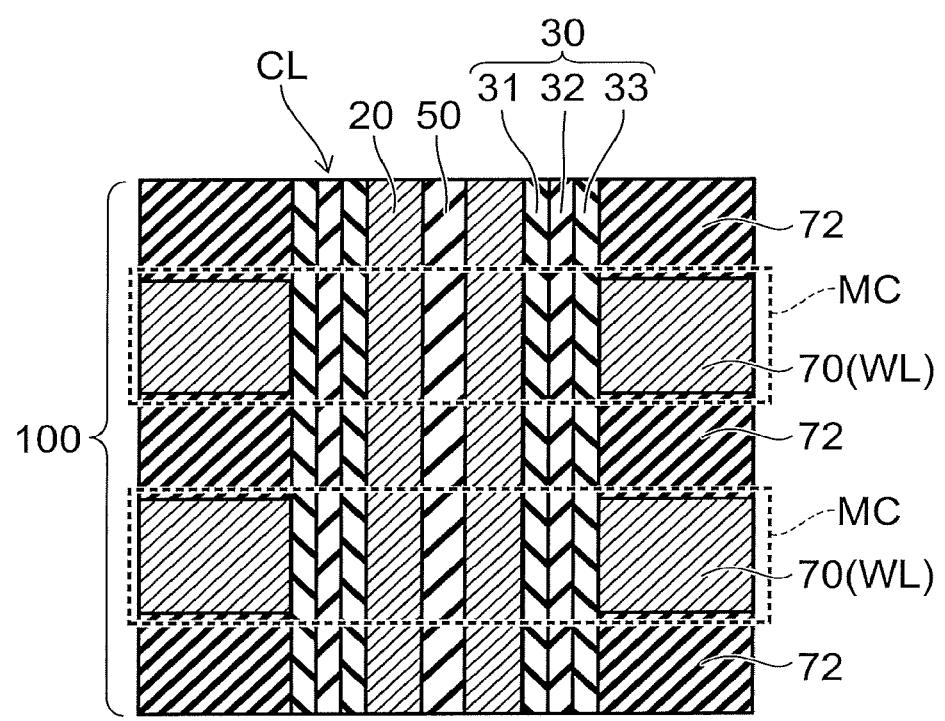
FIG. 4 is an enlarged view of one portion of FIG. 3.

FIG. 4 is an enlarged view of one portion of FIG. 3.

The columnar portion CL includes a memory film 30, the semiconductor body 20, and an insulative core film 50. The semiconductor body 20 is formed in a pipe-like configuration; and the core film 50 is provided on the inner side of the semiconductor body 20. The memory film 30 is provided between the semiconductor body 20 and the conductive layers 70 and surrounds the periphery of the semiconductor body 20.

The semiconductor body 20 is, for example, a silicon film; and the lower end portion of the semiconductor body 20 contacts the source layer SL as shown in FIG. 3. The upper end portion of the semiconductor body 20 is connected to the bit line BL via the contacts Cb and V1 shown in FIG. 2.

Figure 23:
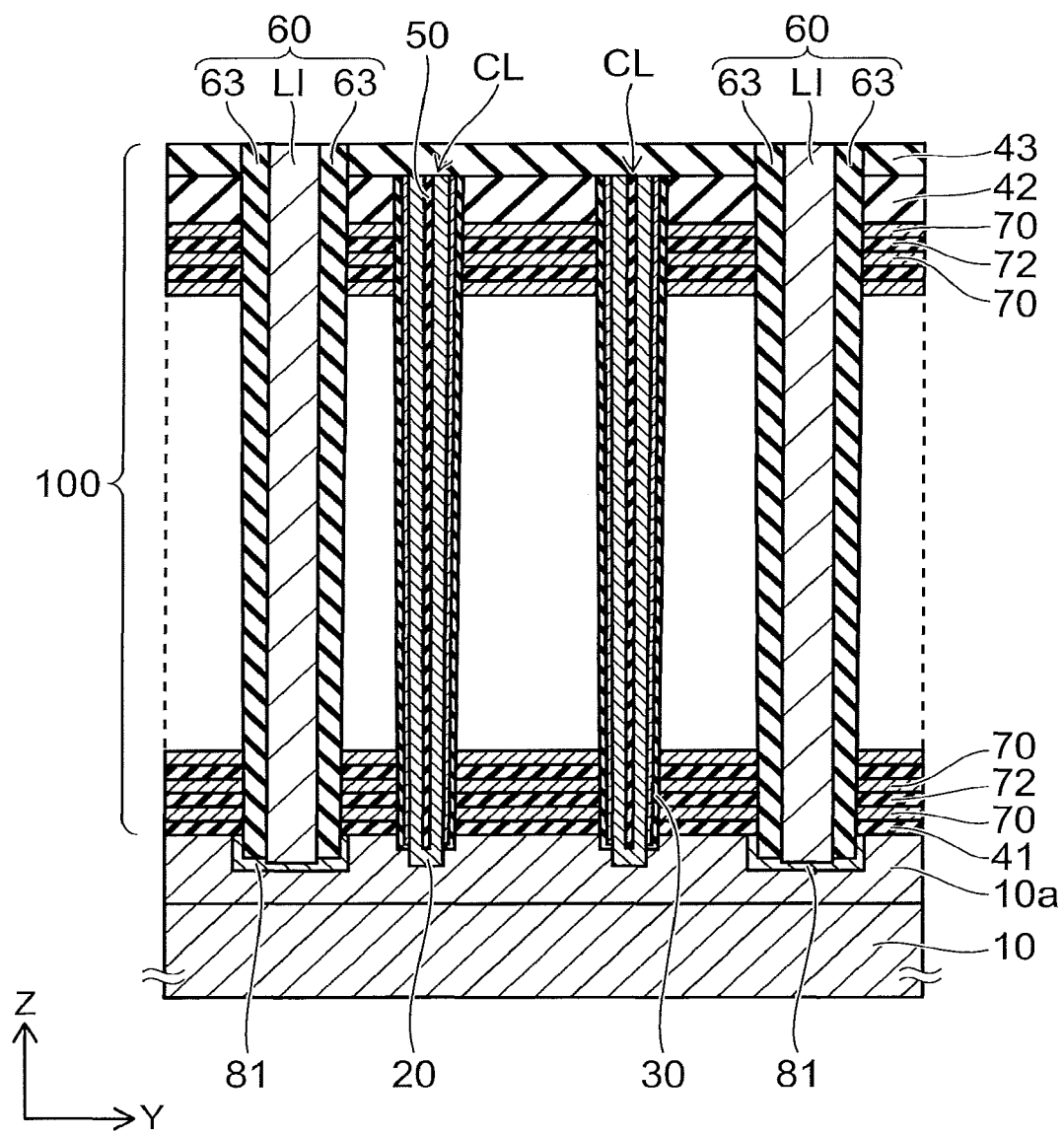
FIG. 23 is a schematic cross-sectional view of another example of a memory cell array of the embodiment.

Or, as shown in FIG. 23, the lower end portion of the semiconductor body 20 may contact an active region (e.g., a P-type well) 10a of the substrate 10. In such a case, an interconnect portion LI of a conductive material is provided in the separation portion 60 (a slit ST); and the lower end portion of the interconnect portion LI is caused to contact an N$^+$-type semiconductor region 81 formed in the active region 10a of the substrate 10. The semiconductor body 20 is connected via a channel formed in the active region 10a, the N$^+$-type semiconductor region 81, and the interconnect portion LI to an upper layer interconnect (a source line) provided above the stacked body 100. In the example shown in FIG. 23, an insulating layer 42 is provided on the conductive layer 70 of the uppermost layer; and an insulating layer 43 is provided on the insulating layer 42. The insulating layer 43 covers the upper ends of the columnar portions CL.

As shown in FIG. 4, the memory film 30 is a stacked film including a tunneling insulating film 31, a charge storage film (a charge storage portion) 32, and a blocking insulating film 33. The blocking insulating film 33, the charge storage film 32, and the tunneling insulating film 31 are provided in order from the conductive layer 70 side between the semiconductor body 20 and the conductive layers 70.

The semiconductor body 20, the memory film 30, and the conductive layer 70 are included in a memory cell MC. The multiple conductive layers 70 include multiple word lines WL functioning as control gates of the memory cells MC. The memory cell MC has a vertical transistor structure in which the word line WL surrounds the periphery of the semiconductor body 20 with the memory film 30 interposed. In the memory cell MC having the vertical transistor structure, the semiconductor body 20 functions as a channel; and the charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film and includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the word line WL. Also, the blocking insulating film 33 prevents back-tunneling of the charge from the word line WL into the columnar portion CL.

The blocking insulating film 33 includes, for example, a silicon oxide film. Or, the blocking insulating film 33 may be, for example, a stacked film of a silicon oxide film and a metal oxide film. In the stacked film, the silicon oxide film is provided between the charge storage film 32 and the metal oxide film; and the metal oxide film is provided between the silicon oxide film and the word line WL.

As shown in FIG. 2, a drain-side select transistor STD is provided in the upper layer portion of the stacked body 100; and a source-side select transistor STS is provided in the lower layer portion of the stacked body 100.

The conductive layer 70 of at least the uppermost layer of the multiple conductive layers 70 functions as a control gate (a drain-side select gate) of the drain-side select transistor STD; and the conductive layer 70 of at least the lowermost layer of the multiple conductive layers 70 functions as a control gate (a source-side select gate) of the source-side select transistor STS.

The semiconductor body 20 pierces the multiple conductive layers 70 including the word lines WL and the select gates. The memory film 30 shown in FIG. 4 is provided also between the semiconductor body 20 and the conductive layer used as the drain-side select gate and between the semiconductor body 20 and the conductive layer 70 used as the source-side select gate.

The multiple memory cells MC are provided between the drain-side select transistor STD and the source-side select transistor STS. The multiple memory cells MC, the drain-side select transistor STD, and the source-side select transistor STS are connected in series via the semiconductor body 20 (the channel) and are included in one memory string MS. For example, the memory strings MS have a staggered arrangement in planar directions parallel to the XY plane; and the multiple memory cells MC are provided three-dimensionally in the X-direction, the Y-direction, and the Z-direction.

Figure 5:
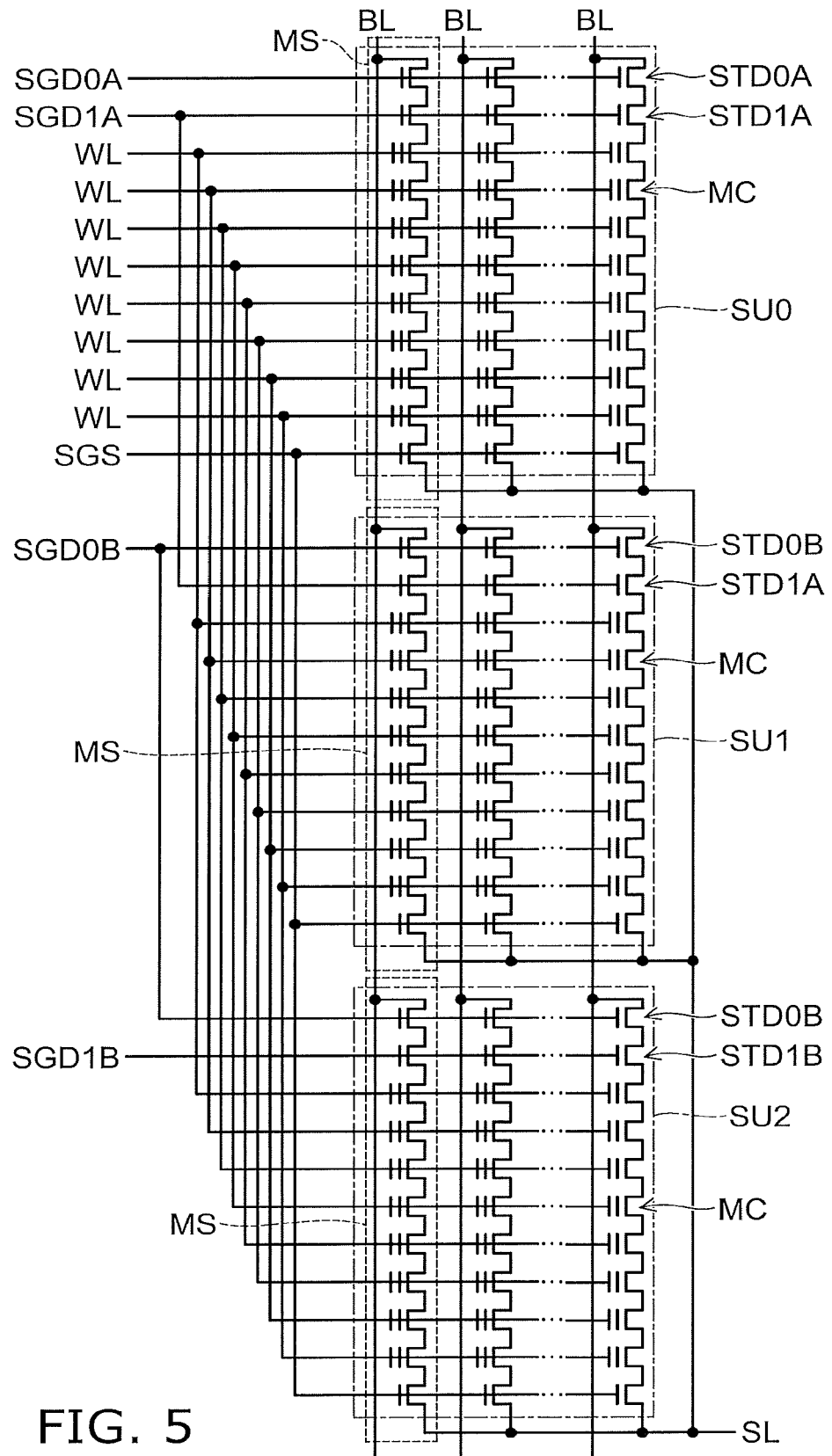
FIG. 5 is a circuit diagram of a semiconductor memory device of a first embodiment.

FIG. 5 is a circuit diagram of the semiconductor memory device of the first embodiment.

Figure 6:
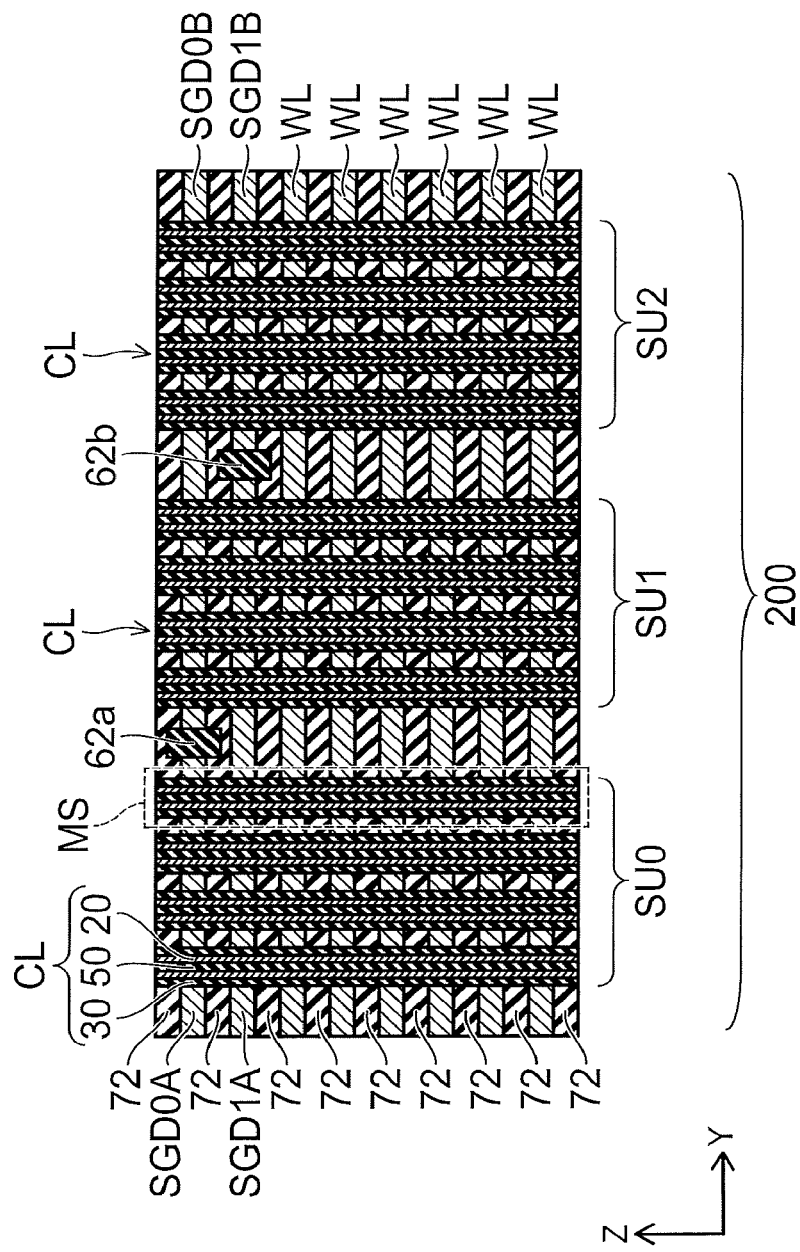
FIG. 6 is a schematic cross-sectional view of the semiconductor memory device of the first embodiment.

FIG. 6 is a schematic cross-sectional view of the semiconductor memory device of the first embodiment. FIG. 6 is a cross-sectional view of a portion of the one block 200 separated from the other blocks by the separation portions 60 described above where the memory cells MC and the drain-side select transistors are provided.

In the example shown in FIG. 6, three string units SU0, SU1, and SU2 are disposed in the one block 200. One string unit includes multiple memory strings MS (multiple columnar portions CL).

In the example shown in FIG. 6, two layers of the drain-side select gate layers are stacked in the upper layer portion of the stacked body 100. The insulating layer 72 is provided between the two layers of the drain-side select gate layers.

The drain-side select gate layer of the uppermost layer is divided into two select gates in the Y-direction by a separation portion 62a. The separation portion 62a divides the drain-side select gate layer of the uppermost layer into a first drain-side select gate SGD0A and a third drain-side select gate SGD0B.

The drain-side select gate layer of the second layer from the top is divided into two select gates in the Y-direction by a separation portion 62b. The separation portion 62b divides the drain-side select gate layer of the second layer from the top into a second drain-side select gate SGD1A and a fourth drain-side select gate SGD1B.

The first drain-side select gate SGD0A, the second drain-side select gate SGD1A, the third drain-side select gate SGD0B, and the fourth drain-side select gate SGD1B each are controlled electrically independently.

Figure 7A:
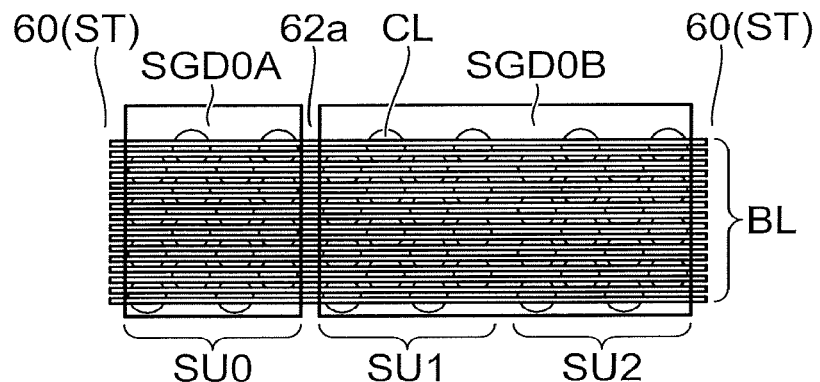
FIGS. 7A to 7C are schematic plan views of the semiconductor memory device of the first embodiment.

FIG. 7A is a schematic plan view of the layer of the one block 200 where the first drain-side select gate SGD0A and the third drain-side select gate SGD0B are provided.

Figure 7B:
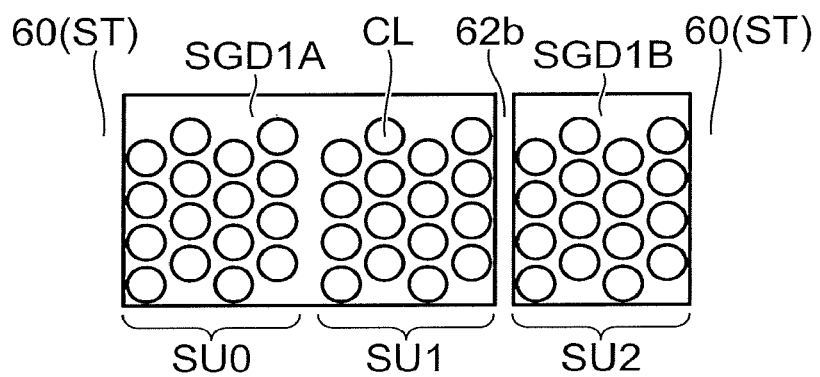

FIG. 7B is a schematic plan view of the layer of the one block 200 where the second drain-side select gate SGD1A and the fourth drain-side select gate SGD1B are provided.

Figure 7C:
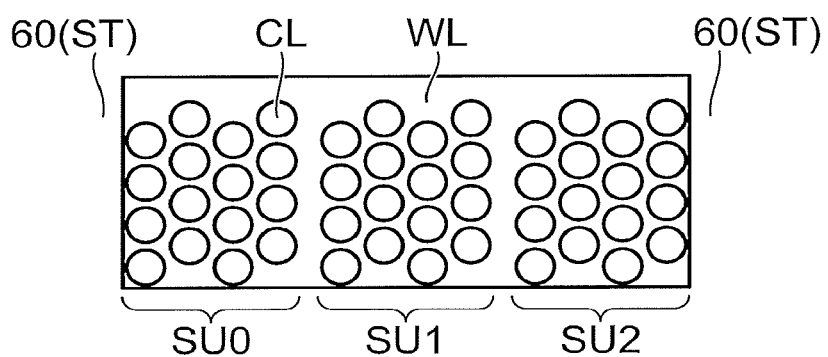

FIG. 7C is a schematic plan view of the layer of the one block 200 where the word line WL is provided.

The word line WL of each layer is provided commonly for the first to third string units SU0 to SU2. The first drain-side select gate SGD0A is provided in the first string unit SU0. The third drain-side select gate SGD0B is provided commonly for the second string unit SU1 and the third string unit SU2. The second drain-side select gate SGD1A is provided commonly for the first string unit SU0 and the second string unit SU1. The fourth drain-side select gate SGD1B is provided in the third string unit SU2.

The separation portion 62a and the separation portion 62b are insulating films that extend in the same direction as the separation portion 60 (the slit ST).

As shown in FIG. 6, the three string units SU0, SU1, and SU2 in the one block 200 are arranged to be separated from each other in the Y-direction.

The separation portion 62a is disposed between the first string unit SU0 and the second string unit SU1 adjacent to each other in the Y-direction, pierces only the drain-side select gate layer of the uppermost layer of the multiple conductive layers 70, and does not divide the other conductive layers of the multiple conductive layers 70.

The separation portion 62b is disposed between the second string unit SU1 and the third string unit SU2 adjacent to each other in the Y-direction, pierces only the drain-side select gate layer of the second layer from the top of the multiple conductive layers 70, and does not divide the other conductive layers of the multiple conductive layers 70.

As shown in FIG. 6, FIG. 7A, and FIG. 7B, the position in the Y-direction of the separation portion 62a provided in the drain-side select gate layer of the uppermost layer and the position in the Y-direction of the separation portion 62b provided in the drain-side select gate layer of the second layer from the top are shifted from each other.

As shown in FIG. 5, the first string unit SU0 includes a first drain-side select transistor STD0A having the first drain-side select gate SGD0A as a control gate and a second drain-side select transistor STD1A having the second drain-side select gate SGD1A as a control gate.

The second string unit SU1 includes a third drain-side select transistor STD0B having the third drain-side select gate SGD0B as a control gate and the second drain-side select transistor STD1A having the second drain-side select gate SGD1A as a control gate.

The third string unit SU2 includes the third drain-side select transistor STD0B having the third drain-side select gate SGD0B as a control gate and a fourth drain-side select transistor STD1B having the fourth drain-side select gate SGD1B as a control gate.

Any one of the string units of the three string units SU0, SU1, and SU2 inside the one block 200 is selected by the drain-side select transistors STD0A, STD0B, STD1A, and STD1B.

When the first string unit SU0 is selected, a potential that is the threshold voltage or more is applied to the first drain-side select gate SGD0A and the second drain-side select gate SGD1A; and the first drain-side select transistor STD0A and the second drain-side select transistor STD1A are set to ON. The third drain-side select transistor STD0B and the fourth drain-side select transistor STD1B are set to OFF.

The semiconductor bodies 20 of the selected first string unit SU0 are electrically connected to the bit lines BL; and the semiconductor bodies 20 of the unselected second string unit SU1 and the semiconductor bodies 20 of the unselected third string unit SU2 are not electrically connected to the bit lines BL.

When the second string unit SU1 is selected, a potential that is the threshold voltage or more is applied to the third drain-side select gate SGD0B and the second drain-side select gate SGD1A; and the third drain-side select transistor STD0B and the second drain-side select transistor STD1A are set to ON. The first drain-side select transistor STD0A and the fourth drain-side select transistor STD1B are set to OFF.

The semiconductor bodies 20 of the selected second string unit SU1 are electrically connected to the bit lines BL; and the semiconductor bodies 20 of the unselected first string unit SU0 and the semiconductor bodies 20 of the unselected third string unit SU2 are not electrically connected to the bit lines BL.

When the third string unit SU2 is selected, a potential that is the threshold voltage or more is applied to the third drain-side select gate SGD0B and the fourth drain-side select gate SGD1B; and the third drain-side select transistor STD0B and the fourth drain-side select transistor STD1B are set to ON. The first drain-side select transistor STD0A and the second drain-side select transistor STD1A are set to OFF.

The semiconductor bodies 20 of the selected third string unit SU2 are electrically connected to the bit lines BL; and the semiconductor bodies 20 of the unselected first string unit SU0 and the semiconductor bodies 20 of the unselected second string unit SU1 are not electrically connected to the bit lines BL.

A method for manufacturing the semiconductor memory device of the first embodiment will now be described with reference to FIG. 8A to FIG. 11B.

Figure 8A:
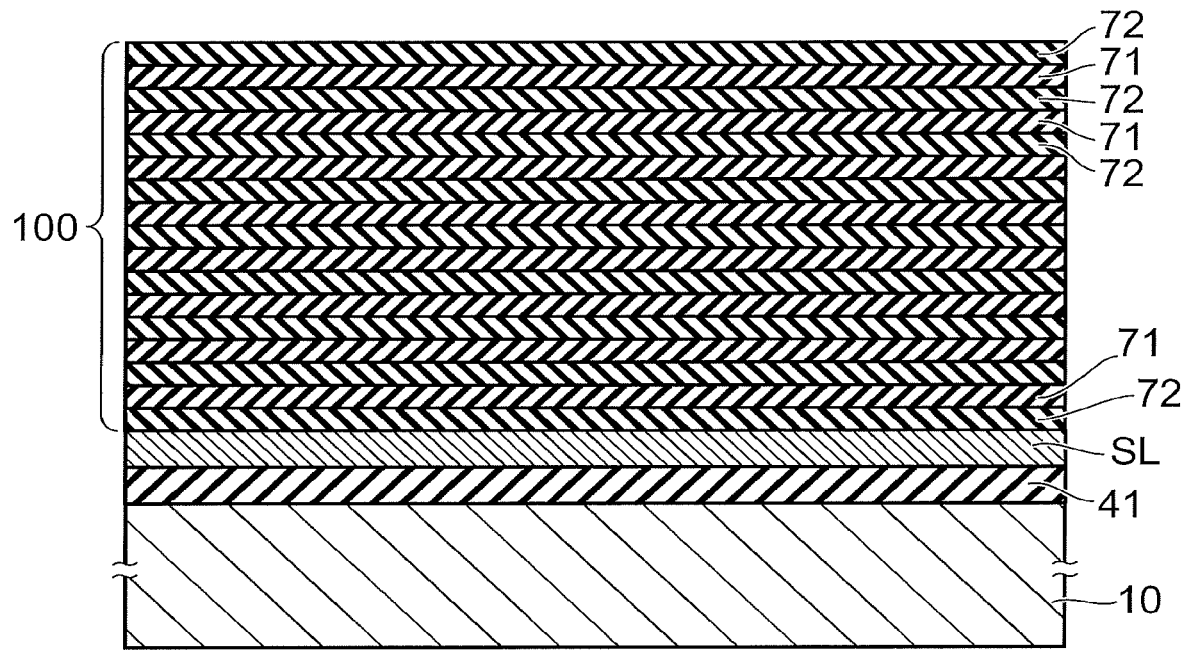
FIG. 8A to FIG. 11B are schematic cross-sectional views showing a method for manufacturing the semiconductor memory device of the first embodiment.

As shown in FIG. 8A, the insulating layer 41 is formed on the substrate 10; the source layer SL is formed on the insulating layer 41; and the stacked body 100 is formed on the source layer SL. The substrate 10, the insulating layer 41, and the source layer SL are not illustrated in FIG. 8B to FIG. 11B.

The insulating layer 72 and a sacrificial layer 71 are stacked alternately on the source layer SL. The process of alternately stacking the insulating layer 72 and the sacrificial layer 71 is repeated; and the stacked body 100 that includes the multiple insulating layers 72 and the multiple sacrificial layers 71 is formed on the source layer SL. For example, the insulating layers 72 are silicon oxide layers; and the sacrificial layers 71 are silicon nitride layers.

Figure 8B:

As shown in FIG. 8B, a mask (e.g., a silicon oxide film) 75 is formed on the stacked body 100; and a slit 61b is formed by RIE (reactive ion etching). The slit 61b pierces the mask 75, the insulating layer 72 of the uppermost layer, and the sacrificial layer 71 of the uppermost layer. The bottom surface of the slit 61b is positioned in the insulating layer 72 of the second layer from the top.

Figure 8C:
Figure 9A:

As shown in FIG. 8C, the separation portion 62b is formed inside the slit 61b by filling an insulating film (e.g., a silicon oxide film) 62. The insulating film 62 is deposited also on the mask 75. For example, the mask 75 and the insulating film 62 deposited on the mask 75 are removed by etch-back (FIG. 9A). The sacrificial layer 71 of the uppermost layer is divided by the separation portion 62b of a material that is different from that of the sacrificial layers 71.

Figure 9B:
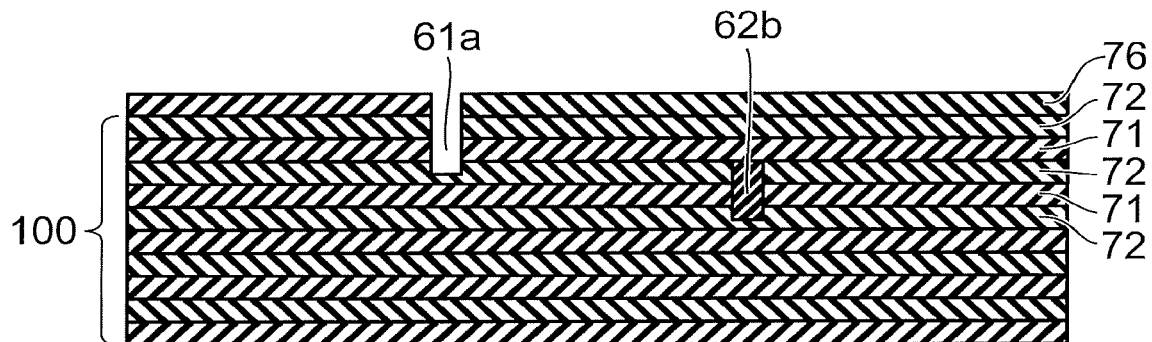

Subsequently, as shown in FIG. 9B, one layer of the sacrificial layers 71, one layer of the insulating layers 72, and a mask (e.g., a silicon oxide film) 76 are stacked in order; and a slit 61a is formed in the stacked body 100 by using RIE. The slit 61a is formed at a position that is different from the position of the separation portion 62b.

The slit 61a pierces the mask 76, the insulating layer 72 of the uppermost layer, and the sacrificial layer 71 of the uppermost layer of the stacked body 100 shown in FIG. 9B. The bottom surface of the slit 61a is positioned in the insulating layer 72 of the second layer from the top.

Figure 9C:
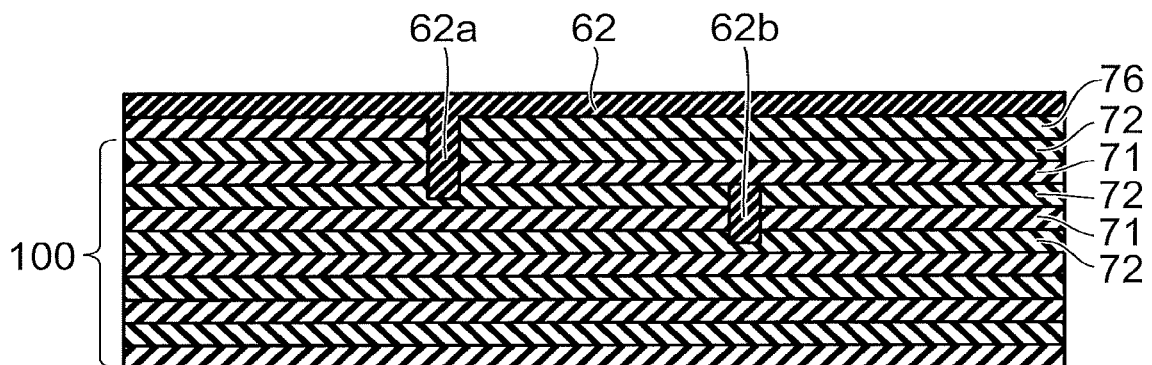
Figure 10A:
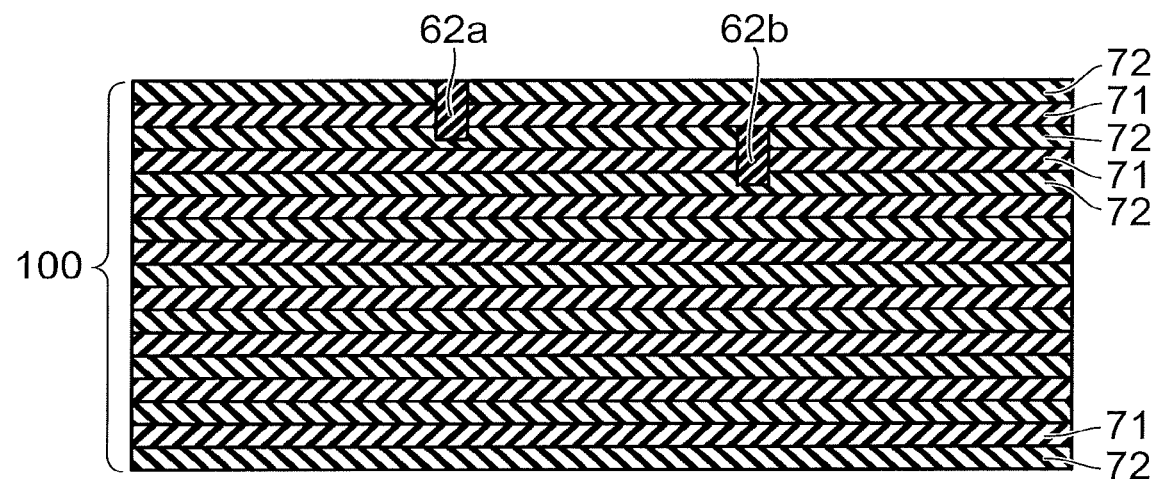

As shown in FIG. 9C, the separation portion 62a is formed inside the slit 61a by filling the insulating film 62. The insulating film 62 is deposited also on the mask 76. The mask 76 and the insulating film 62 deposited on the mask 76 are removed by, for example, etch-back (FIG. 10A). The separation portion 62a is, for example, a silicon oxide film and divides the sacrificial layer 71 of the uppermost layer.

Figure 10B:
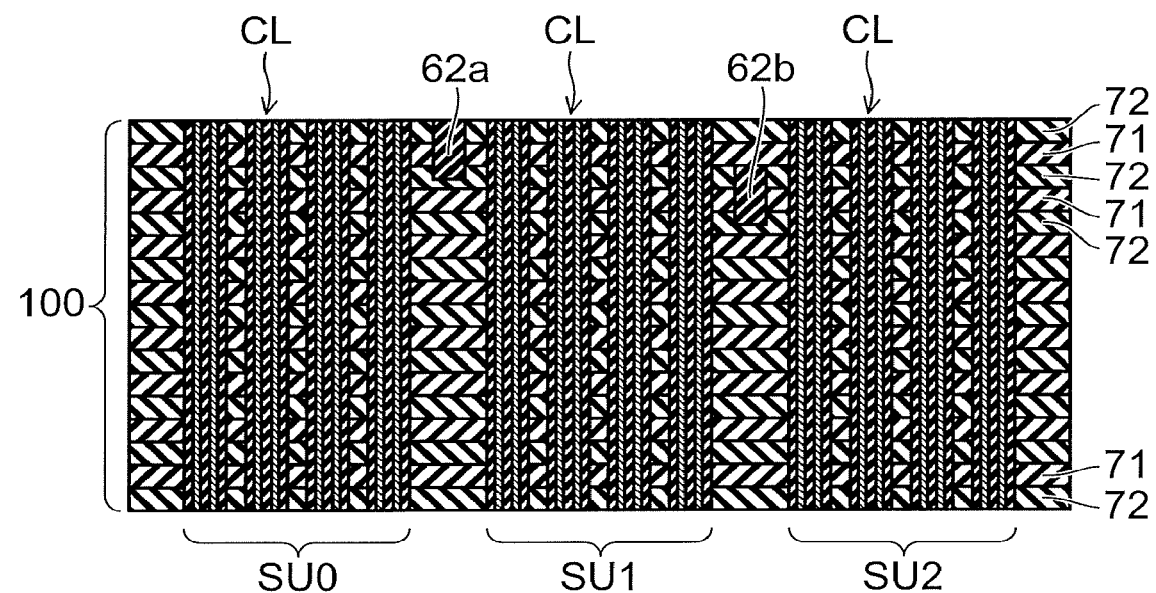

Subsequently, for example, multiple memory holes are formed in the stacked body 100 by using RIE; and the columnar portions CL are formed inside the memory holes as shown in FIG. 10B. The memory holes pierce the stacked body 100 and reach the source layer SL; and the lower end portions of the semiconductor bodies 20 that are formed inside the memory holes contact the source layer SL.

Figure 11A:
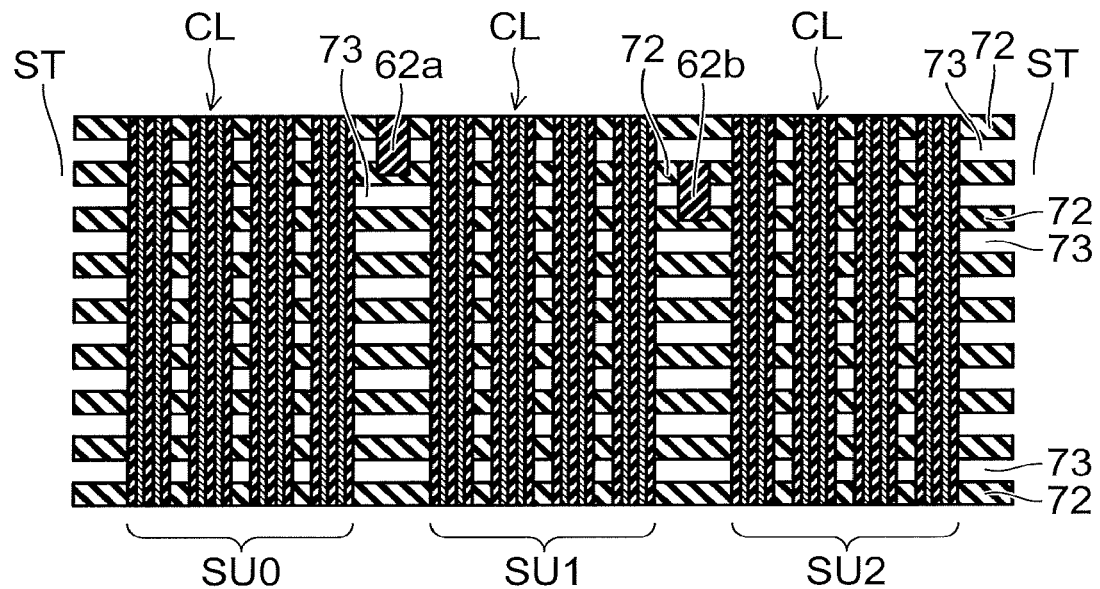

After forming the columnar portions CL, the slits ST are formed in the stacked body 100 as shown in FIG. 11A. The slits ST are formed by RIE using a not-illustrated mask, pierce the stacked body 100, and reach the source layer SL.

Then, the sacrificial layers 71 are removed by etching via the slits ST. For example, the sacrificial layers 71 which are silicon nitride layers are removed using a solution including phosphoric acid. The separation portions 62a and 62b which are silicon oxide films are not removed.

The sacrificial layers 71 are removed; and a gap 73 is formed between the multiple insulating layers 72 as shown in FIG. 11A. The multiple insulating layers 72 contact the side surfaces of the multiple columnar portions CL to surround the side surfaces. The multiple insulating layers 72 are supported by such a physical bond with the multiple columnar portions CL; and the gap 73 is maintained.

Figure 11B:
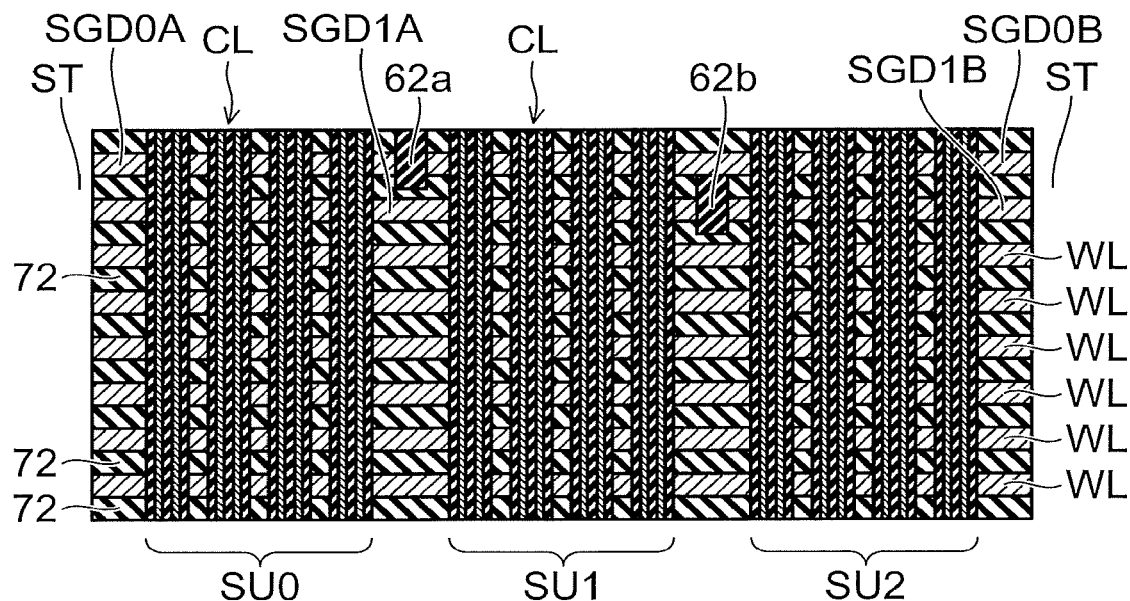

As shown in FIG. 11B, the conductive layers that are used to form the select gates SGD0A, SGD0B, SGD0A, and SGD0B and the word lines WL are formed inside the gap 73. For example, a tungsten layer is formed by CVD (chemical vapor deposition) as the conductive layers. A film formation gas is supplied to the gap 73 via the slits ST. Or, the separation portions 62a and 62b (the slits 61a and 61b) also can be formed after forming the conductive layers 70 (after the replacement).

Generally, there is a tendency for the width of a slit formed by RIE to increase as the depth increases. According to the embodiment, the depths of the separation portions 62a and 62b (the slits 61a and 61b) dividing the drain-side select gate layers formed in the upper layer portion of the stacked body 100 are shallower than the depths of the separation portions 60 (the slits ST) dividing the entire stacked body 100. Therefore, the widths of the separation portions 62a and 62b (the slits 61a and 61b) are narrower than the widths of the separation portions 60.

Here, as a comparative example, a configuration may be used in which the separation portion 60 (the slit ST) that pierces the entire stacked body 100 divides the drain-side select gate layer of the second string unit SU1 and the drain-side select gate layer of the third string unit SU2.

Conversely, according to the embodiment, the separation portion 62b that has a smaller width than the separation portion 60 (the slit ST) divides the drain-side select gate layer of the second string unit SU1 and the drain-side select gate layer of the third string unit SU2. Therefore, according to the embodiment, it is possible to reduce the number of the separation portions 60 (the slits ST) and reduce the planar size of the memory cell array.

The separation portion 62a and the separation portion 62b divide drain-side select gate layers of different layers and are disposed at positions that are shifted from each other in the Y-direction. The separation portion 62a is disposed between the first string unit SU0 and the second string unit SU1; and the separation portion 62b is disposed between the second string unit SU1 and the third string unit SU2.

Accordingly, when the sacrificial layers 71 are replaced with the conductive layers 70 via the slits ST as shown in FIGS. 11A and 11B, the two regions that are divided in the Y-direction by the separation portion 62a (the regions where the drain-side select gate SGD0A and the drain-side select gate SGD0B are formed) each communicate with the slit ST; and the two regions that are divided in the Y-direction by the separation portion 62b (the regions where the drain-side select gate SGD0A and the drain-side select gate SGD1B are formed) each communicate with the slit ST.

Accordingly, the replacement of the sacrificial layer 71 with the conductive layer used to form the drain-side select gate layer can be performed even for the region where the second string unit SU1 not adjacent to the slit ST is disposed.

Another example of the semiconductor memory device of the first embodiment will now be described with reference to FIG. 12 to FIG. 14D.

Figure 12:
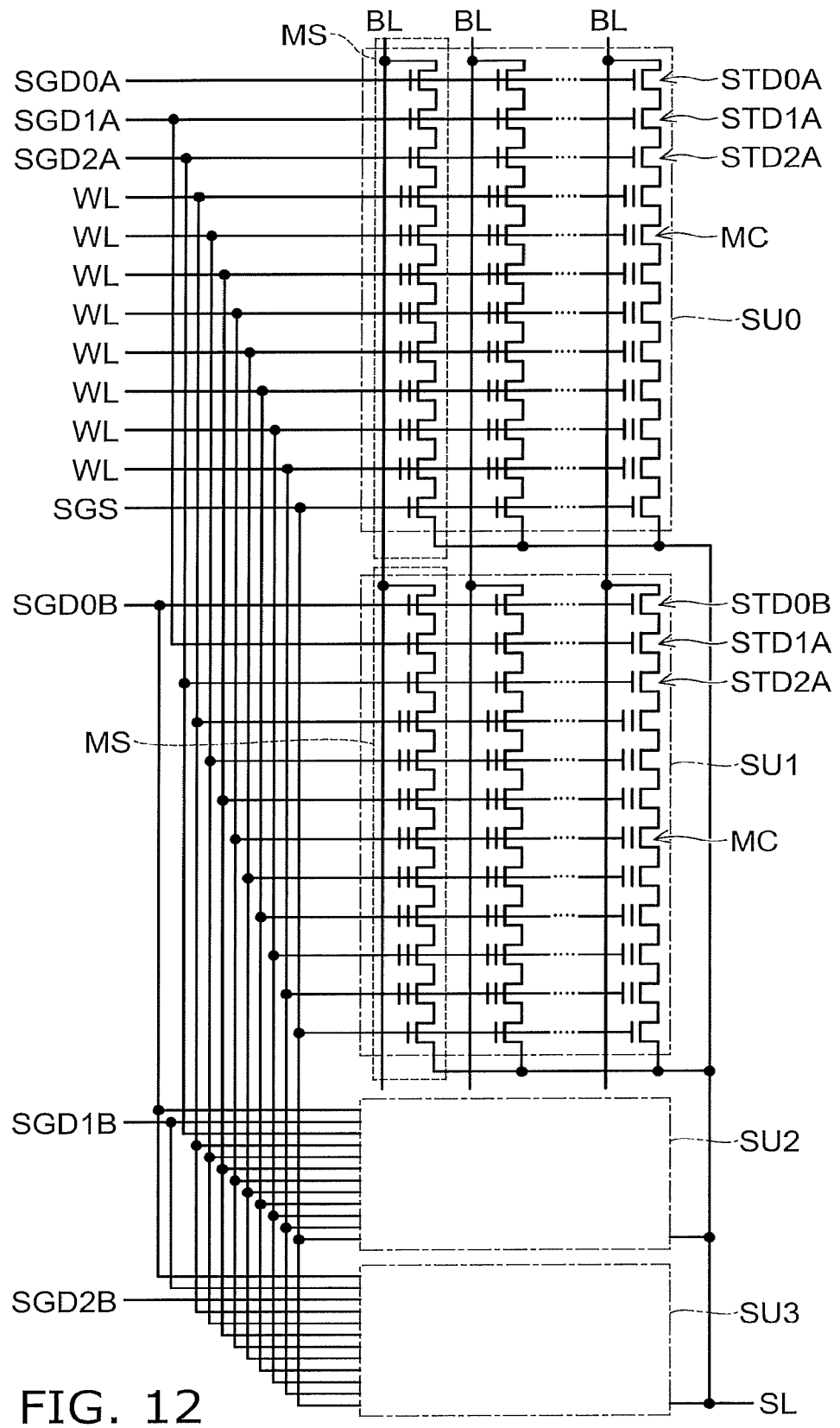
FIG. 12 is a circuit diagram of the semiconductor memory device of the first embodiment.

FIG. 12 is a circuit diagram of the other example of the semiconductor memory device of the first embodiment.

Figure 13:
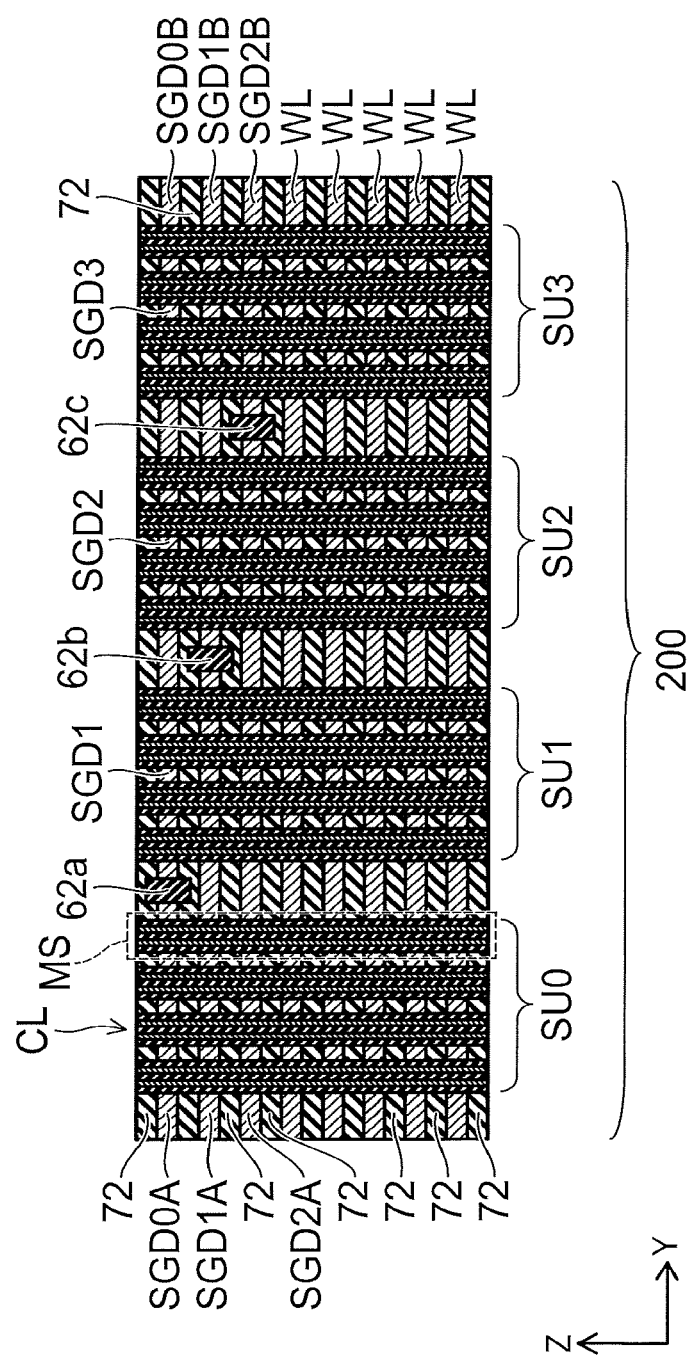
FIG. 13 is a schematic cross-sectional view of the semiconductor memory device of the first embodiment.

FIG. 13 is a schematic cross-sectional view of the other example of the semiconductor memory device of the first embodiment.

In the example shown in FIGS. 12 and 13, the four string units SU0, SU1, SU2, and SU3 are disposed in one block 200. Also, three layers of the drain-side select gate layers are stacked in the upper layer portion of the stacked body 100. The insulating layers 72 are provided between the drain-side select gate layers.

The drain-side select gate layer of the uppermost layer is divided into two select gates in the Y-direction by the separation portion 62a. The separation portion 62a divides the drain-side select gate layer of the uppermost layer into the first drain-side select gate SGD0A and the fourth drain-side select gate SGD0B.

The drain-side select gate layer of the second layer from the top is divided into two select gates in the Y-direction by the separation portion 62b. The separation portion 62b divides the drain-side select gate layer of the second layer from the top into the second drain-side select gate SGD1A and a fifth drain-side select gate SGD1B.

The drain-side select gate layer of the third layer from the top is divided into two select gates in the Y-direction by a separation portion 62c. The separation portion 62c divides the drain-side select gate layer of the third layer from the top into a third drain-side select gate SGD2A and a sixth drain-side select gate SGD2B.

The first drain-side select gate SGD0A, the second drain-side select gate SGD1A, the third drain-side select gate SGD2A, the fourth drain-side select gate SGD0B, the fifth drain-side select gate SGD1B, and the sixth drain-side select gate SGD2B each are controlled electrically independently.

Figure 14A:
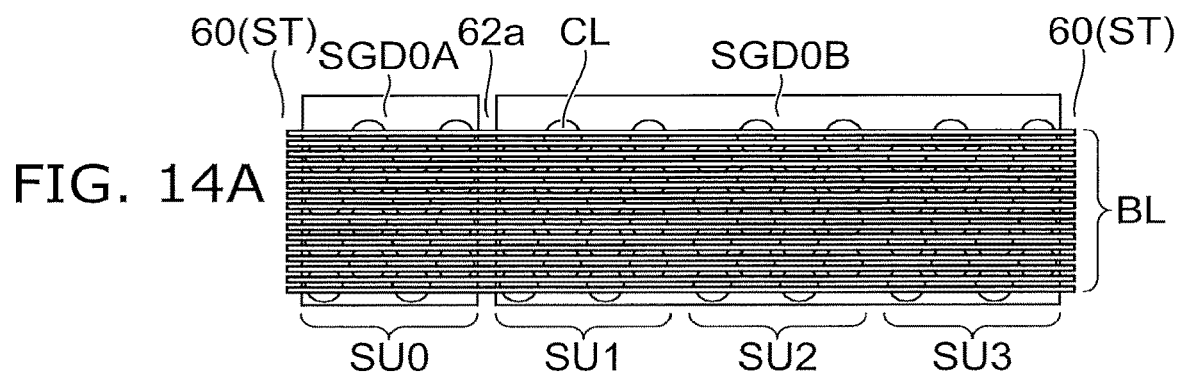
FIGS. 14A to 14D are schematic plan views of the semiconductor memory device of the first embodiment.

FIG. 14A is a schematic plan view of the layer of the one block 200 where the first drain-side select gate SGD0A and the fourth drain-side select gate SGD0B are provided.

Figure 14B:
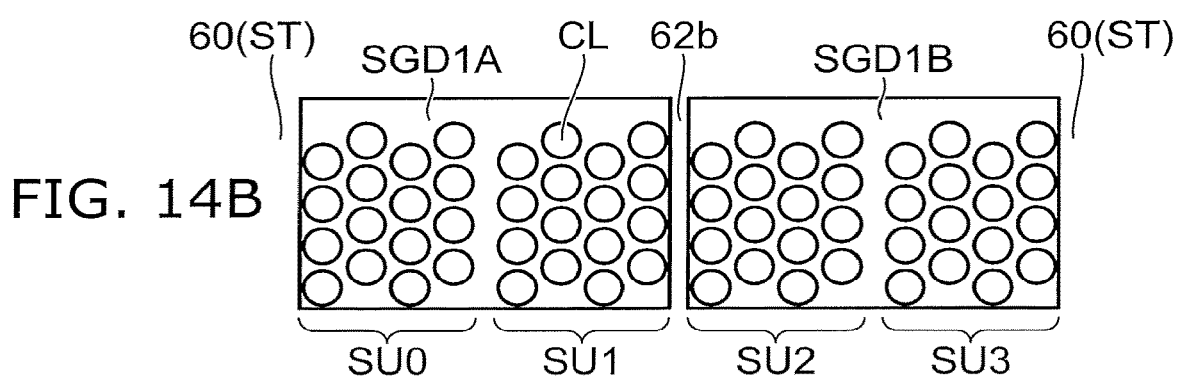

FIG. 14B is a schematic plan view of the layer of the one block 200 where the second drain-side select gate SGD1A and the fifth drain-side select gate SGD1B are provided.

Figure 14C:
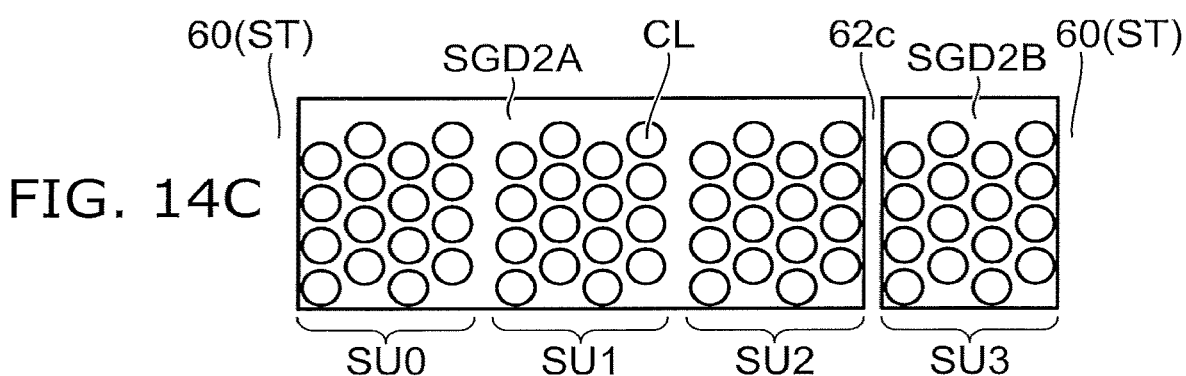

FIG. 14C is a schematic plan view of the layer of the one block 200 where the third drain-side select gate SGD2A and the sixth drain-side select gate SGD2B are provided.

Figure 14D:
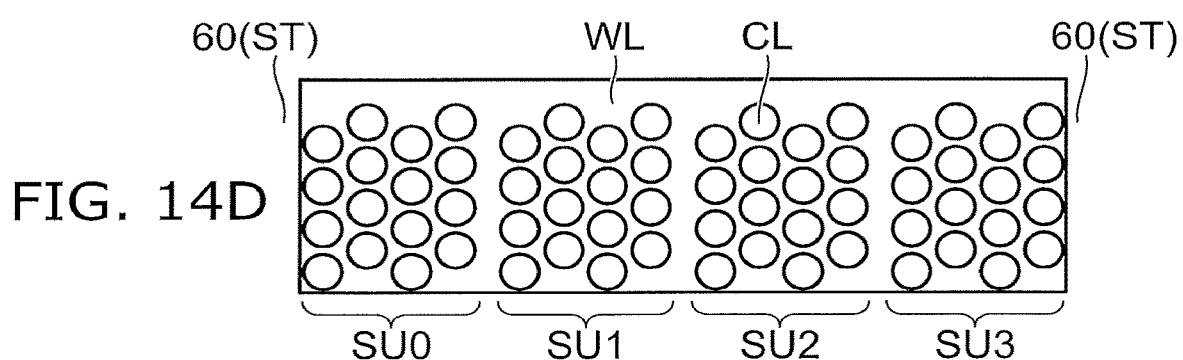

FIG. 14D is a schematic plan view of the layer of the one block 200 where the word line WL is provided.

The word line WL of each layer is provided commonly for the first to fourth string units SU0 to SU3. The fourth drain-side select gate SGD0B is provided commonly for the second string unit SU1, the third string unit SU2, and the fourth string unit SU3. The second drain-side select gate SGD1A is provided commonly for the first string unit SU0 and the second string unit SU1. The fifth drain-side select gate SGD1B is provided commonly for the third string unit SU2 and the fourth string unit SU3. The third drain-side select gate SGD2A is provided commonly for the first string unit SU0, the second string unit SU1, and the third string unit SU2.

The separation portions 62a to 62c are insulating films extending in the same direction as the separation portions 60 (the slits ST) piercing the entire stacked body 100.

As shown in FIG. 13, the four string units SU0, SU1, SU2, and SU3 of the one block 200 are arranged to be separated from each other in the Y-direction.

The separation portion 62a is disposed between the first string unit SU0 and the second string unit SU1 adjacent to each other in the Y-direction, pierces only the drain-side select gate layer of the uppermost layer of the multiple conductive layers 70, and does not divide the other conductive layers of the multiple conductive layers 70.

The separation portion 62b is disposed between the second string unit SU1 and the third string unit SU2 adjacent to each other in the Y-direction, pierces only the drain-side select gate layer of the second layer from the top of the multiple conductive layers 70, and does not divide the other conductive layers.

The separation portion 62c is disposed between the third string unit SU2 and the fourth string unit SU3 adjacent to each other in the Y-direction, pierces only the drain-side select gate layer of the third layer from the top of the multiple conductive layers 70, and does not divide the other conductive layers.

As shown in FIG. 13 and FIGS. 14A to 14D, the position in the Y-direction of the separation portion 62a provided in the drain-side select gate layer of the uppermost layer, the position in the Y-direction of the separation portion 62b provided in the drain-side select gate layer of the second layer from the top, and the position in the Y-direction of the separation portion 62c provided in the drain-side select gate layer of the third layer from the top are shifted from each other.

As shown in FIG. 12, the first string unit SU0 includes the first drain-side select transistor STD0A having the first drain-side select gate SGD0A as a control gate, the second drain-side select transistor STD1A having the second drain-side select gate SGD1A as a control gate, and a third drain-side select transistor STD2A having the third drain-side select gate SGD2A as a control gate.

The second string unit SU1 includes a fourth drain-side select transistor STD0B having the fourth drain-side select gate SGD0B as a control gate, the second drain-side select transistor STD1A having the second drain-side select gate SGD1A as a control gate, and the third drain-side select transistor STD2A having the third drain-side select gate SGD2A as a control gate.

The third string unit SU2 includes the fourth drain-side select transistor having the fourth drain-side select gate SGD0B as a control gate, the fifth drain-side select transistor having the fifth drain-side select gate SGD1B as a control gate, and the third drain-side select transistor having the third drain-side select gate SGD2A as a control gate.

The fourth string unit SU3 includes the fourth drain-side select transistor having the fourth drain-side select gate SGD0B as a control gate, the fifth drain-side select transistor having the fifth drain-side select gate SGD1B as a control gate, and the sixth drain-side select transistor having the sixth drain-side select gate SGD2B as a control gate.

Any one of the string units of the four string units SU0, SU1, SU2, and SU3 inside the one block 200 is selected by the drain-side select transistors.

When the first string unit SU0 is selected, a potential that is the threshold voltage or more is applied to the first drain-side select gate SGD0A, the second drain-side select gate SGD1A, and the third drain-side select gate SGD2A; and the first drain-side select transistor, the second drain-side select transistor, and the third drain-side select transistor are set to ON. The fourth drain-side select transistor, the fifth drain-side select transistor, and the sixth drain-side select transistor are set to OFF.

The semiconductor bodies 20 of the selected first string unit SU0 are electrically connected to the bit lines BL; and the semiconductor bodies 20 of the unselected second to fourth string units SU1 to SU3 are not electrically connected to the bit lines BL.

When the second string unit SU1 is selected, a potential that is the threshold voltage or more is applied to the fourth drain-side select gate SGD0B, the second drain-side select gate SGD1A, and the third drain-side select gate SGD2A; and the fourth drain-side select transistor, the second drain-side select transistor, and the third drain-side select transistor are set to ON. The first drain-side select transistor, the fifth drain-side select transistor, and the sixth drain-side select transistor are set to OFF.

The semiconductor bodies 20 of the selected second string unit SU1 are electrically connected to the bit lines BL; and the semiconductor bodies 20 of the unselected first, third, and fourth string units SU0, SU2, and SU3 are not electrically connected to the bit lines BL.

When the third string unit SU2 is selected, a potential that is the threshold voltage or more is applied to the fourth drain-side select gate SGD0B, the fifth drain-side select gate SGD1B, and the third drain-side select gate SGD2A; and the fourth drain-side select transistor, the fifth drain-side select transistor, and the third drain-side select transistor are set to ON. The first drain-side select transistor, the second drain-side select transistor, and the sixth drain-side select transistor are set to OFF.

The semiconductor bodies 20 of the selected third string unit SU2 are electrically connected to the bit lines BL; and the semiconductor bodies 20 of the unselected first, second, and fourth string units SU0, SU1, and SU3 are not electrically connected to the bit lines BL.

When the fourth string unit SU3 is selected, a potential that is the threshold voltage or more is applied to the fourth drain-side select gate SGD0B, the fifth drain-side select gate SGD1B, and the sixth drain-side select gate SGD2B; and the fourth drain-side select transistor, the fifth drain-side select transistor, and the sixth drain-side select transistor are set to ON. The first drain-side select transistor, the second drain-side select transistor, and the third drain-side select transistor are set to OFF.

The semiconductor bodies 20 of the selected fourth string unit SU3 are electrically connected to the bit lines BL; and the semiconductor bodies 20 of the unselected first to third string units SU0 to SU2 are not electrically connected to the bit lines BL.

In the example shown in FIG. 13 and FIGS. 14A to 14D as well, it is possible to reduce the number of the separation portions 60 (the slits ST) having wide widths piercing the entire stacked body 100 and reduce the planar size of the memory cell array.

The separation portions 62a to 62c divide drain-side select gate layers of different layers and are disposed at positions that are shifted from each other in the Y-direction. Accordingly, when replacing the sacrificial layers 71 with the conductive layers 70 via the slit ST, the two regions divided in the Y-direction by the separation portion 62a (the regions where the drain-side select gate SGD0A and the drain-side select gate SGD0B are formed) each communicate with the slit ST; the two regions divided in the Y-direction by the separation portion 62b (the regions where the drain-side select gate SGD1A and the drain-side select gate SGD1B are formed) each communicate with the slit ST; and the two regions divided in the Y-direction by the separation portion 62c (the regions where the drain-side select gate SGD2A and the drain-side select gate SGD2B are formed) each communicate with the slit ST.

Accordingly, the replacement of the sacrificial layers 71 with the conductive layers that are used to form the drain-side select gate layers can be performed even for the regions where the second string unit SU1 and the third string unit SU2 that are not adjacent to the slit ST are disposed.

The number of string units disposed inside one block 200 subdivided by the separation portions 60 (the slits ST) may be 5 or more. The number of string units and the number of layers of drain-side select gate layers can be specified as follows.

Namely, the semiconductor memory device of the first embodiment includes the first to nth string units (n being a natural number of 3 or more) including the multiple memory strings MS, and the (n−1) layers of the drain-side select gate layers stacked in the Z-direction. The (n−1) layers of the drain-side select gate layers include the first to (2×(n−1))th drain-side select gates that are electrically isolated. The first string unit is selected by the first to (n−1)th drain-side select gates; the second string unit is selected by the second to (n−1+1)th drain-side select gates; the kth string unit (k being not less than 1 and not more than n) is selected by the kth to (n+k−2)th select gates; and the nth string unit is selected by the nth to (2×(n−1))th drain-side select gates.

A semiconductor memory device of a second embodiment will now be described.

Figure 15:
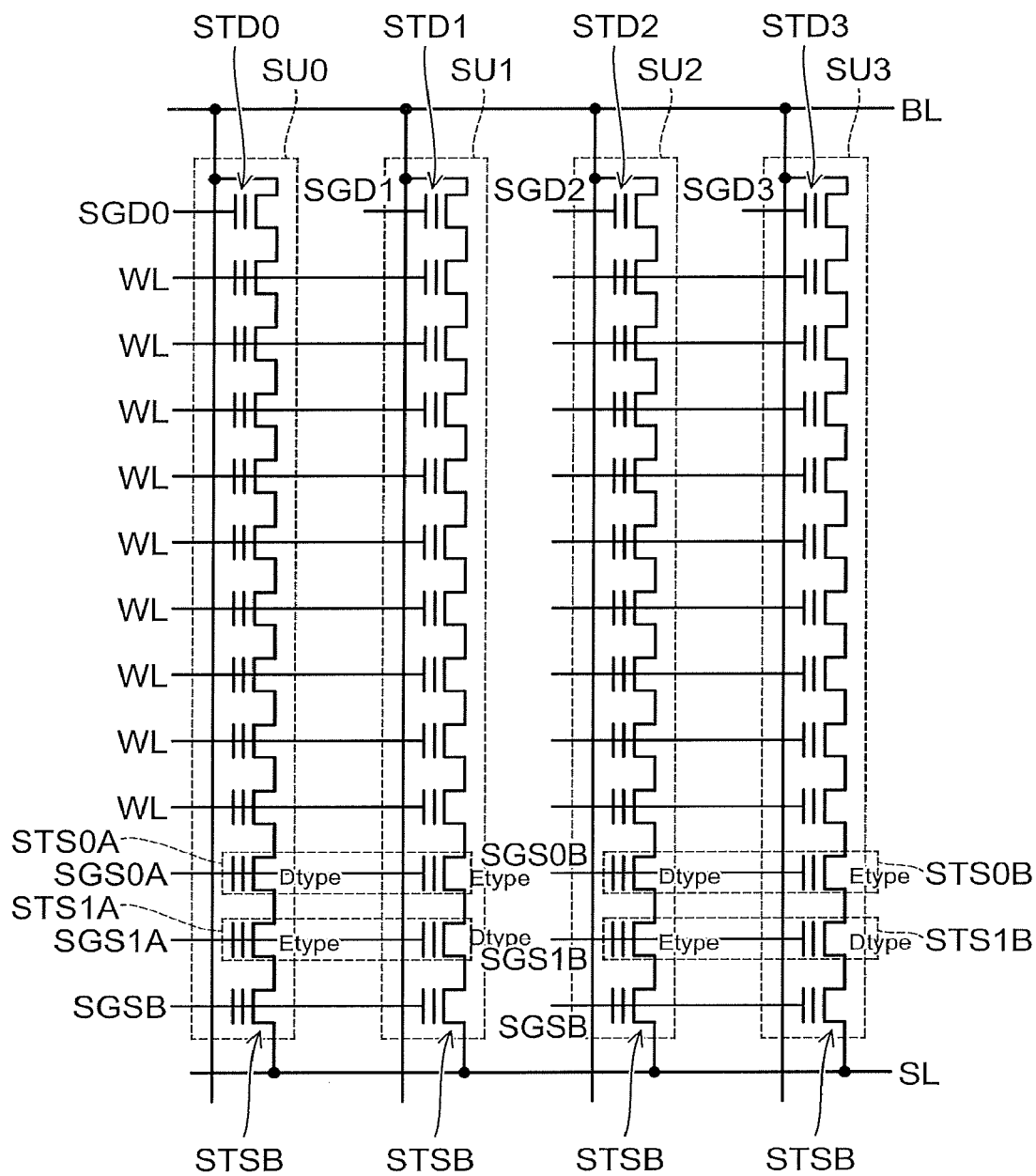
FIG. 15 is a circuit diagram of a semiconductor memory device of a second embodiment.

FIG. 15 is a circuit diagram of the semiconductor memory device of the second embodiment.

Figure 16:
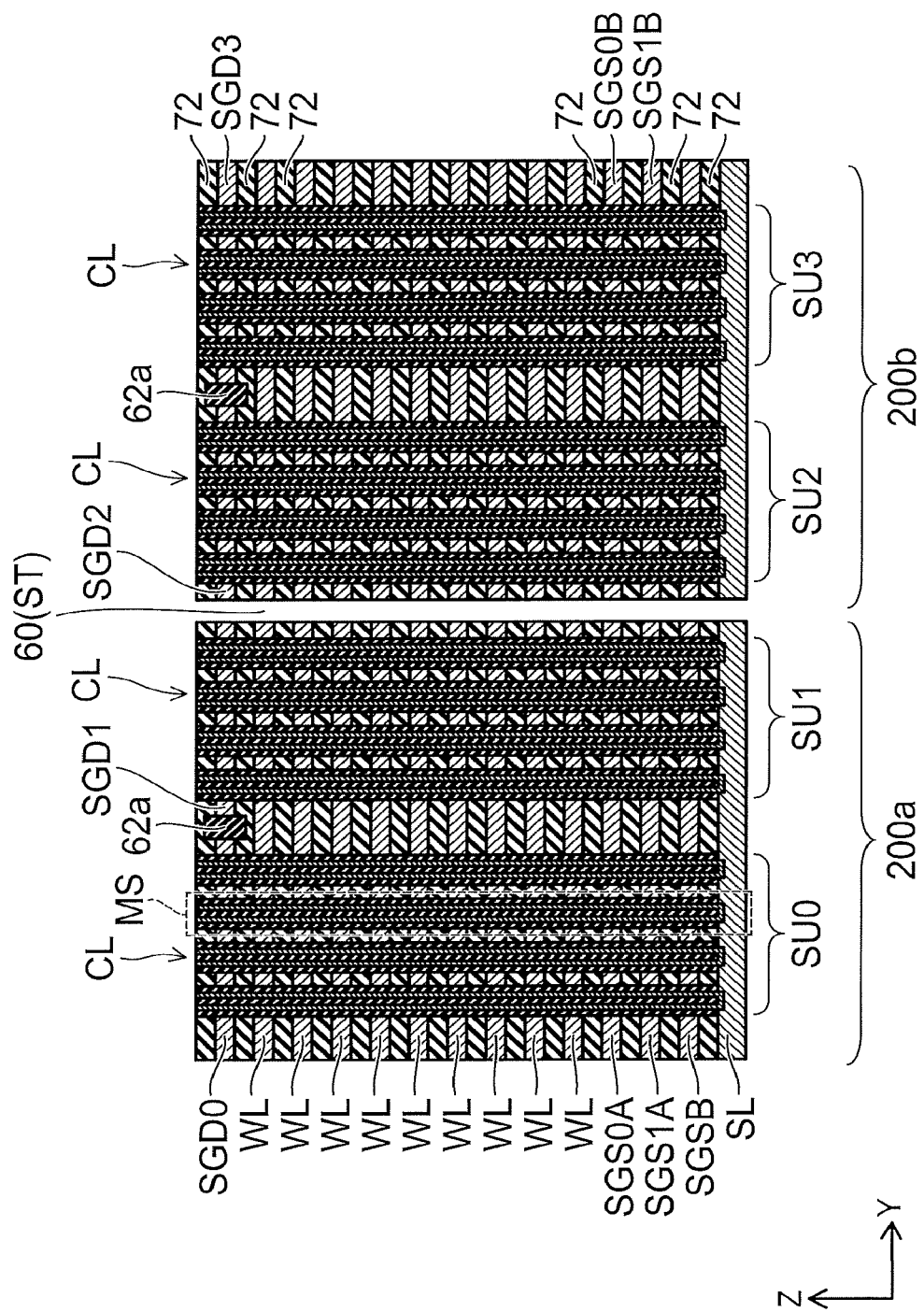
FIG. 16 is a schematic cross-sectional view of the semiconductor memory device of the second embodiment.

FIG. 16 is a schematic cross-sectional view of the semiconductor memory device of the second embodiment.

FIG. 16 shows two sub-blocks 200a and 200b subdivided by three separation portions 60 (slits ST) separated from each other in the Y-direction.

One block which is the erasing unit includes the two sub-blocks 200a and 200b; the first string unit SU0 and the second string unit SU1 are disposed in one sub-block 200a of the two sub-blocks 200a and 200b (on the left side in FIG. 16); and the third string unit SU2 and the fourth string unit SU3 are disposed in the other sub-block 200b (on the right side in FIG. 16).

Similarly to the first embodiment described above, the multiple conductive layers 70 are stacked on the source layer SL with the insulating layers 72 interposed. The multiple conductive layers 70 include the multiple word lines WL, a drain-side select gate layer, and multiple layers of the source-side select gate layers.

The word line WL of each layer in the one sub-block 200a is provided commonly for the first string unit SU0 and the second string unit SU1. The word line WL of each layer in the other sub-block 200b is provided commonly for the third string unit SU2 and the fourth string unit SU3.

In the example shown in FIG. 16, one layer of the drain-side select gate layers and three layers of the source-side select gate layers are provided. The multiple layers of the word lines WL are stacked between the drain-side select gate layer and the source-side select gate layers. The three layers of the source-side select gate layers are stacked between the source layer SL and the word line WL of the lowermost layer. In each of the sub-blocks 200a and 200b, the drain-side select gate layer is divided into two select gates in the Y-direction by the separation portion 62a. The separation portion 62a of the one sub-block 200a divides the drain-side select gate layer into a first drain-side select gate SGD0 and a second drain-side select gate SGD1. The separation portion 62a of the other sub-block 200b divides the drain-side select gate layer into a third drain-side select gate SGD2 and a fourth drain-side select gate SGD3. The separation portion 62a is an insulating film extending in the same direction as the separation portions 60 (the slits ST) piercing the entire stacked body 100.

The first to fourth drain-side select gates SGD0 to SGD3 each are controlled electrically independently.

The first string unit SU0 and the second string unit SU1 in the one sub-block 200a are arranged to be separated from each other in the Y-direction. The third string unit SU2 and the fourth string unit SU3 in the other sub-block 200b are arranged to be separated from each other in the Y-direction.

As shown in FIG. 15, the memory string of the first string unit SU0 includes a first drain-side select transistor STD0 having the first drain-side select gate SGD0 as a control gate. The memory string of the second string unit SU1 includes a second drain-side select transistor STD1 having the second drain-side select gate SGD1 as a control gate.

The memory string of the third string unit SU2 includes a third drain-side select transistor STD2 having the third drain-side select gate SGD2 as a control gate.

The memory string of the fourth string unit SU3 includes a fourth drain-side select transistor STD3 having the fourth drain-side select gate SGD3 as a control gate.

As shown in FIG. 16, a first source-side select gate SGS0A, a second source-side select gate SGS1A, and a bottom select gate SGSB are provided in the one sub-block 200a. The select gates SGS0A, SGS1A, and SGSB are provided commonly for the first string unit SU0 and the second string unit SU1.

The bottom select gate SGSB is provided on the source layer SL; the second source-side select gate SGS1A is provided on the bottom select gate SGSB; and the first source-side select gate SGS0A is provided on the second source-side select gate SGS1A.

The insulating layer 72 is provided between the bottom select gate SGSB and the source layer SL, between the second source-side select gate SGS1A and the bottom select gate SGSB, and between the first source-side select gate SGS0A and the second source-side select gate SGS1A.

A first source-side select gate SGS0B, a second source-side select gate SGS1B, and the bottom select gate SGSB are provided in the other sub-block 200b. The select gates SGS0B, SGS1B, and SGSB are provided commonly for the third string unit SU2 and the fourth string unit SU3.

The bottom select gate SGSB is provided on the source layer SL; the second source-side select gate SGS1B is provided on the bottom select gate SGSB; and the first source-side select gate SGS0B is provided on the second source-side select gate SGS1B.

The insulating layer 72 is provided between the bottom select gate SGSB and the source layer SL, between the second source-side select gate SGS1B and the bottom select gate SGSB, and between the first source-side select gate SGS0B and the second source-side select gate SGS1B.

The source-side select gate SGS0A and the source-side select gate SGS0B are provided in the same layer and are divided in the Y-direction by the separation portions 60 (the slits ST). The source-side select gate SGS1A and the source-side select gate SGS1B are provided in the same layer, and are divided in the Y-direction by the separation portions 60 (the slits ST).

As shown in FIG. 15, the memory string of the first string unit SU0 includes a first source-side select transistor STS0A having the first source-side select gate SGS0A as a control gate, a second source-side select transistor STS1A having the second source-side select gate SGS1A as a control gate, and a bottom select transistor STSB having the bottom select gate SGSB as a control gate.

In one memory string of the first string unit SU0, the first source-side select transistor STS0A, the second source-side select transistor STS1A, and the bottom select transistor STSB are connected in series between the source layer SL and the memory cells MC.

The memory string of the second string unit SU1 includes the first source-side select transistor STS0A having the first source-side select gate SGS0A as a control gate, the second source-side select transistor STS1A having the second source-side select gate SGS1A as a control gate, and the bottom select transistor STSB having the bottom select gate SGSB as a control gate.

In one memory string of the second string unit SU1, the first source-side select transistor STS0A, the second source-side select transistor STS1A, and the bottom select transistor STSB are connected in series between the source layer SL and the memory cells MC.

The first source-side select transistor STS0A of the first string unit SU0 is a transistor of the depletion type; and the first source-side select transistor STS0A of the second string unit SU1 is a transistor of the enhancement type.

Here, the transistor of the depletion type has a negative threshold voltage; and the transistor of the enhancement type has a positive threshold voltage.

The second source-side select transistor STS1A of the first string unit SU0 is a transistor of the enhancement type; and the second source-side select transistor STS1A of the second string unit SU1 is a transistor of the depletion type.

The memory string of the third string unit SU2 of the other sub-block 200b includes a first source-side select transistor STS0B having the first source-side select gate SGS0B as a control gate, a second source-side select transistor STS1B having the second source-side select gate SGS1B as a control gate, and the bottom select transistor STSB having the bottom select gate SGSB as a control gate.

In one memory string of the third string unit SU2, the first source-side select transistor STS0B, the second source-side select transistor STS1B, and the bottom select transistor STSB are connected in series between the source layer SL and the memory cells MC.

The memory string of the fourth string unit SU3 includes the first source-side select transistor STS0B having the first source-side select gate SGS0B as a control gate, the second source-side select transistor STS1B having the second source-side select gate SGS1B as a control gate, and the bottom select transistor STSB having the bottom select gate SGSB as a control gate.

In one memory string of the fourth string unit SU3, the first source-side select transistor STS0B, the second source-side select transistor STS1B, and the bottom select transistor STSB are connected in series between the source layer SL and the memory cells MC.

The first source-side select transistor STS0B of the third string unit SU2 is a transistor of the depletion type; and the first source-side select transistor STS0B of the fourth string unit SU3 is a transistor of the enhancement type.

The second source-side select transistor STS1B of the third string unit SU2 is a transistor of the enhancement type; and the second source-side select transistor STS1B of the fourth string unit SU3 is a transistor of the depletion type.

FIG. 22A is a figure (a table) illustrating the potential controls of the source-side select gates of the semiconductor memory device shown in FIG. 15 and FIG. 16.

In FIG. 22A, "L" and "H" illustrate the potentials applied to the source-side select gates; and the "L" level (a first level) is a potential that is higher than the threshold voltage of the transistor of the depletion type and lower than the threshold voltage of the transistor of the enhancement type. The "L" level is, for example, 0 V. The "H" level (a second level) is a positive potential that is higher than the threshold voltage of the transistor of the enhancement type.

Any one of the string units of the first string unit SU0 and the second string unit SU1 inside one of the sub-blocks 200a and 200b is selected by the source-side select transistors STS0A, STS1A, and STSB.

When the first string unit SU0 is selected, the bottom select transistor STSB is set to ON. Further, the "L" level is applied to the first source-side select gate SGS0A; the first source-side select transistor STS0A of the first string unit SU0 is set to ON; the "H" level is applied to the second source-side select gate SGS1A; and the second source-side select transistor STS1A of the first string unit SU0 also is set to ON.

The semiconductor bodies 20 of the selected first string unit SU0 are electrically connected to the source layer SL.

The first source-side select transistor STS0A of the second string unit SU1 that shares the first source-side select gate SGS0A with the first string unit SU0 is set to OFF by the "L" level applied to the first source-side select gate SGS0A. Accordingly, the semiconductor bodies 20 of the unselected second string unit SU1 are not electrically connected to the source layer SL.

In the other sub-block 200b, the "L" level is applied to the first source-side select gate SGS0B and the second source-side select gate SGS1B; the second source-side select transistor STS1B of the third string unit SU2 are set to OFF; and the first source-side select transistor STS0B of the fourth string unit SU3 is set to OFF.

Accordingly, the semiconductor bodies 20 of the unselected third string unit SU2 and the semiconductor bodies 20 of the unselected fourth string unit SU3 are not electrically connected to the source layer SL.

When the read operation is executed for the memory cells of the first string unit SU0, the potentials of the semiconductor bodies 20 of the selected first string unit SU0 are set to the potential of the source layer SL. At this time, the semiconductor bodies 20 of the unselected second string unit SU1 which is in the same sub-block 200a as the first string unit SU0 are not connected to the source layer SL; and the voltage stress (the read disturbance) in the read operation applied to the memory cells of the second string unit SU1 can be suppressed.

When the second string unit SU1 is selected, the bottom select transistor STSB is set to ON. Further, the "H" level is applied to the first source-side select gate SGS0A; the first source-side select transistor STS0A of the second string unit SU1 is set to ON; the "L" level is applied to the second source-side select gate SGS1A; and the second source-side select transistor STS0A of the second string unit SU1 also is set to ON.

The semiconductor bodies 20 of the selected second string unit SU1 are electrically connected to the source layer SL.

The second source-side select transistor STS1A of the first string unit SU0 that shares the second source-side select gate SGS1A with the second string unit SU1 is set to OFF by the "L" level applied to the second source-side select gate SGS1A. Accordingly, the semiconductor bodies 20 of the unselected first string unit SU0 are not electrically connected to the source layer SL.

In the other sub-block 200b, the "L" level is applied to the first source-side select gate SGS0B and the second source-side select gate SGS1B; the second source-side select transistor STS1B of the third string unit SU2 is set to OFF; and the first source-side select transistor STS0B of the fourth string unit SU3 is set to OFF.

Accordingly, the semiconductor bodies 20 of the unselected third string unit SU2 and the semiconductor bodies 20 of the unselected fourth string unit SU3 are not electrically connected to the source layer SL.

When the read operation is executed for the memory cells of the second string unit SU1, the potentials of the semiconductor bodies 20 of the selected second string unit SU1 are set to the potential of the source layer SL. At this time, the semiconductor bodies 20 of the unselected first string unit SU0 which is in the same sub-block 200a as the second string unit SU1 are not connected to the source layer SL; and the voltage stress (the read disturbance) in the read operation applied to the memory cells of the first string unit SU0 can be suppressed.

When the third string unit SU2 is selected, the bottom select transistor STSB is set to ON. Further, the "L" level is applied to the first source-side select gate SGS0B; the first source-side select transistor STS0B of the third string unit SU2 is set to ON; the "H" level is applied to the second source-side select gate SGS1B; and the second source-side select transistor STS0B of the third string unit SU2 also is set to ON.

The semiconductor bodies 20 of the selected third string unit SU2 are electrically connected to the source layer SL.

The first source-side select transistor STS0B of the fourth string unit SU3 that shares the first source-side select gate SGS0B with the third string unit SU2 is set to OFF by the "L" level applied to the first source-side select gate SGS0B. Accordingly, the semiconductor bodies 20 of the unselected fourth string unit SU3 are not electrically connected to the source layer SL.

In the other sub-block 200a, the "L" level is applied to the first source-side select gate SGS0A and the second source-side select gate SGS0A; the second source-side select transistor STS1A of the first string unit SU0 is set to OFF; and the first source-side select transistor STS0A of the second string unit SU1 is set to OFF.

Accordingly, the semiconductor bodies 20 of the unselected first string unit SU0 and the semiconductor bodies 20 of the unselected second string unit SU1 are not electrically connected to the source layer SL.

When the read operation is executed for the memory cells of the third string unit SU2, the potentials of the semiconductor bodies 20 of the selected third string unit SU2 are set to the potential of the source layer SL. At this time, the semiconductor bodies 20 of the unselected fourth string unit SU3 which is in the same sub-block 200b as the third string unit SU2 are not connected to the source layer SL; and the voltage stress (the read disturbance) in the read operation applied to the memory cells of the fourth string unit SU3 can be suppressed.

When the fourth string unit SU3 is selected, the bottom select transistor STSB is set to ON. Further, the "H" level is applied to the first source-side select gate SGS0B; the first source-side select transistor STS0B of the fourth string unit SU3 is set to ON; the "L" level is applied to the second source-side select gate SGS0B; and the second source-side select transistor STS1B of the fourth string unit SU3 also is set to ON.

The semiconductor bodies 20 of the selected fourth string unit SU3 are electrically connected to the source layer SL.

The second source-side select transistor STS1B of the third string unit SU2 that shares the second source-side select gate SGS1B with the fourth string unit SU3 is set to OFF by the "L" level applied to the second source-side select gate SGS1B. Accordingly, the semiconductor bodies 20 of the unselected third string unit SU2 are not electrically connected to the source layer SL.

In the other sub-block 200a, the "L" level is applied to the first source-side select gate SGS0A and the second source-side select gate SGS0A; the second source-side select transistor STS1A of the first string unit SU0 is set to OFF; and the first source-side select transistor STS0A of the second string unit SU1 is set to OFF.

Accordingly, the semiconductor bodies 20 of the unselected first string unit SU0 and the semiconductor bodies 20 of the unselected second string unit SU1 are not electrically connected to the source layer SL.

When the read operation is executed for the memory cells of the fourth string unit SU3, the potentials of the semiconductor bodies 20 of the selected fourth string unit SU3 are set to the potential of the source layer SL. At this time, the semiconductor bodies 20 of the unselected third string unit SU2 which is in the same sub-block 200b as the fourth string unit SU3 are not connected to the source layer SL; and the voltage stress (the read disturbance) in the read operation applied to the memory cells of the third string unit SU2 can be suppressed.

Another example of the semiconductor memory device of the second embodiment will now be described.

Figure 17:
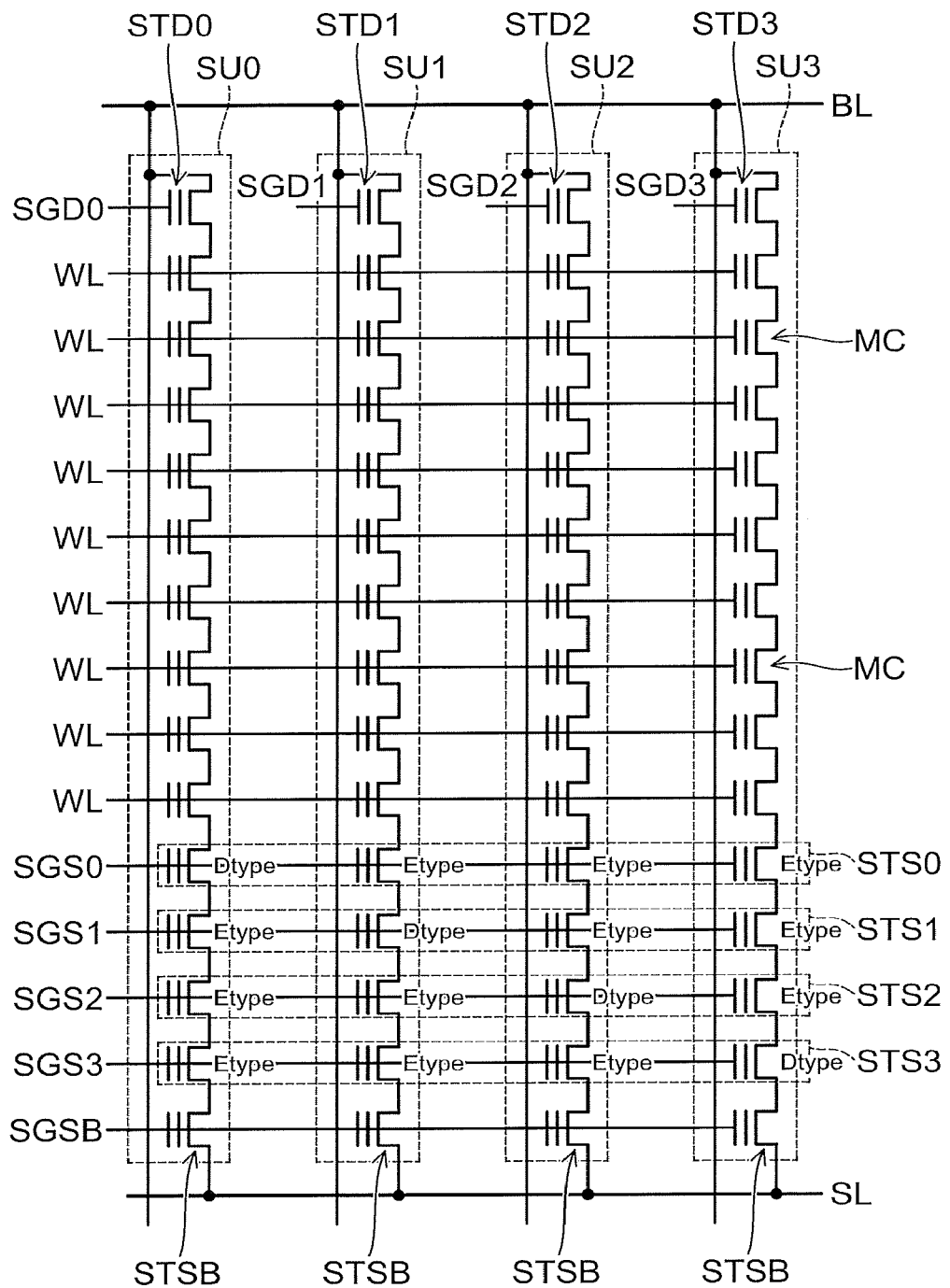
FIG. 17 is a circuit diagram of the semiconductor memory device of the second embodiment.
Figure 18:
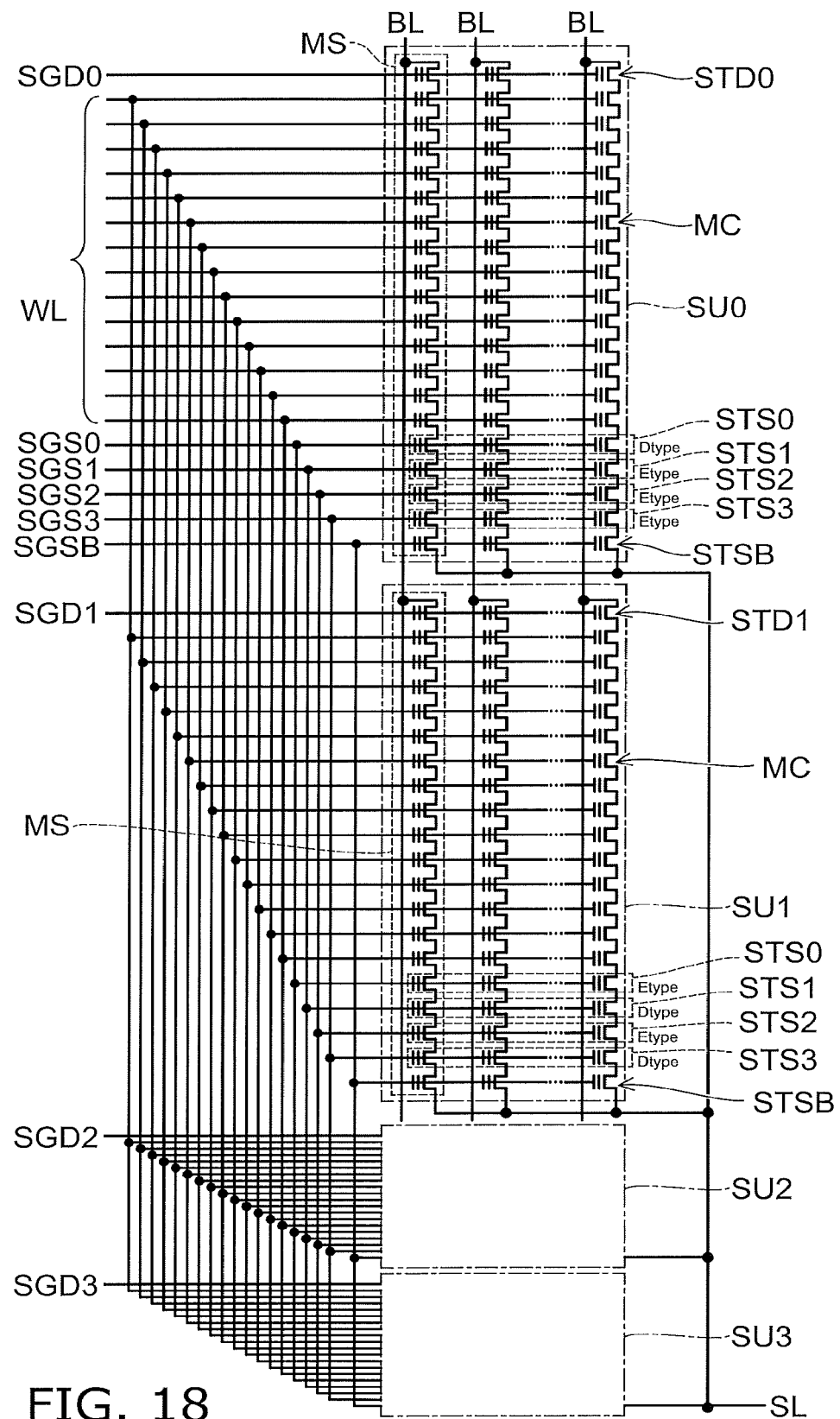
FIG. 18 is a circuit diagram of the semiconductor memory device of the second embodiment.

FIG. 17 and FIG. 18 are circuit diagrams of the other example of the semiconductor memory device of the second embodiment.

Figure 19:
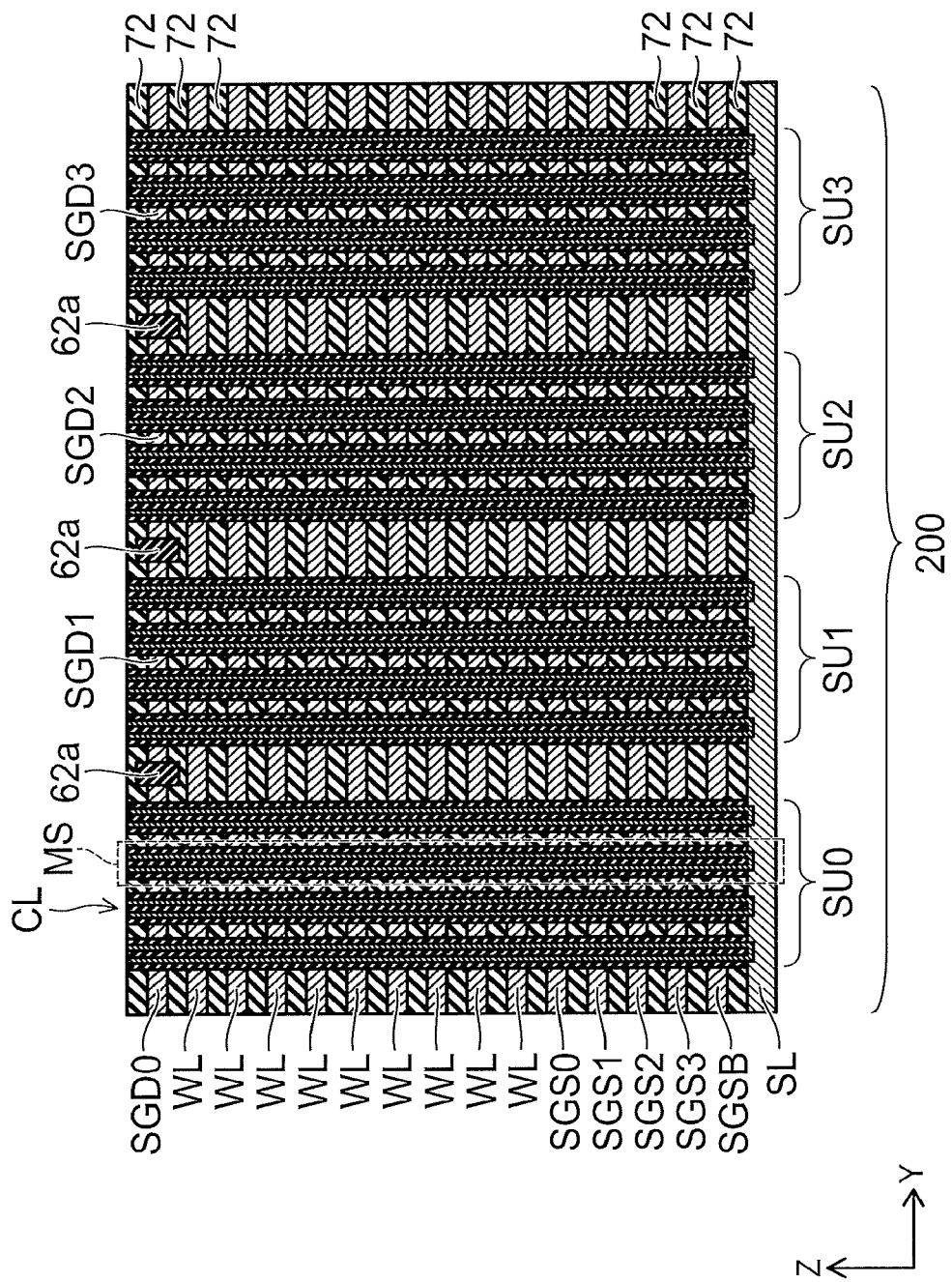
FIG. 19 is a schematic cross-sectional view of the semiconductor memory device of the second embodiment.

FIG. 19 is a schematic cross-sectional view of the other example of the semiconductor memory device of the second embodiment.

FIG. 19 shows one block 200 subdivided by two separation portions 60 (slits ST) separated from each other in the Y-direction.

In the one block 200, the first string unit SU0, the second string unit SU1, the third string unit SU2, and the fourth string unit SU3 are arranged to be separated from each other in the Y-direction.

Similarly to the embodiment described above, the multiple conductive layers 70 are stacked on the source layer SL with the insulating layers 72 interposed. The multiple conductive layers 70 include the multiple word lines WL, a drain-side select gate layer, and multiple layers of the source-side select gate layers.

The word line WL of each layer is provided commonly for the first to fourth string units SU0 to SU3.

One layer of the drain-side select gate layers and five layers of the source-side select gate layers are provided in the example shown in FIG. 19. The multiple layers of the word lines WL are stacked between the drain-side select gate layer and the source-side select gate layers. The five layers of the source-side select gate layers are stacked between the source layer SL and the word line WL of the lowermost layer.

The drain-side select gate layer is divided into the four drain-side select gates SGD0 to SGD3 in the Y-direction by the separation portion 62a. The first to fourth drain-side select gates SGD0 to SGD3 each are controlled electrically independently.

As shown in FIGS. 17 and 18, the memory string of the first string unit SU0 includes the first drain-side select transistor STD0 having the first drain-side select gate SGD0 as a control gate.

The memory string of the second string unit SU1 includes the second drain-side select transistor STD1 having the second drain-side select gate SGD1 as a control gate.

The memory string of the third string unit SU2 includes the third drain-side select transistor STD2 having the third drain-side select gate SGD2 as a control gate.

The memory string of the fourth string unit SU3 includes the fourth drain-side select transistor STD3 having the fourth drain-side select gate SGD3 as a control gate.

As shown in FIG. 19, the multiple layers of the source-side select gate layers include a first source-side select gate SGS0, a second source-side select gate SGS1, a third source-side select gate SGS2, a fourth source-side select gate SGS3, and the bottom select gate SGSB. The select gates SGS0, SGS1, SGS2, SGS3, and SGSB are provided commonly for the first to fourth string units SU0 to SU3.

The bottom select gate SGSB is provided on the source layer SL; the fourth source-side select gate SGS3 is provided on the bottom select gate SGSB; the third source-side select gate SGS2 is provided on the fourth source-side select gate SGS3; the second source-side select gate SGS1 is provided on the third source-side select gate SGS2; and the first source-side select gate SGS0 is provided on the second source-side select gate SGS1.

The insulating layer 72 is provided between the bottom select gate SGSB and the source layer SL and between the select gates.

As shown in FIGS. 17 and 18, the memory string of the first string unit SU0 includes a first source-side select transistor STS0 having the first source-side select gate SGS0 as a control gate, a second source-side select transistor STS1 having the second source-side select gate SGS1 as a control gate, a third source-side select transistor STS2 having the third source-side select gate SGS2 as a control gate, a fourth source-side select transistor STS3 having the fourth source-side select gate SGS3 as a control gate, and the bottom select transistor STSB having the bottom select gate SGSB as a control gate.

In one memory string of the first string unit SU0, the five source-side select transistors recited above are connected in series between the source layer SL and the memory cells MC.

The first source-side select transistor STS0 of the first string unit SU0 is a transistor of the depletion type; and the second to fourth source-side select transistors STS1 to STS3 of the first string unit SU0 are transistors of the enhancement type.

The memory string of the second string unit SU1 includes the first source-side select transistor STS0 having the first source-side select gate SGS0 as a control gate, the second source-side select transistor STS1 having the second source-side select gate SGS1 as a control gate, the third source-side select transistor STS2 having the third source-side select gate SGS2 as a control gate, the fourth source-side select transistor STS3 having the fourth source-side select gate SGS3 as a control gate, and the bottom select transistor STSB having the bottom select gate SGSB as a control gate.

In one memory string of the second string unit SU1, the five source-side select transistors recited above are connected in series between the source layer SL and the memory cells MC.

The second source-side select transistor STS1 of the second string unit SU1 is a transistor of the depletion type; and the first, third, and fourth source-side select transistors STS0, STS2, and STS3 of the second string unit SU1 are transistors of the enhancement type.

The memory string of the third string unit SU2 includes the first source-side select transistor STS0 having the first source-side select gate SGS0 as a control gate, the second source-side select transistor STS1 having the second source-side select gate SGS1 as a control gate, the third source-side select transistor STS2 having the third source-side select gate SGS2 as a control gate, the fourth source-side select transistor STS3 having the fourth source-side select gate SGS3 as a control gate, and the bottom select transistor STSB having the bottom select gate SGSB as a control gate.

In one memory string of the third string unit SU2, the five source-side select transistors recited above are connected in series between the source layer SL and the memory cells MC.

The third source-side select transistor STS2 of the third string unit SU2 is a transistor of the depletion type; and the first, second, and fourth source-side select transistors STS0, STS1, and STS3 of the third string unit SU2 are transistors of the enhancement type.

The memory string of the fourth string unit SU3 includes the first source-side select transistor STS0 having the first source-side select gate SGS0 as a control gate, the second source-side select transistor STS1 having the second source-side select gate SGS1 as a control gate, the third source-side select transistor STS2 having the third source-side select gate SGS2 as a control gate, the fourth source-side select transistor STS3 having the fourth source-side select gate SGS3 as a control gate, and the bottom select transistor STSB having the bottom select gate SGSB as a control gate.

In one memory string of the fourth string unit SU3, the five source-side select transistors recited above are connected in series between the source layer SL and the memory cells MC.

The fourth source-side select transistor STS3 of the fourth string unit SU3 is a transistor of the depletion type; and the first to third source-side select transistors STS0 to STS2 of the fourth string unit SU3 are transistors of the enhancement type.

FIG. 22B is a figure (a table) illustrating the potential controls of the source-side select gates of the semiconductor memory device shown in FIG. 17 to FIG. 19.

In FIG. 22B, "L" and "H" illustrate the potentials applied to the source-side select gates; and the "L" level (the first level) is a potential that is higher than the threshold voltage of the transistor of the depletion type and lower than the threshold voltage of the transistor of the enhancement type. The "L" level is, for example, 0 V. The "H" level (the second level) is a positive potential that is higher than the threshold voltage of the transistor of the enhancement type. Accordingly, when the "L" voltage is applied to the select gate, the transistor of the depletion type is set ON and the transistor of the enhancement type is set to OFF; and when the "H" voltage is applied to the select gate, the transistors of the depletion type and the enhancement type each are set to ON.

Any one of the string units of the first to fourth string units SU0 to SU3 inside one block 200 is selected by the source-side select transistors STS0, STS1, STS2, STS3, and STSB.

When the first string unit SU0 is selected, the bottom select transistor STSB is set to ON. Further, the "L" level is applied to the first source-side select gate SGS0; and the first source-side select transistor STS0 of the first string unit SU0 is set to ON. The "H" level is applied to the second to fourth source-side select gates SGS1 to SGS3; and the second to fourth source-side select transistors STS1 to STS3 of the first string unit SU0 also are set to ON.

The semiconductor bodies 20 of the selected first string unit SU0 are electrically connected to the source layer SL.

The first source-side select transistor STS0 of the enhancement type is set to OFF by the "L" level applied to the first source-side select gate SGS0 for the second to fourth string units SU1 to SU3. Accordingly, the semiconductor bodies 20 of the unselected second to fourth string units SU1 to SU3 are not electrically connected to the source layer SL.

When the read operation is executed for the memory cells of the first string unit SU0, the potentials of the semiconductor bodies 20 of the selected first string unit SU0 are set to the potential of the source layer SL. At this time, the semiconductor bodies 20 of the unselected second to fourth string units SU1 to SU3 which are in the same block 200 as the first string unit SU0 are not connected to the source layer SL; and the voltage stress (the read disturbance) in the read operation applied to the memory cells of the second to fourth string units SU1 to SU3 can be suppressed.

When the second string unit SU1 is selected, the bottom select transistor STSB is set to ON. Further, the "L" level is applied to the second source-side select gate SGS1; and the second source-side select transistor STS1 of the second string unit SU1 is set to ON. The "H" level is applied to the first, third, and fourth source-side select gates SGS0, SGS2, and SGS3; and the first, third, and fourth source-side select transistors STS0, STS2, and STS3 of the first string unit SU0 also are set to ON.

The semiconductor bodies 20 of the selected second string unit SU1 are electrically connected to the source layer SL.

The second source-side select transistor STS1 of the enhancement type is set to OFF by the "L" level applied to the second source-side select gate SGS1 for the first, third, and fourth string units SU0, SU2, and SU3. Accordingly, the semiconductor bodies 20 of the unselected first, third, and fourth string units SU0, SU2, and SU3 are not electrically connected to the source layer SL.

When the read operation is executed for the memory cells of the second string unit SU1, the potentials of the semiconductor bodies 20 of the selected second string unit SU1 are set to the potential of the source layer SL. At this time, the semiconductor bodies 20 of the unselected first, third, and fourth string units SU0, SU2, and SU3 which are in the same block 200 as the second string unit SU1 are not connected to the source layer SL; and the voltage stress (the read disturbance) in the read operation applied to the memory cells of the first, third, and fourth string units SU0, SU2, and SU3 can be suppressed.

When the third string unit SU2 is selected, the bottom select transistor STSB is set to ON. Further, the "L" level is applied to the third source-side select gate SGS2; and the third source-side select transistor STS2 of the third string unit SU2 is set to ON. The "H" level is applied to the first, second, and fourth source-side select gates SGS0, SGS1, and SGS3; and the first, second, and fourth source-side select transistors STS0, STS1, and STS3 of the third string unit SU2 also are set to ON.

The semiconductor bodies 20 of the selected third string unit SU2 are electrically connected to the source layer SL.

The third source-side select transistor STS2 of the enhancement type is set to OFF by the "L" level applied to the third source-side select gate SGS2 for the first, second, and fourth string units SU0, SU1, and SU3. Accordingly, the semiconductor bodies 20 of the unselected first, second, and fourth string units SU0, SU1, and SU3 are not electrically connected to the source layer SL.

When the read operation is executed for the memory cells of the third string unit SU2, the potentials of the semiconductor bodies 20 of the selected third string unit SU2 are set to the potential of the source layer SL. At this time, the semiconductor bodies 20 of the unselected first, second, and fourth string units SU0, SU1, and SU3 which are in the same block 200 as the third string unit SU2 are not connected to the source layer SL; and the voltage stress (the read disturbance) in the read operation applied to the memory cells of the first, second, and fourth string units SU0, SU1, and SU3 can be suppressed.

When the fourth string unit SU3 is selected, the bottom select transistor STSB is set to ON. Further, the "L" level is applied to the fourth source-side select gate SGS3; and the fourth source-side select transistor STS3 of the fourth string unit SU3 is set to ON. The "H" level is applied to the first to third source-side select gates SGS0 to SGS2; and the first to third source-side select transistors STS0 to STS2 of the fourth string unit SU3 also are set to ON.

The semiconductor bodies 20 of the selected fourth string unit SU3 are electrically connected to the source layer SL.

The fourth source-side select transistor STS3 of the enhancement type is set to OFF by the "L" level applied to the fourth source-side select gate SGS3 for the first to third string units SU0 to SU2. Accordingly, the semiconductor bodies 20 of the unselected first to third string units SU0 to SU2 are not electrically connected to the source layer SL.

When the read operation is executed for the memory cells of the fourth string unit SU3, the potentials of the semiconductor bodies 20 of the selected fourth string unit SU3 are set to the potential of the source layer SL. At this time, the semiconductor bodies 20 of the unselected first to third string units SU0 to SU2 which are in the same block 200 as the fourth string unit SU3 are not connected to the source layer SL; and the voltage stress (the read disturbance) in the read operation applied to the memory cells of the first to third string units SU0 to SU2 can be suppressed.

Yet another example of the semiconductor memory device of the second embodiment will now be described.

Figure 20:
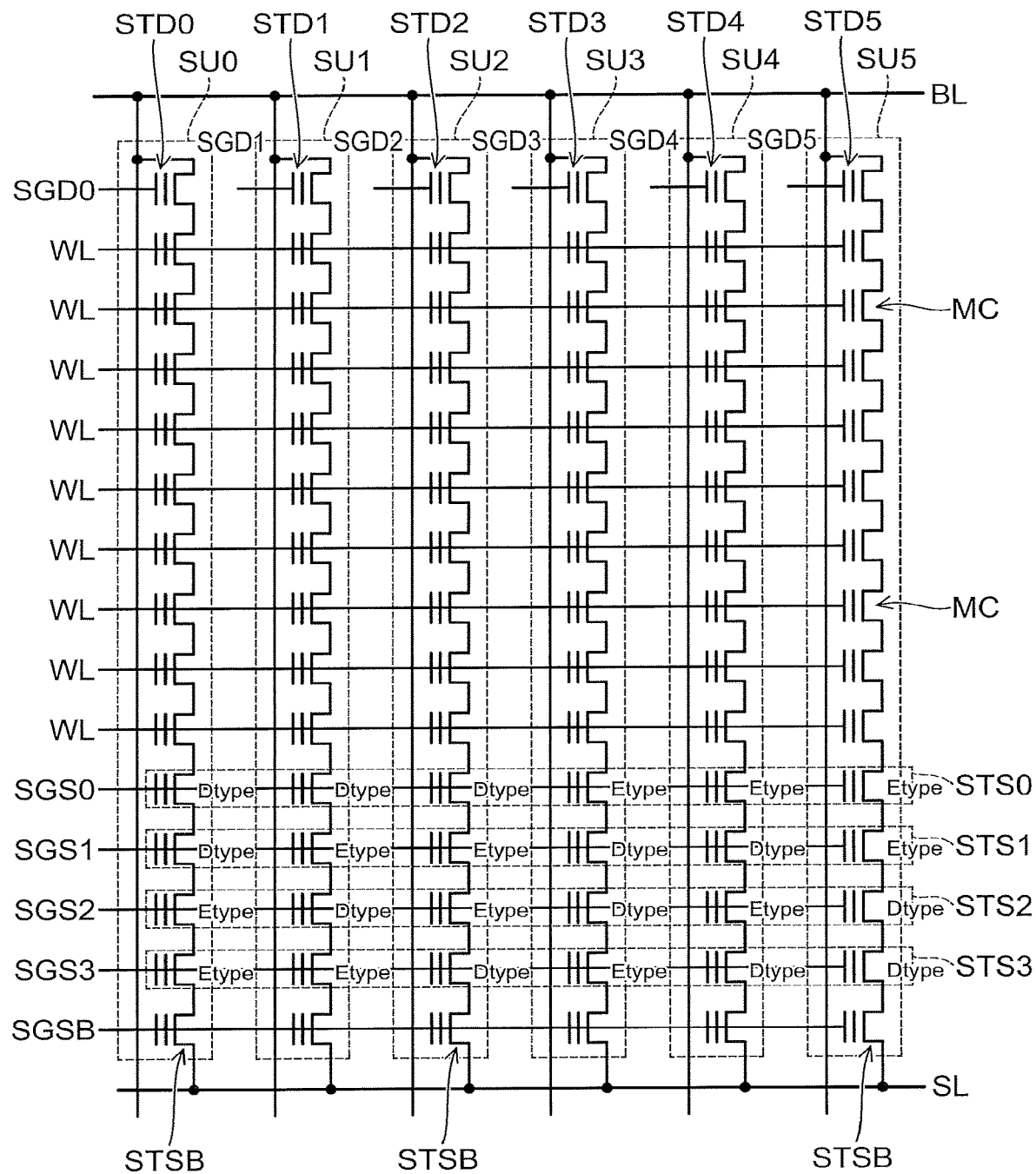
FIG. 20 is a circuit diagram of the semiconductor memory device of the second embodiment.

FIG. 20 is a circuit diagram of the other example of the semiconductor memory device of the second embodiment.

Figure 21:
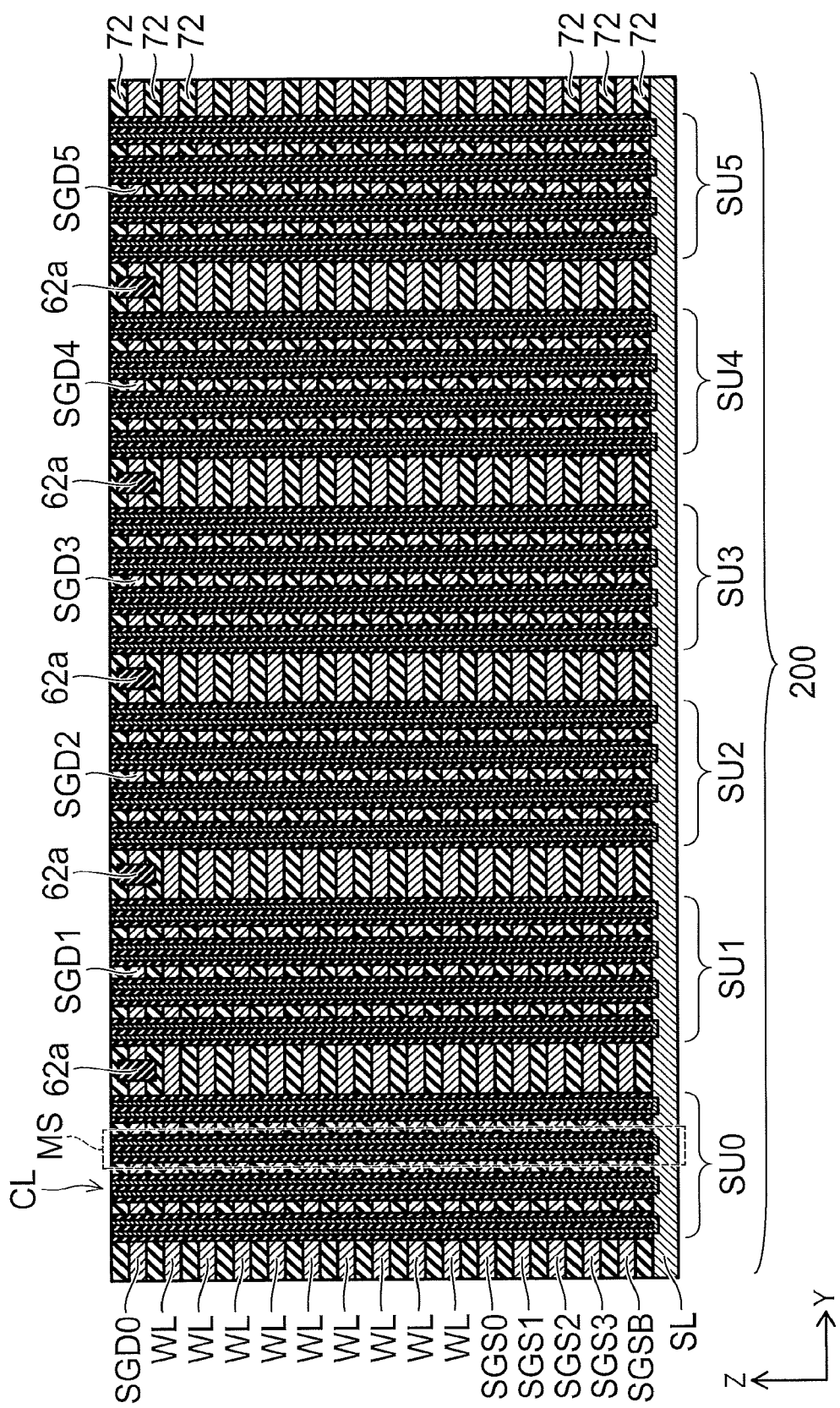
FIG. 21 is a schematic cross-sectional view of the semiconductor memory device of the second embodiment.

FIG. 21 is a schematic cross-sectional view of the other example of the semiconductor memory device of the second embodiment.

FIG. 21 shows one block 200 subdivided by the two separation portions 60 (the slits ST) separated from each other in the Y-direction.

In the one block 200, the first string unit SU0, the second string unit SU1, the third string unit SU2, the fourth string unit SU3, a fifth string unit SU4, and a sixth string unit SU5 are arranged to be separated from each other in the Y-direction.

Similarly to the embodiment described above, the multiple conductive layers 70 are stacked on the source layer SL with the insulating layers 72 interposed. The multiple conductive layers 70 include the multiple word lines WL, a drain-side select gate layer, and multiple layers of the source-side select gate layers.

The word line WL of each layer is provided commonly for the first to sixth string units SU0 to SU5.

One layer of the drain-side select gate layers and five layers of the source-side select gate layers are provided in the example shown in FIG. 21. The multiple layers of the word lines WL are stacked between the drain-side select gate layer and the source-side select gate layers. The five layers of the source-side select gate layers are stacked between the source layer SL and the word line WL of the lowermost layer.

The drain-side select gate layer is divided into the six drain-side select gates SGD0 to SGD5 in the Y-direction by the separation portion 62a. The first to sixth drain-side select gates SGD0 to SGD5 each are controlled electrically independently.

As shown in FIG. 20, the memory string of the first string unit SU0 includes the first drain-side select transistor STD0 having the first drain-side select gate SGD0 as a control gate.

The memory string of the second string unit SU1 includes the second drain-side select transistor STD1 having the second drain-side select gate SGD1 as a control gate.

The memory string of the third string unit SU2 includes the third drain-side select transistor STD2 having the third drain-side select gate SGD2 as a control gate.

The memory string of the fourth string unit SU3 includes the fourth drain-side select transistor STD3 having the fourth drain-side select gate SGD3 as a control gate.

The memory string of the fifth string unit SU4 includes a fifth drain-side select transistor STD4 having the fifth drain-side select gate SGD4 as a control gate.

The memory string of the sixth string unit SU5 includes a sixth drain-side select transistor STD5 having the sixth drain-side select gate SGD5 as a control gate.

As shown in FIG. 21, the multiple layers of the source-side select gate layers include the first source-side select gate SGS0, the second source-side select gate SGS1, the third source-side select gate SGS2, the fourth source-side select gate SGS3, and the bottom select gate SGSB. The select gates SGS0, SGS1, SGS2, SGS3, and SGSB are provided commonly for the first to sixth string units SU0 to SU5.

The bottom select gate SGSB is provided on the source layer SL; the fourth source-side select gate SGS3 is provided on the bottom select gate SGSB; the third source-side select gate SGS2 is provided on the fourth source-side select gate SGS3; the second source-side select gate SGS1 is provided on the third source-side select gate SGS2; and the first source-side select gate SGS0 is provided on the second source-side select gate SGS1.

The insulating layer 72 is provided between the bottom select gate SGSB and the source layer SL and between the select gates.

As shown in FIG. 20, the memory strings of the first to sixth string units SU0 to SU5 each include the first source-side select transistor STS0 having the first source-side select gate SGS0 as a control gate, the second source-side select transistor STS1 having the second source-side select gate SGS1 as a control gate, the third source-side select transistor STS2 having the third source-side select gate SGS2 as a control gate, the fourth source-side select transistor STS3 having the fourth source-side select gate SGS3 as a control gate, and the bottom select transistor STSB having the bottom select gate SGSB as a control gate.

In one memory string of each string unit, the five source-side select transistors recited above are connected in series between the source layer SL and the memory cells MC.

The first source-side select transistor STS0 and the second source-side select transistor STS1 of the first string unit SU0 are transistors of the depletion type; and the third source-side select transistor STS2 and the fourth source-side select transistor STS3 of the first string unit SU0 are transistors of the enhancement type.

The first source-side select transistor STS0 and the third source-side select transistor STS2 of the second string unit SU1 are transistors of the depletion type; and the second source-side select transistor STS1 and the fourth source-side select transistor STS3 of the second string unit SU1 are transistors of the enhancement type.

The first source-side select transistor STS0 and the fourth source-side select transistor STS3 of the third string unit SU2 are transistors of the depletion type; and the second source-side select transistor STS1 and the third source-side select transistor STS2 of the third string unit SU2 are transistors of the enhancement type.

The second source-side select transistor STS1 and the third source-side select transistor STS2 of the fourth string unit SU3 are transistors of the depletion type; and the first source-side select transistor STS0 and the fourth source-side select transistor STS3 of the fourth string unit SU3 are transistors of the enhancement type.

The second source-side select transistor STS1 and the fourth source-side select transistor STS3 of the fifth string unit SU4 are transistors of the depletion type; and the first source-side select transistor STS0 and the third source-side select transistor STS2 of the fifth string unit SU4 are transistors of the enhancement type.

The third source-side select transistor STS2 and the fourth source-side select transistor STS3 of the sixth string unit SU5 are transistors of the depletion type; and the first source-side select transistor STS0 and the second source-side select transistor STS1 of the sixth string unit SU5 are transistors of the enhancement type.

FIG. 22C is a figure (a table) illustrating the potential controls of the source-side select gates of the semiconductor memory device shown in FIGS. 20 and 21.

In FIG. 22C, "L" and "H" illustrate the potentials applied to the source-side select gates; and the "L" level (the first level) is a potential that is higher than the threshold voltage of the transistor of the depletion type and lower than the threshold voltage of the transistor of the enhancement type. The "L" level is, for example, 0 V. The "H" level (the second level) is a positive potential that is higher than the threshold voltage of the transistor of the enhancement type.

Any one of the string units of the first to sixth string units SU0 to SU5 inside one block 200 is selected by the source-side select transistors STS0, STS1, STS2, STS3, and STSB.

When the first string unit SU0 is selected, the bottom select transistor STSB is set to ON. Further, the "L" level is applied to the first source-side select gate SGS0 and the second source-side select gate SGS1; and the first source-side select transistor STS0 and the second source-side select transistor STS1 of the first string unit SU0 are set to ON. Further, the "H" level is applied to the third source-side select gate SGS2 and the fourth source-side select gate SGS3; and the third source-side select transistor STS2 and the fourth source-side select transistor STS3 of the first string unit SU0 also are set to ON.

The semiconductor bodies 20 of the selected first string unit SU0 are electrically connected to the source layer SL.

The source-side select transistor of the enhancement type is set to OFF by the "L" level applied to the first source-side select gate SGS0 and the second source-side select gate SGS1 for the second to sixth string units SU1 to SU5. Accordingly, the semiconductor bodies 20 of the unselected second to sixth string units SU1 to SU5 are not electrically connected to the source layer SL.

When the read operation is executed for the memory cells of the first string unit SU0, the potentials of the semiconductor bodies 20 of the selected first string unit SU0 are set to the potential of the source layer SL. At this time, the semiconductor bodies 20 of the unselected second to sixth string units SU1 to SU5 which are in the same block 200 as the first string unit SU0 are not connected to the source layer SL; and the voltage stress (the read disturbance) in the read operation applied to the memory cells of the second to sixth string units SU1 to SU5 can be suppressed.

When the second string unit SU1 is selected, the bottom select transistor STSB is set to ON. Further, the "L" level is applied to the first source-side select gate SGS0 and the third source-side select gate SGS2; and the first source-side select transistor STS0 and the third source-side select transistor STS2 of the second string unit SU1 are set to ON. Further, the "H" level is applied to the second source-side select gate SGS1 and the fourth source-side select gate SGS3; and the second source-side select transistor STS1 and the fourth source-side select transistor STS3 of the second string unit SU1 also are set to ON.

The semiconductor bodies 20 of the selected second string unit SU1 are electrically connected to the source layer SL.

The source-side select transistor of the enhancement type is set to OFF by the "L" level applied to the first source-side select gate SGS0 and the third source-side select gate SGS2 for the string units other than the second string unit SU1. Accordingly, the semiconductor bodies 20 of the unselected string units other than the second string unit SU1 are not electrically connected to the source layer SL.

When the read operation is executed for the memory cells of the second string unit SU1, the potentials of the semiconductor bodies 20 of the selected second string unit SU1 are set to the potential of the source layer SL. At this time, the semiconductor bodies 20 of the unselected string units that are in the same block 200 as the second string unit SU1 are not connected to the source layer SL; and the voltage stress (the read disturbance) in the read operation applied to the memory cells of the unselected string units can be suppressed.

When the third string unit SU2 is selected, the bottom select transistor STSB is set to ON. Further, the "L" level is applied to the first source-side select gate SGS0 and the fourth source-side select gate SGS3; and the first source-side select transistor STS0 and the fourth source-side select transistor STS3 of the third string unit SU2 are set to ON. Further, the "H" level is applied to the second source-side select gate SGS1 and the third source-side select gate SGS2; and the second source-side select transistor STS1 and the third source-side select transistor STS2 of the third string unit SU2 also are set to ON.

The semiconductor bodies 20 of the selected third string unit SU2 are electrically connected to the source layer SL.

The source-side select transistor of the enhancement type is set to OFF by the "L" level applied to the first source-side select gate SGS0 and the fourth source-side select gate SGS3 for the string units other than the third string unit SU2. Accordingly, the semiconductor bodies 20 of the unselected string units other than the third string unit SU2 are not electrically connected to the source layer SL.

When the read operation is executed for the memory cells of the third string unit SU2, the potentials of the semiconductor bodies 20 of the selected third string unit SU2 are set to the potential of the source layer SL. At this time, the semiconductor bodies 20 of the unselected string units that are in the same block 200 as the third string unit SU2 are not connected to the source layer SL; and the voltage stress (the read disturbance) in the read operation applied to the memory cells of the unselected string units can be suppressed.

When the fourth string unit SU3 is selected, the bottom select transistor STSB is set to ON. Further, the "L" level is applied to the second source-side select gate SGS1 and the third source-side select gate SGS2; and the second source-side select transistor STS1 and the third source-side select transistor STS2 of the fourth string unit SU3 are set to ON. Further, the "H" level is applied to the first source-side select gate SGS0 and the fourth source-side select gate SGS3; and the first source-side select transistor STS0 and the fourth source-side select transistor STS3 of the fourth string unit SU3 also are set to ON.

The semiconductor bodies 20 of the selected fourth string unit SU3 are electrically connected to the source layer SL.

The source-side select transistor of the enhancement type is set to OFF by the "L" level applied to the second source-side select gate SGS1 and the third source-side select gate SGS2 for the string units other than the fourth string unit SU3. Accordingly, the semiconductor bodies 20 of the unselected string units other than the fourth string unit SU3 are not electrically connected to the source layer SL.

When the read operation is executed for the memory cells of the fourth string unit SU3, the potentials of the semiconductor bodies 20 of the selected fourth string unit SU3 are set to the potential of the source layer SL. At this time, the semiconductor bodies 20 of the unselected string units that are in the same block 200 as the fourth string unit SU3 are not connected to the source layer SL; and the voltage stress (the read disturbance) in the read operation applied to the memory cells of the unselected string units can be suppressed.

When the fifth string unit SU4 is selected, the bottom select transistor STSB is set to ON. Further, the "L" level is applied to the second source-side select gate SGS1 and the fourth source-side select gate SGS3; and the second source-side select transistor STS1 and the fourth source-side select transistor STS3 of the fifth string unit SU4 are set to ON. Further, the "H" level is applied to the first source-side select gate SGS0 and the third source-side select gate SGS2; and the first source-side select transistor STS0 and the third source-side select transistor STS2 of the fifth string unit SU4 also are set to ON.

The semiconductor bodies 20 of the selected fifth string unit SU4 are electrically connected to the source layer SL.

The source-side select transistor of the enhancement type is set to OFF by the "L" level applied to the second source-side select gate SGS1 and the fourth source-side select gate SGS3 for the string units other than the fifth string unit SU4. Accordingly, the semiconductor bodies 20 of the unselected string units other than the fifth string unit SU4 are not electrically connected to the source layer SL.

When the read operation is executed for the memory cells of the fifth string unit SU4, the potentials of the semiconductor bodies 20 of the selected fifth string unit SU4 are set to the potential of the source layer SL. At this time, the semiconductor bodies 20 of the unselected string units that are in the same block 200 as the fifth string unit SU4 are not connected to the source layer SL; and the voltage stress (the read disturbance) in the read operation applied to the memory cells of the unselected string units can be suppressed.

When the sixth string unit SU5 is selected, the bottom select transistor STSB is set to ON. Further, the "L" level is applied to the third source-side select gate SGS2 and the fourth source-side select gate SGS3; and the third source-side select transistor STS2 and the fourth source-side select transistor STS3 of the sixth string unit SU5 are set to ON. Further, the "H" level is applied to the first source-side select gate SGS0 and the second source-side select gate SGS1; and the first source-side select transistor STS0 and the second source-side select transistor STS1 of the sixth string unit SU5 also are set to ON.

The semiconductor bodies 20 of the selected sixth string unit SU5 are electrically connected to the source layer SL.

The source-side select transistor of the enhancement type is set to OFF by the "L" level applied to the third source-side select gate SGS2 and the fourth source-side select gate SGS3 for the string units other than the sixth string unit SU5. Accordingly, the semiconductor bodies 20 of the unselected string units other than the sixth string unit SU5 are not electrically connected to the source layer SL.

When the read operation is executed for the memory cells of the sixth string unit SU5, the potentials of the semiconductor bodies 20 of the selected sixth string unit SU5 are set to the potential of the source layer SL. At this time, the semiconductor bodies 20 of the unselected string units that are in the same block 200 as the sixth string unit SU5 are not connected to the source layer SL; and the voltage stress (the read disturbance) in the read operation applied to the memory cells of the unselected string units can be suppressed.

The source-side select transistor has a structure similar to that of the memory cell. In other words, the source-side select transistor includes the semiconductor body 20, the source-side select gate, and the memory film 30 including the charge storage film 32 provided between the semiconductor body 20 and the source-side select gate.

After forming the memory cell array, the erase operation (the injection of holes into the charge storage film 32) is executed collectively for all of the source-side select transistors inside the same block 200; and the source-side select transistors are set to the depletion type.

Subsequently, the program operation (the storing of electrons in the charge storage film 32) is executed for the source-side select transistors to be set to the enhancement type; and the programmed source-side select transistors are set to the enhancement type. At this time, the selection of the string unit is performed by the drain-side select gates.

In the second embodiment, the number of string units disposed inside one block 200 subdivided by the separation portions 60 (the slits ST) may be 7 or more. The number of string units and the number of layers of source-side select gates (other than the bottom gate) can be specified as follows.

Namely, the semiconductor memory device of the second embodiment includes k layers of source-side select gates (k being a natural number of 3 or more) and the first to nth string units (n being a natural number of 3 or more) that each include multiple memory strings. The memory strings each include a select transistor of the depletion type and a select transistor of the enhancement type connected in series to each other.

Among the first to nth string units, one string unit is selected and the other string units are unselected by setting the source-side select gates connected to the source-side select transistors of the depletion type included in the one string unit to the first level and by setting the source-side select gates connected to the source-side select transistors of the enhancement type to the second level.

Among the k layers of the source-side select gates, one string unit is selected and the other string units are unselected by setting the h layers of the select gates to the first level and by setting the (k−h) layers of the select gates to the second level. n is a number of not more than $k!/((k-h)! \times h!)$.

The structure and the method for controlling the drain-side select transistor of the first embodiment are applicable to the drain-side select transistor of the second embodiment.

In the second embodiment, the two ends in the Y-direction of the drain-side select gate contact the separation portion 62a and do not contact the separation portions 60 (the slits ST) for each of the drain-side select gates SGD1 and SGD2 shown in FIG. 19 and the drain-side select gates SGD1, SGD2, SGD3, and SGD4 shown in FIG. 21.

The select gates and the word lines WL are formed by, for example, filling tungsten into the gap between the insulating layers 72 from the slit ST side and by subsequently dividing the drain-side select gate in the Y-direction by the separation portion 62a.

A wide width of the portion between the slit ST and the columnar portions CL of the drain-side select gate adjacent to the slit ST is easily ensured. On the other hand, the width of the portion of the drain-side select gate not adjacent to the slit ST between the separation portion 62a and the columnar portions CL easily can be narrower than the width of the portion between the slit ST and the columnar portions CL of the drain-side select gate adjacent to the slit ST. Accordingly, the resistance of the drain-side select gate not adjacent to the slit ST easily can be higher than the resistance of the drain-side select gate adjacent to the slit ST. This may increase the time constant of the drain-side select gate not adjacent to the slit ST and delay the access time.

Figure 24:
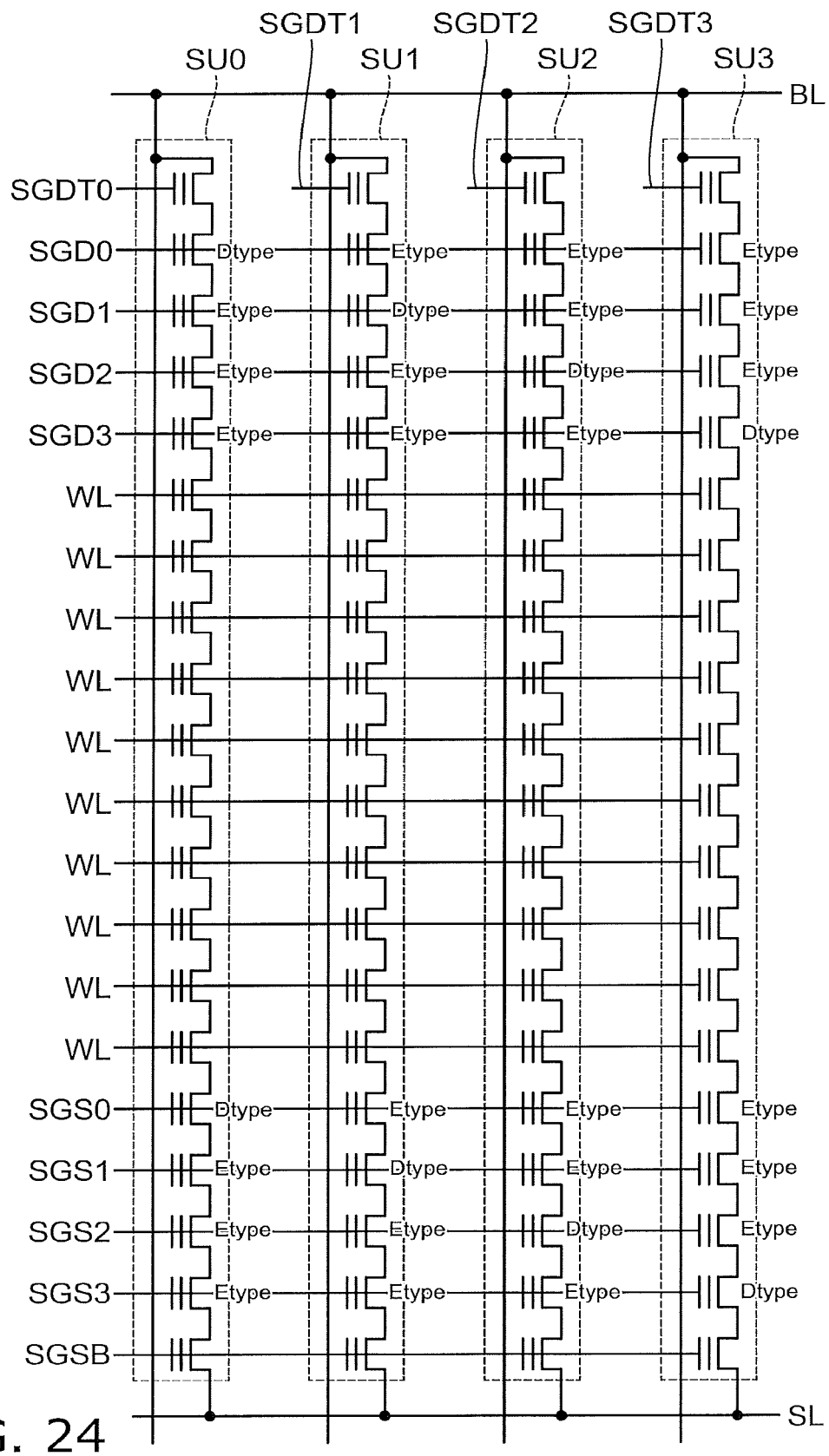
FIG. 24 is a circuit diagram of a semiconductor memory device of a third embodiment.
Figure 25:
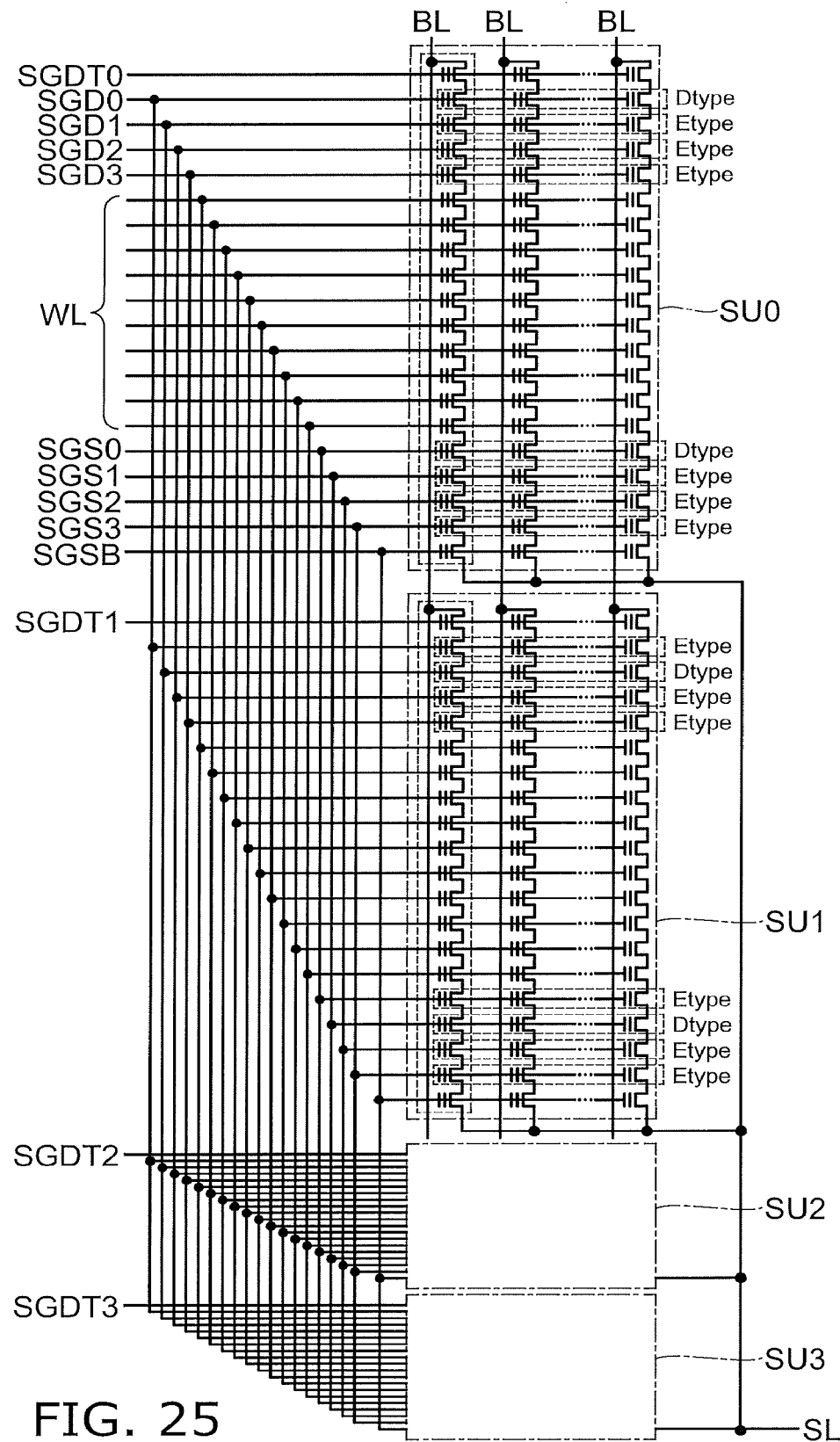
FIG. 25 is a circuit diagram of the semiconductor memory device of the third embodiment.

FIG. 24 and FIG. 25 are circuit diagrams of a semiconductor memory device of a third embodiment.

Figure 26:
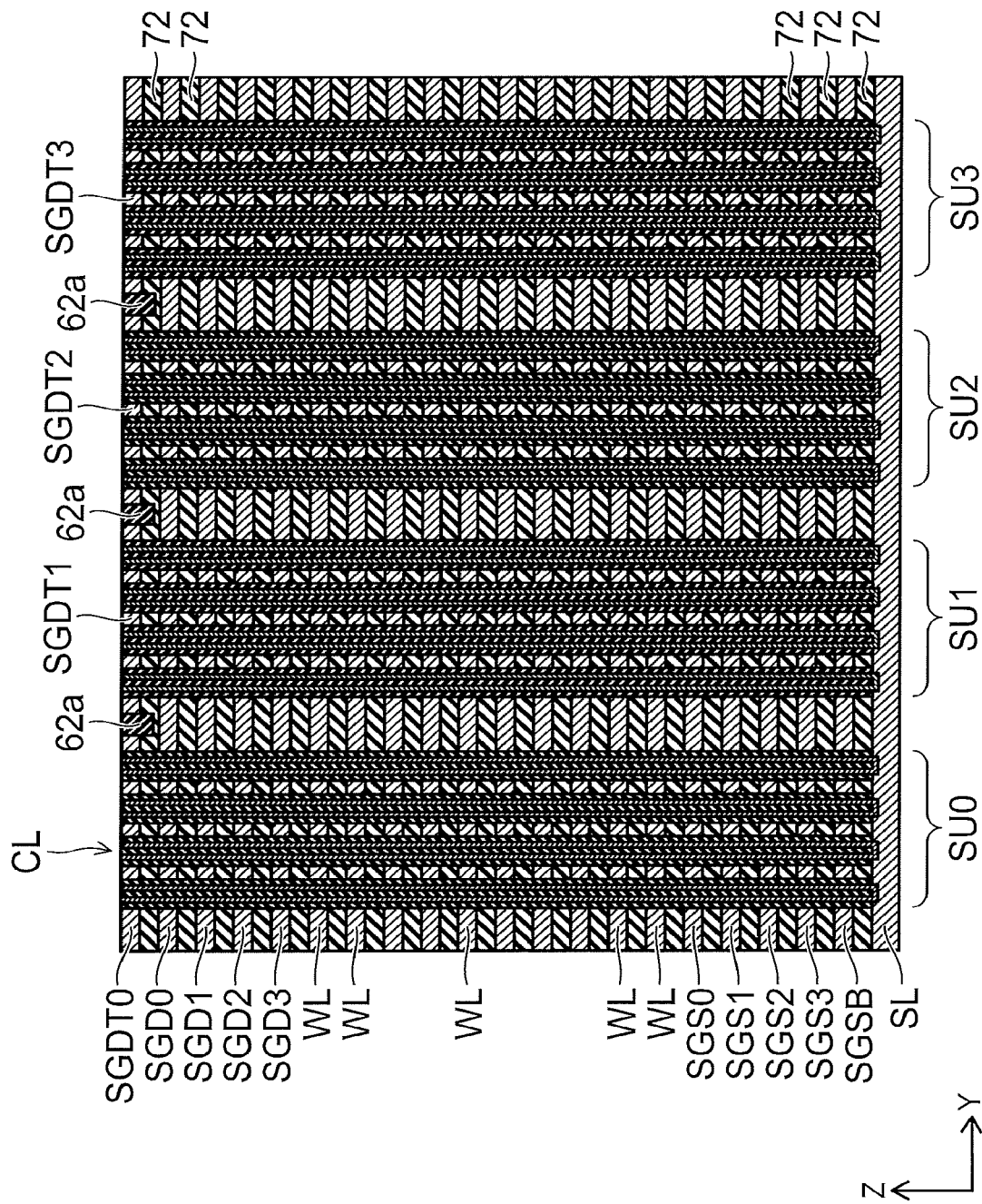
FIG. 26 is a schematic cross-sectional view of the semiconductor memory device of the third embodiment.

FIG. 26 is a schematic cross-sectional view of the semiconductor memory device of the third embodiment.

FIG. 34A is a table illustrating the potential controls of the drain-side select gates SGD0 to SGD3 and the source-side select gates SGS0 to SGS3 of the semiconductor memory device shown in FIGS. 24 to 26.

Similarly to the embodiments described above, the D-type shown in FIG. 24 and FIG. 25 illustrates the transistor of the depletion type; and the E-type illustrates the transistor of the enhancement type. The D-type and the E-type in FIG. 27 and subsequent figures are defined similarly.

The "L" level and the "H" level shown in FIG. 34A are defined similarly to the embodiments described above. The "L" level and the "H" level of FIGS. 34B to 34D also are defined similarly.

In the third embodiment, multiple layers of the drain-side select gates SGD0 to SGD3 are provided also on the drain side similarly to the source side. The drain-side select gate layer that is provided in the uppermost layer is divided into the four drain-side select gates SGDT0, SGDT1, SGDT2, and SGDT3 by the separation portion 62a.

The string unit SU0 includes the drain-side select transistor of the depletion type having the drain-side select gate SGD0 as a control gate, the drain-side select transistor of the enhancement type having the drain-side select gate SGD1 as a control gate, the drain-side select transistor of the enhancement type having the drain-side select gate SGD2 as a control gate, and the drain-side select transistor of the enhancement type having the drain-side select gate SGD3 as a control gate.

The string unit SU1 includes the drain-side select transistor of the enhancement type having the drain-side select gate SGD0 as a control gate, the drain-side select transistor of the depletion type having the drain-side select gate SGD1 as a control gate, the drain-side select transistor of the enhancement type having the drain-side select gate SGD2 as a control gate, and the drain-side select transistor of the enhancement type having the drain-side select gate SGD3 as a control gate.

The string unit SU2 includes the drain-side select transistor of the enhancement type having the drain-side select gate SGD0 as a control gate, the drain-side select transistor of the enhancement type having the drain-side select gate SGD1 as a control gate, the drain-side select transistor of the depletion type having the drain-side select gate SGD2 as a control gate, and the drain-side select transistor of the enhancement type having the drain-side select gate SGD3 as a control gate.

The string unit SU3 includes the drain-side select transistor of the enhancement type having the drain-side select gate SGD0 as a control gate, the drain-side select transistor of the enhancement type having the drain-side select gate SGD1 as a control gate, the drain-side select transistor of the enhancement type having the drain-side select gate SGD2 as a control gate, and the drain-side select transistor of the depletion type having the drain-side select gate SGD3 as a control gate.

The string units SU0 to SU3 each are selected by the "L" level or the "H" level being applied to the select gates as shown in FIG. 34A.

Similarly to the embodiments described above, for example, the thresholds of the select transistors are preset to the enhancement type or the depletion type by performing the erase operation and/or the program operation for the select transistors when testing in die sorting or the like before shipping. The selection of the string units SU0 to SU3 when programming is performed by the drain-side select gates SGDT0, SGDT1, SGDT2, and SGDT3 divided by the separation portion 62a.

When used by a user, one string unit is selected by applying, to the drain-side select gates SGDT0, SGDT1, SGDT2, and SGDT3, prescribed voltages that set the drain-side select transistors having the drain-side select gates SGDT0, SGDT1, SGDT2, and SGDT3 as control gates to ON, and by applying prescribed voltages to the drain-side select gates SGD0 to SGD3.

Because the drain-side select gates SGDT1 and SGDT2 are not adjacent to the slit ST, the time constant may increase and the access time may be delayed. However, because the select operations that use the drain-side select gates SGDT1 and SGDT2 are only when programming when die sorting to set the transistors having the drain-side select gates SGD0 to SGD3 as control gates to the enhancement type, the access time is not a problem.

Normally, when used by the user, the drain-side select gates SGDT0, SGDT1, SGDT2, and SGDT3 are constantly ON; and one string unit is selected by the drain-side select gates SGD0 to SGD3; therefore, high-speed access is possible.

Figure 27:
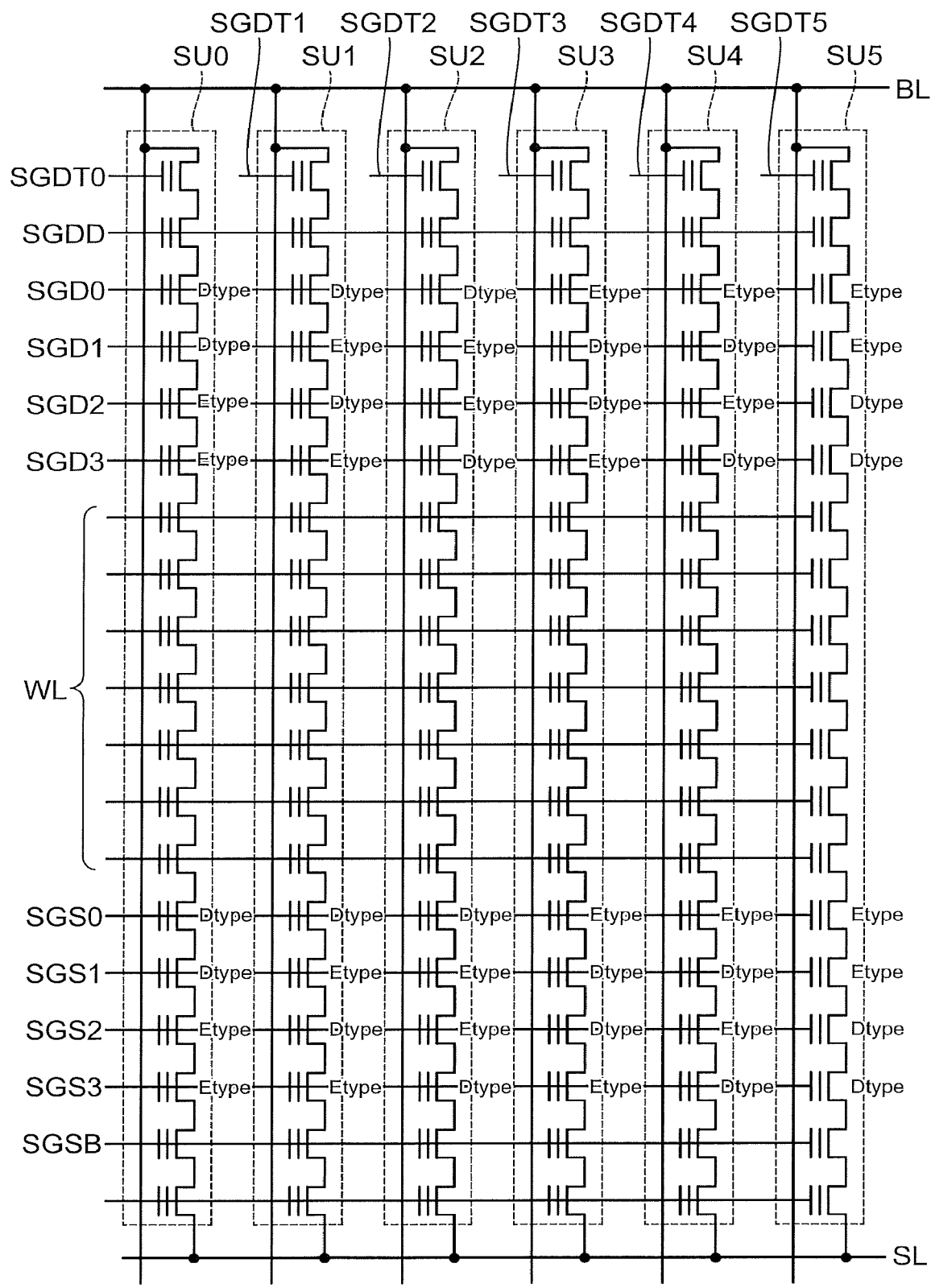
FIG. 27 is a circuit diagram of the semiconductor memory device of the third embodiment.

FIG. 27 is a circuit diagram of another example of the semiconductor memory device of the third embodiment.

Figure 28:
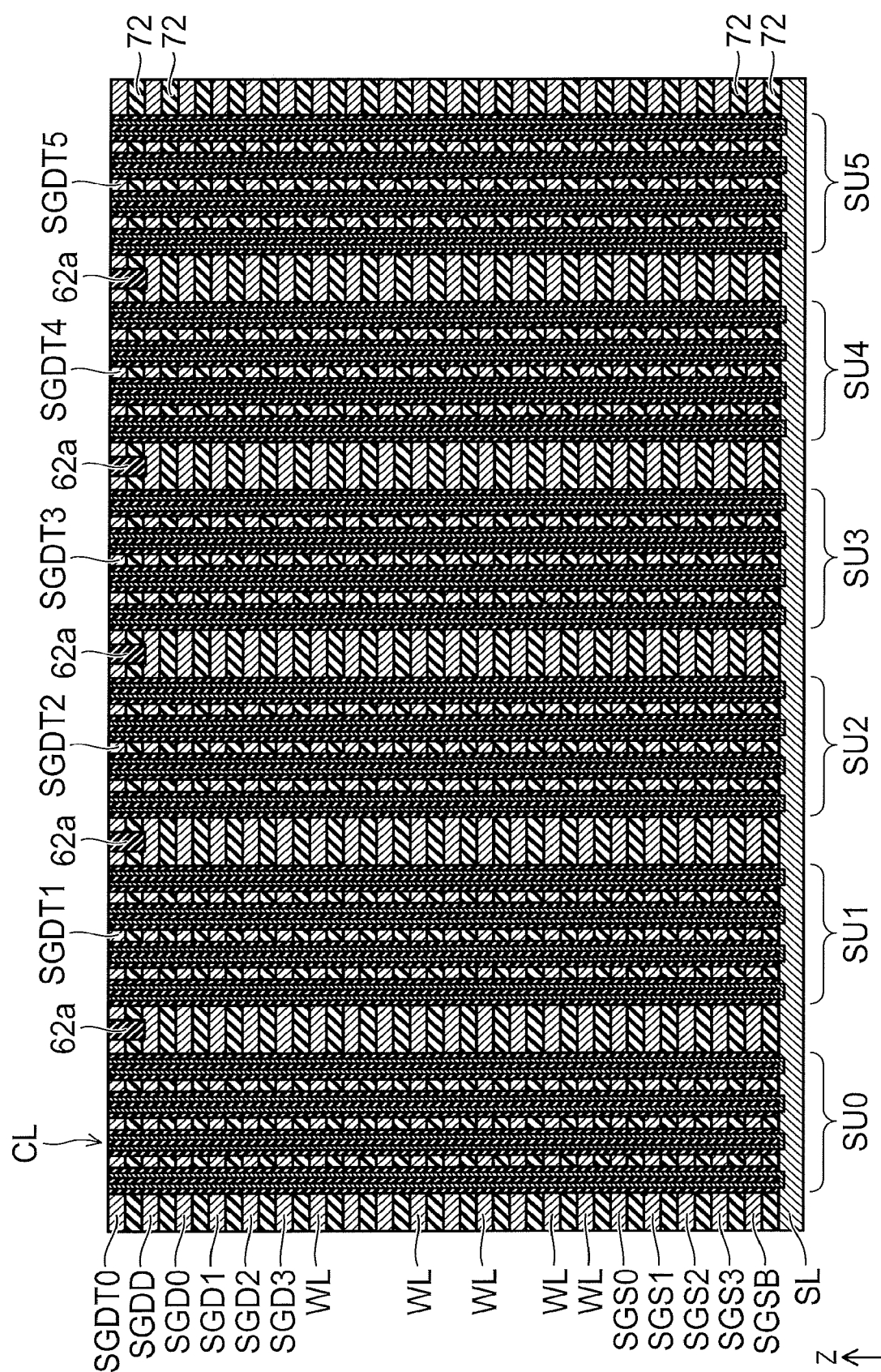
FIG. 28 is a schematic cross-sectional view of the semiconductor memory device of the third embodiment.

FIG. 28 is a schematic cross-sectional view of the other example of the semiconductor memory device of the third embodiment.

FIG. 34B is a table illustrating the potential controls of the drain-side select gates SGD0 to SGD3 and the source-side select gates SGS0 to SGS3 of the semiconductor memory device shown in FIG. 27 and FIG. 28.

In the example as well, multiple layers of the drain-side select gates SGD0 to SGD3 are provided on the drain side. The drain-side select gate layer that is provided in the uppermost layer is divided into the six drain-side select gates SGDT0, SGDT1, SGDT2, SGDT3, SGDT4, and SGDT5 by the separation portion 62a. Also, a dummy gate SGDD may be provided between the drain-side select gate SGD0 and the drain-side select gates SGDT0 to SGDT5.

The string unit SU0 includes a drain-side select transistor of the depletion type having the drain-side select gate SGD0 as a control gate, a drain-side select transistor of the depletion type having the drain-side select gate SGD1 as a control gate, a drain-side select transistor of the enhancement type having the drain-side select gate SGD2 as a control gate, and a drain-side select transistor of the enhancement type having the drain-side select gate SGD3 as a control gate.

The string unit SU1 includes a drain-side select transistor of the depletion type having the drain-side select gate SGD0 as a control gate, a drain-side select transistor of the enhancement type having the drain-side select gate SGD1 as a control gate, a drain-side select transistor of the depletion type having the drain-side select gate SGD2 as a control gate, and a drain-side select transistor of the enhancement type having the drain-side select gate SGD3 as a control gate.

The string unit SU2 includes a drain-side select transistor of the depletion type having the drain-side select gate SGD0 as a control gate, a drain-side select transistor of the enhancement type having the drain-side select gate SGD1 as a control gate, a drain-side select transistor of the enhancement type having the drain-side select gate SGD2 as a control gate, and a drain-side select transistor of the depletion type having the drain-side select gate SGD3 as a control gate.

The string unit SU3 includes a drain-side select transistor of the enhancement type having the drain-side select gate SGD0 as a control gate, a drain-side select transistor of the depletion type having the drain-side select gate SGD1 as a control gate, a drain-side select transistor of the depletion type having the drain-side select gate SGD2 as a control gate, and a drain-side select transistor of the enhancement type having the drain-side select gate SGD3 as a control gate.

The string unit SU4 includes a drain-side select transistor of the enhancement type having the drain-side select gate SGD0 as a control gate, a drain-side select transistor of the depletion type having the drain-side select gate SGD1 as a control gate, a drain-side select transistor of the enhancement type having the drain-side select gate SGD2 as a control gate, and a drain-side select transistor of the depletion type having the drain-side select gate SGD3 as a control gate.

The string unit SU5 includes a drain-side select transistor of the enhancement type having the drain-side select gate SGD0 as a control gate, a drain-side select transistor of the enhancement type having the drain-side select gate SGD1 as a control gate, a drain-side select transistor of the depletion type having the drain-side select gate SGD2 as a control gate, and a drain-side select transistor of the depletion type having the drain-side select gate SGD3 as a control gate.

As shown in FIG. 34B, the string units SU0 to SU5 each are selected by the "L" level or the "H" level being applied to the drain-side select gates SGD0 to SGD3. The levels shown in FIG. 34A are applied to the source-side select gates SGS0 to SGS3. When the "L" voltage is applied to the select gate, the transistor of the depletion type is set to ON and the transistor of the enhancement type is set to OFF; and when the "H" voltage is applied to the select gate, the transistors of the depletion type and the enhancement type each are set to ON; thereby, one string unit is selected.

Similarly to the embodiments described above, for example, the thresholds of the select transistors are preset to the enhancement type or the depletion type by the erase operation and/or the program operation for the select transistors when testing in the die sorting or the like before shipping. The selection of the string units SU0 to SU5 when programming is performed by the drain-side select gates SGDT0 to SGDT5 divided by the separation portion 62a.

When used by the user, one string unit is selected by applying, to the drain-side select gates SGDT0 to SGDT5, prescribed voltages that set the drain-side select transistors having the drain-side select gates SGDT0 to SGDT5 as control gates to ON, and by applying prescribed voltages to the drain-side select gates SGD0 to SGD3.

Because the drain-side select gates SGDT1 to SGDT4 are not adjacent to the slit ST, the time constant may increase and the access time may be delayed. However, because the select operations that use the drain-side select gates SGDT1 to SGDT4 are only when programming when die sorting to set the transistors having the drain-side select gates SGD0 to SGD3 as control gates to the enhancement type, the access time is not a problem.

Normally, when used by the user, the drain-side select gates SGDT0 to SGDT5 are constantly ON; and one string unit is selected by the drain-side select gates SGD0 to SGD3; therefore, high-speed access is possible.

Figure 29:
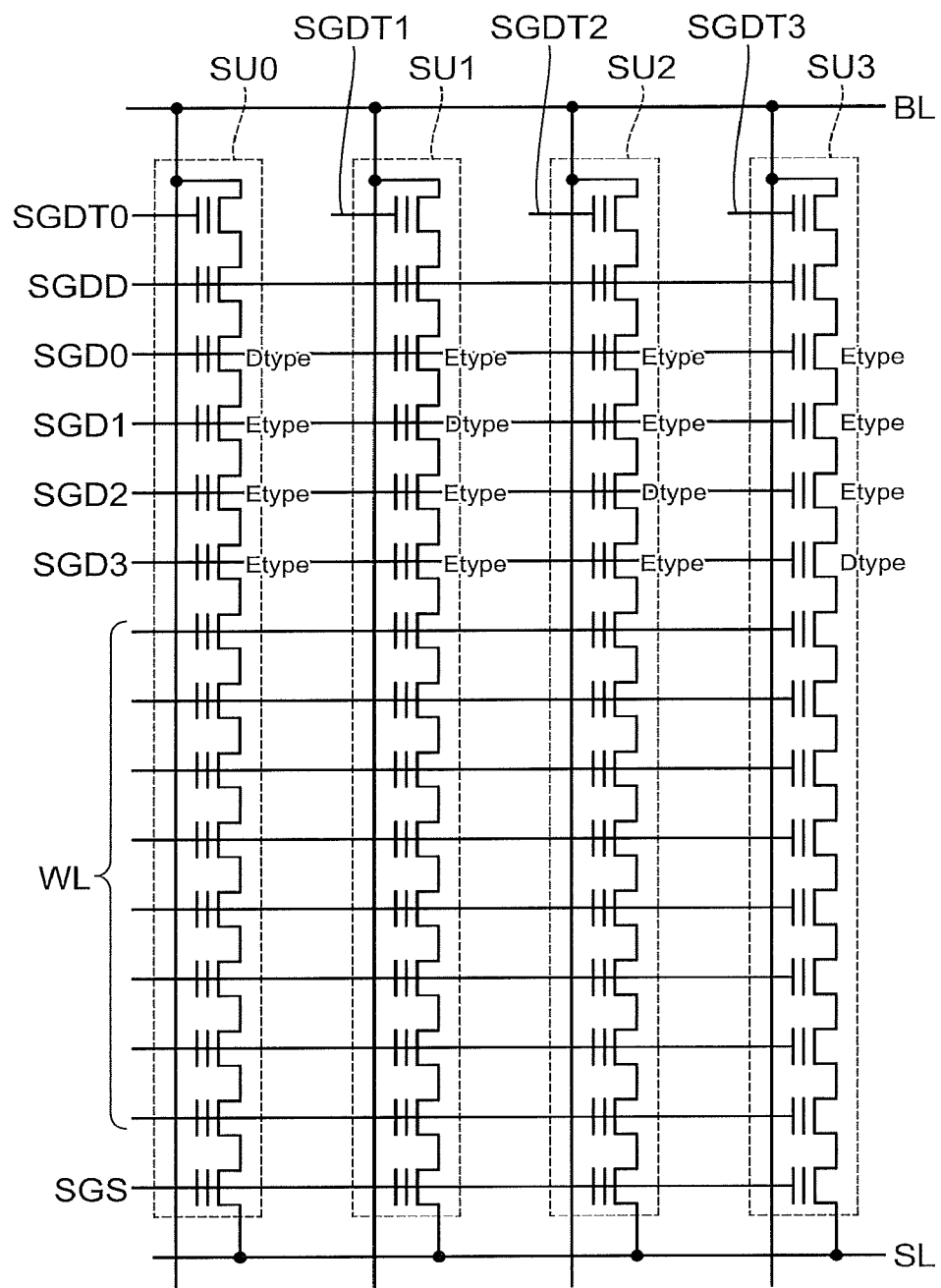
FIG. 29 is a circuit diagram of a semiconductor memory device of a fourth embodiment.
Figure 30:
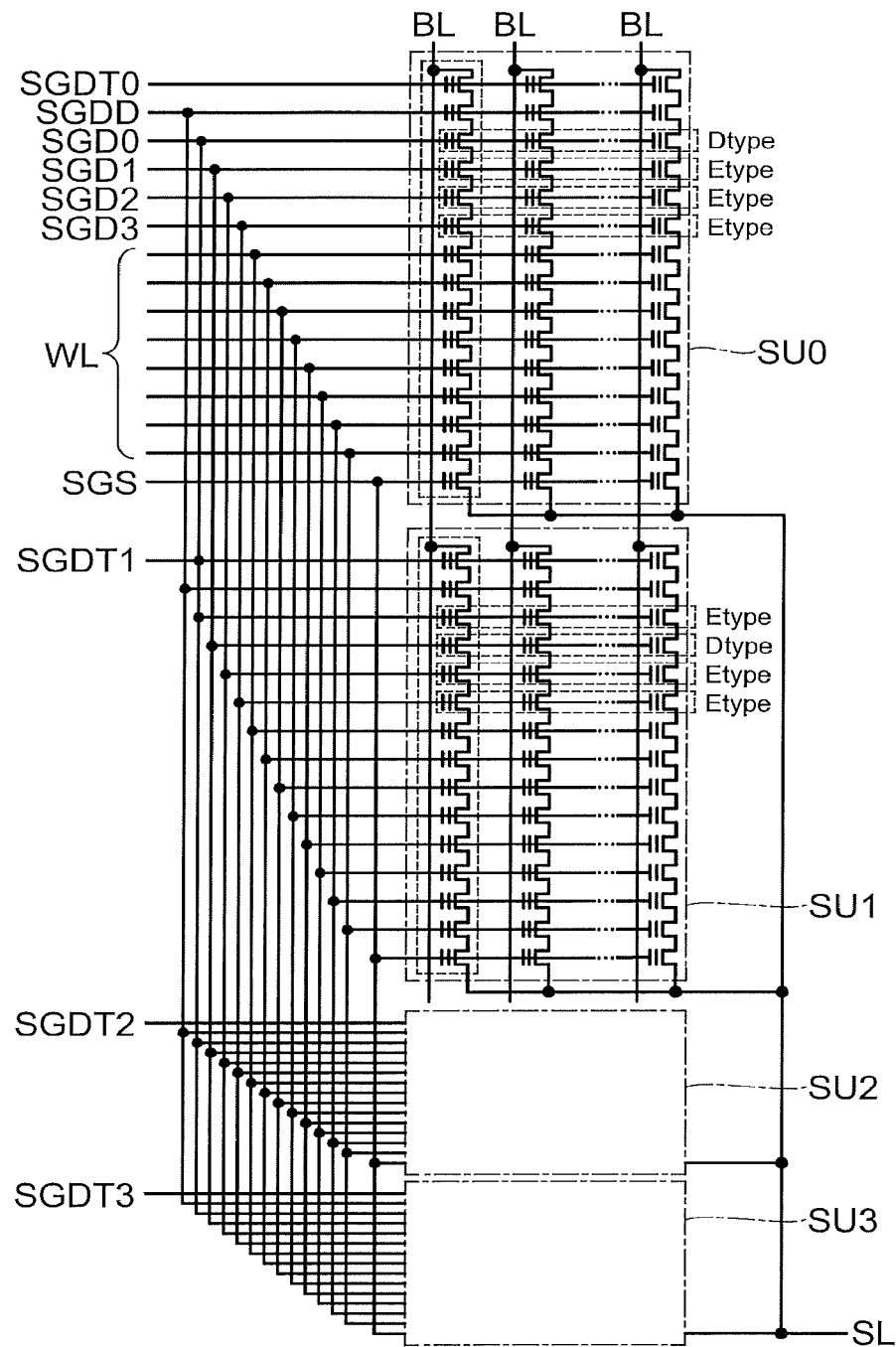
FIG. 30 is a circuit diagram of the semiconductor memory device of the fourth embodiment.

FIG. 29 and FIG. 30 are circuit diagrams of a semiconductor memory device of a fourth embodiment.

Figure 31:
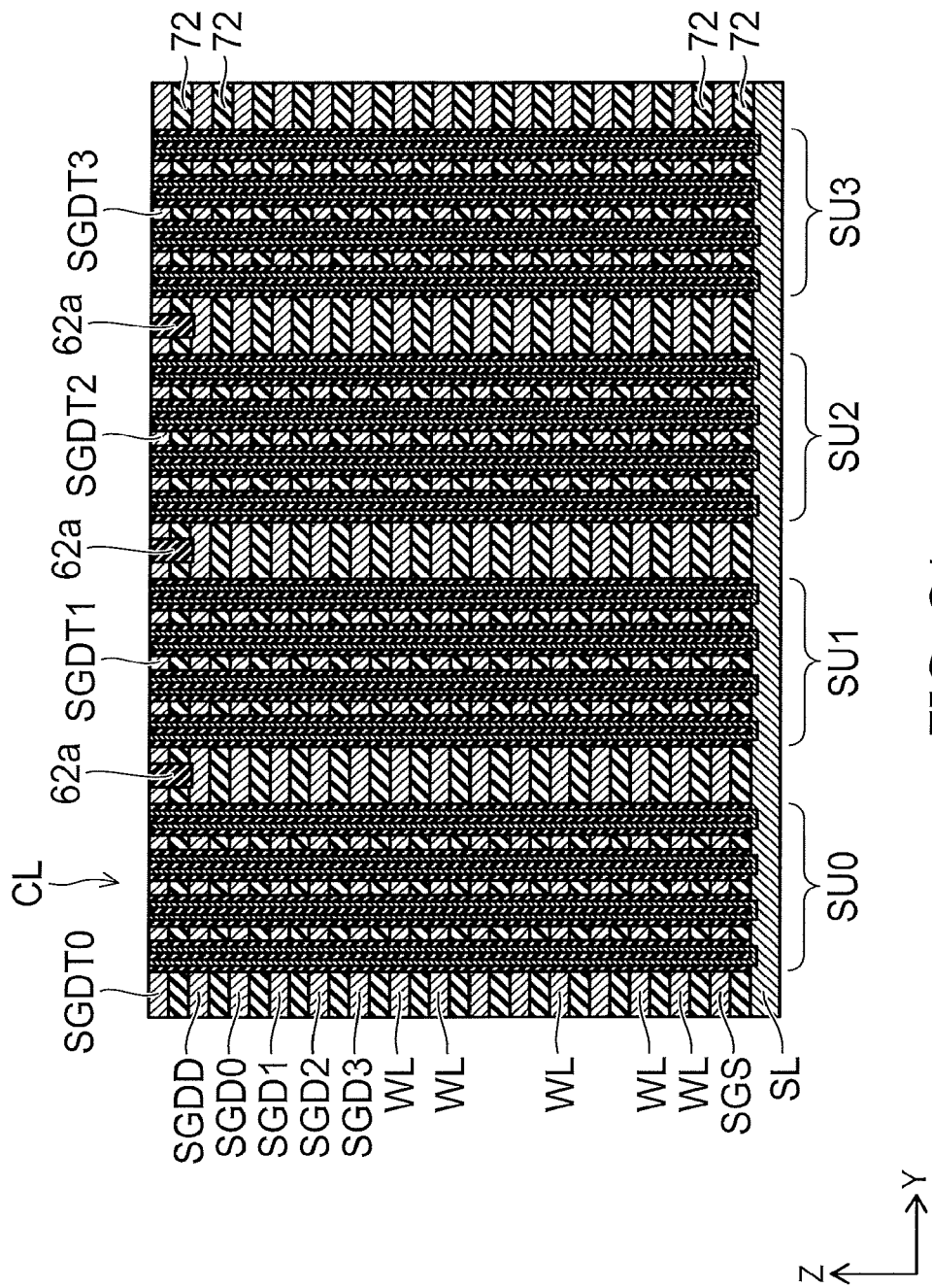
FIG. 31 is a schematic cross-sectional view of the semiconductor memory device of the fourth embodiment.

FIG. 31 is a schematic cross-sectional view of the semiconductor memory device of the fourth embodiment.

FIG. 34C is a table illustrating potential controls of the drain-side select gates SGD0 to SGD3 of the semiconductor memory device shown in FIG. 29 to FIG. 31.

Other than using one layer of the source-side select gates SGS on the source side, the fourth embodiment is the same as the third embodiment recited above.

The string unit SU0 includes a drain-side select transistor of the depletion type having the drain-side select gate SGD0 as a control gate, a drain-side select transistor of the enhancement type having the drain-side select gate SGD1 as a control gate, a drain-side select transistor of the enhancement type having the drain-side select gate SGD2 as a control gate, and a drain-side select transistor of the enhancement type having the drain-side select gate SGD3 as a control gate.

The string unit SU1 includes a drain-side select transistor of the enhancement type having the drain-side select gate SGD0 as a control gate, a drain-side select transistor of the depletion type having the drain-side select gate SGD1 as a control gate, a drain-side select transistor of the enhancement type having the drain-side select gate SGD2 as a control gate, and a drain-side select transistor of the enhancement type having the drain-side select gate SGD3 as a control gate.

The string unit SU2 includes a drain-side select transistor of the enhancement type having the drain-side select gate SGD0 as a control gate, a drain-side select transistor of the enhancement type having the drain-side select gate SGD1 as a control gate, a drain-side select transistor of the depletion type having the drain-side select gate SGD2 as a control gate, and a drain-side select transistor of the enhancement type having the drain-side select gate SGD3 as a control gate.

The string unit SU3 includes a drain-side select transistor of the enhancement type having the drain-side select gate SGD0 as a control gate, a drain-side select transistor of the enhancement type having the drain-side select gate SGD1 as a control gate, a drain-side select transistor of the enhancement type having the drain-side select gate SGD2 as a control gate, and a drain-side select transistor of the depletion type having the drain-side select gate SGD3 as a control gate.

The string units SU0 to SU3 each are selected by the "L" level or the "H" level being applied to the select gates as shown in FIG. 34C.

Similarly to the embodiments described above, for example, the thresholds of the select transistors are preset to the enhancement type or the depletion type by the erase operation and/or the program operation for the select transistors when testing in the die sorting or the like before shipping.

The selection of the string units SU0 to SU3 when programming is performed by the drain-side select gates SGDT0, SGDT1, SGDT2, and SGDT3 divided by the separation portion 62a.

When used by the user, one string unit is selected by applying, to the drain-side select gates SGDT0, SGDT1, SGDT2, and SGDT3, prescribed voltages that set the drain-side select transistors having the drain-side select gates SGDT0, SGDT1, SGDT2, and SGDT3 as control gates to ON, and by applying prescribed voltages to the drain-side select gates SGD0 to SGD3.

Because the drain-side select gates SGDT1 and SGDT2 are not adjacent to the slit ST, the time constant may increase and the access time may be delayed. However, because the select operations that use the drain-side select gates SGDT1 and SGDT2 are only when programming when die sorting to set the transistors having the drain-side select gates SGD0 to SGD3 as control gates to the enhancement type, the access time is not a problem.

Normally, when used by the user, the drain-side select gates SGDT0, SGDT1, SGDT2, and SGDT3 are constantly ON; and one string unit is selected by the drain-side select gates SGD0 to SGD3; therefore, high-speed access is possible.

Figure 32:
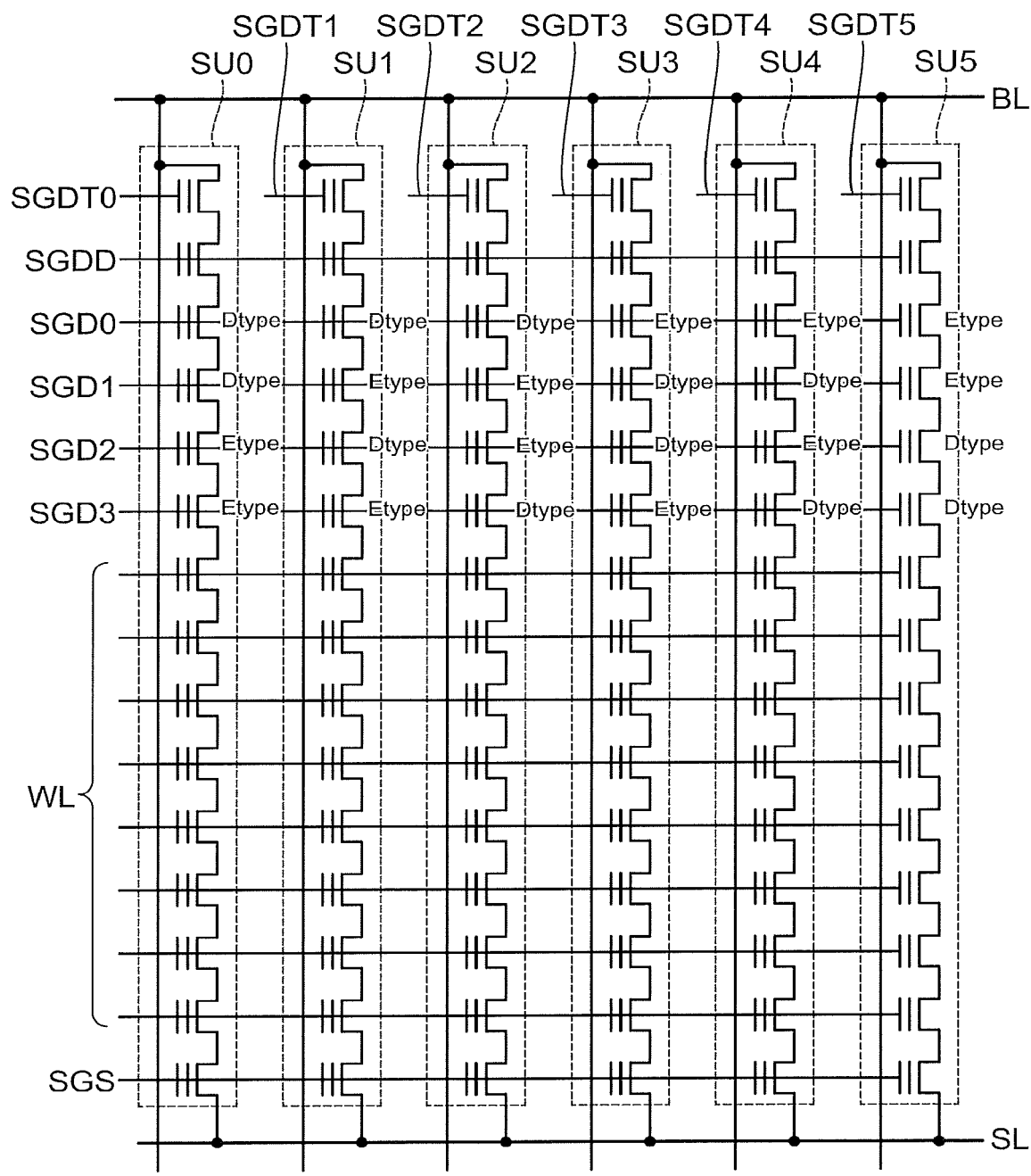
FIG. 32 is a circuit diagram of the semiconductor memory device of the fourth embodiment.

FIG. 32 is a circuit diagram of another example of the semiconductor memory device of the fourth embodiment.

Figure 33:
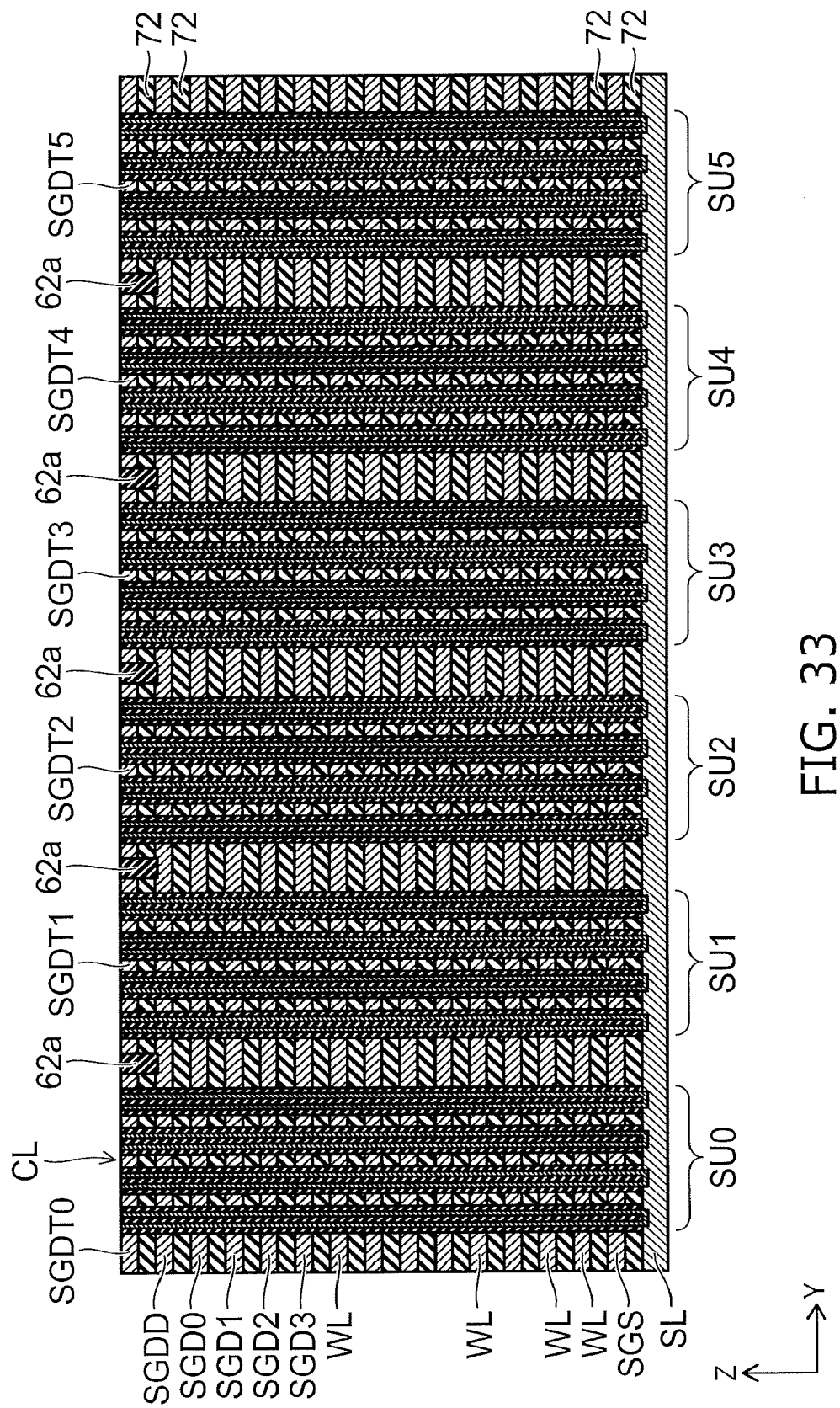
FIG. 33 is a schematic cross-sectional view of the semiconductor memory device of the fourth embodiment.

FIG. 33 is a schematic cross-sectional view of the other example of the semiconductor memory device of the fourth embodiment.

FIG. 34D is a table illustrating the potential controls of the drain-side select gates SGD0 to SGD3 of the semiconductor memory device shown in FIG. 32 and FIG. 33.

The string unit SU0 includes a drain-side select transistor of the depletion type having the drain-side select gate SGD0 as a control gate, a drain-side select transistor of the depletion type having the drain-side select gate SGD1 as a control gate, a drain-side select transistor of the enhancement type having the drain-side select gate SGD2 as a control gate, and a drain-side select transistor of the enhancement type having the drain-side select gate SGD3 as a control gate.

The string unit SU1 includes a drain-side select transistor of the depletion type having the drain-side select gate SGD0 as a control gate, a drain-side select transistor of the enhancement type having the drain-side select gate SGD1 as a control gate, a drain-side select transistor of the depletion type having the drain-side select gate SGD2 as a control gate, and a drain-side select transistor of the enhancement type having the drain-side select gate SGD3 as a control gate.

The string unit SU2 includes a drain-side select transistor of the depletion type having the drain-side select gate SGD0 as a control gate, a drain-side select transistor of the enhancement type having the drain-side select gate SGD1 as a control gate, a drain-side select transistor of the enhancement type having the drain-side select gate SGD2 as a control gate, and a drain-side select transistor of the depletion type having the drain-side select gate SGD3 as a control gate.

The string unit SU3 includes a drain-side select transistor of the enhancement type having the drain-side select gate SGD0 as a control gate, a drain-side select transistor of the depletion type having the drain-side select gate SGD1 as a control gate, a drain-side select transistor of the depletion type having the drain-side select gate SGD2 as a control gate, and a drain-side select transistor of the enhancement type having the drain-side select gate SGD3 as a control gate.

The string unit SU4 includes a drain-side select transistor of the enhancement type having the drain-side select gate SGD0 as a control gate, a drain-side select transistor of the depletion type having the drain-side select gate SGD1 as a control gate, a drain-side select transistor of the enhancement type having the drain-side select gate SGD2 as a control gate, and a drain-side select transistor of the depletion type having the drain-side select gate SGD3 as a control gate.

The string unit SU5 includes a drain-side select transistor of the enhancement type having the drain-side select gate SGD0 as a control gate, a drain-side select transistor of the enhancement type having the drain-side select gate SGD1 as a control gate, a drain-side select transistor of the depletion type having the drain-side select gate SGD2 as a control gate, and a drain-side select transistor of the depletion type having the drain-side select gate SGD3 as a control gate.

The "L" level or the "H" level is applied to the drain-side select gates SGD0 to SGD3 as shown in FIG. 34D for the string units SU0 to SU5. When the "L" voltage is applied to the select gate, the transistor of the depletion type is set to ON and the transistor of the enhancement type is set to OFF; and when the "H" voltage is applied to the select gate, the transistors of the depletion type and the enhancement type each are set to ON; thereby, one string unit is selected.

Similarly to the embodiments described above, for example, the thresholds of the select transistors are preset to the enhancement type or the depletion type by the erase operation and/or the program operation for the select transistors when testing in the die sorting or the like before shipping. The selection of the string units SU0 to SU5 when programming is performed by the drain-side select gates SGDT0 to SGDT5 divided by the separation portion 62a.

When used by the user, one string unit is selected by applying, to the drain-side select gates SGDT0 to SGDT5, prescribed voltages that set the drain-side select transistors having the drain-side select gates SGDT0 to SGDT5 as control gates ON and by applying prescribed voltages to the drain-side select gates SGD0 to SGD3.

Because the drain-side select gates SGDT1 to SGDT4 are not adjacent to the slit ST, the time constant may increase and the access time may be delayed. However, because the select operations that use the drain-side select gates SGDT1 to SGDT4 are only when programming when die sorting to set the transistors having the drain-side select gates SGD0 to SGD3 as control gates to the enhancement type, the access time is not a problem.

Normally, when used by the user, the drain-side select gates SGDT0 to SGDT5 are constantly ON; and one string unit is selected by the drain-side select gates SGD0 to SGD3; therefore, high-speed access is possible.

In the third and fourth embodiments, it is also possible to easily set the drain-side select transistors having the drain-side select gates SGDT0 to SGDT5 as control gates to be constantly ON when used by the user by setting the thresholds to be low by performing the erase operation after the programming that sets the drain-side select transistors to the enhancement type in the die sort test.

Normally, when used by the user, for example, it is also possible to apply an internal power supply voltage to the drain-side select gates SGDT0 to SGDT5 because the drain-side select transistors having the drain-side select gates SGDT0 to SGDT5 as control gates are constantly set to ON.

The dummy gate SGDD may be provided between the drain-side select gate SGD0 and the drain-side select gates SGDT0 to SGDT5. A dummy gate may be provided between the drain-side select gate SGD3 and the word lines WL. A dummy gate may be provided between the source-side select gate SGS0 and the word lines WL. The dummy gate SGDD may be provided between the source-side select gate SGSB and the source-side select gate SGS3.

A fifth embodiment will now be described.

Figure 35A:
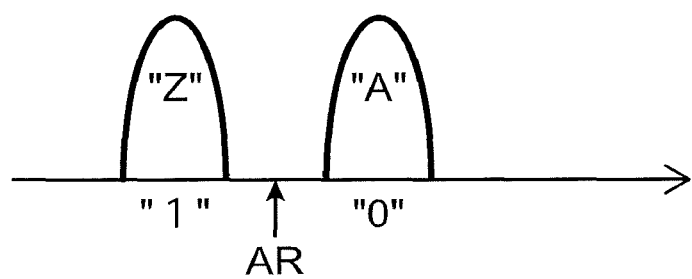
FIG. 35A is a drawing illustrating a threshold of a memory cell and an allotment of a data in the case where one bit of data is stored in one memory cell.

FIG. 35A is a drawing illustrating the threshold of the memory cell and the allotment of the data in the case where one bit of data is stored in one memory cell.

Figure 35B:
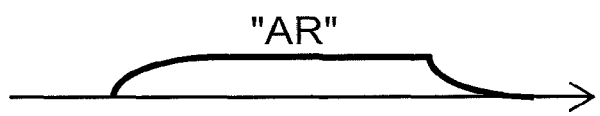
FIG. 35B is a waveform diagram of a word line when reading.

FIG. 35B is the waveform diagram of the word line when reading.

The threshold of the memory cell is set to "Z" by the erase operation and "A" by the program operation.

When reading, the cell is set to ON when the voltage "AR" is applied to the word line linked to the gate of the memory cell and when the threshold of the memory cell is "Z;" therefore, the level of the bit line linked to the memory cell is set to the "L" level and is read as the "1" datum.

On the other hand, the cell is set to OFF when the threshold of the memory cell is "A;" therefore, the level of the bit line linked to the memory cell is set to the "H" level and is read as the "0" datum.

Figure 36A:
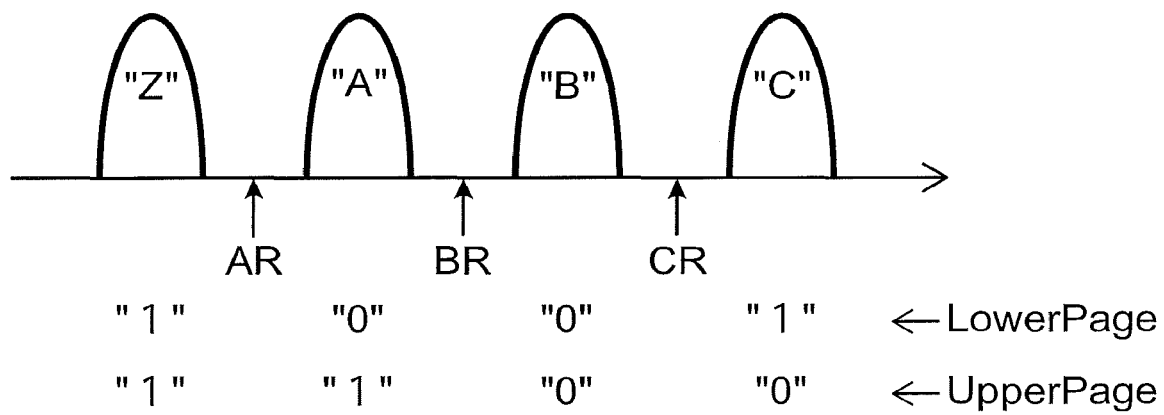
FIG. 36A is a drawing illustrating a threshold of a memory cell and an allotment of a data in the case where two bits of data are stored in one memory cell.

FIG. 36A is a drawing illustrating the threshold of the memory cell and the allotment of the data in the case where two bits of data are stored in one memory cell.

Figure 36B:
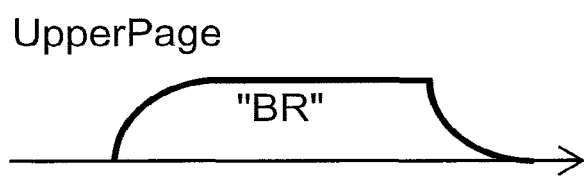
FIGS. 36B and 36C are waveform diagrams of a word line when reading in the case where the two bits are stored in the one memory cell.
Figure 36C:
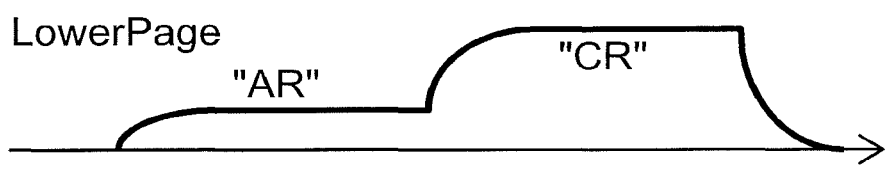

FIGS. 36B and 36C are waveform diagrams of the word line when reading in the case where the two bits are stored in the one memory cell.

By the erase operation, the threshold of the memory cell is set to "Z." When programming, the memory cell is programmed to the thresholds of "A," "B," and "C" using the two bits of data of the Lower Page and the Upper Page.

When reading the Upper Page, the cell is set to ON when the voltage "BR" is applied to the word line linked to the gate of the memory cell and when the threshold of the memory cell is "Z" or "A;" therefore, the level of the bit line linked to the memory cell is set to the "L" level and is read as the "1" datum.

On the other hand, the cell is set to OFF when the threshold of the memory cell is "B" or "C;" therefore, the level of the bit line linked to the memory cell is set to the "H" level and is read as the "0" datum.

Therefore, the Upper Page can be read by one read operation.

However, when reading the Lower Page, it is necessary to perform the read operation twice by applying the voltages "AR" and "CR" to the word line linked to the gate of the memory cell. Then, when the threshold of the memory cell is "Z" or "C," the level is read as the "1" datum; and when the threshold of the memory cell is "A" or "B," the level is read as the "0" datum.

Accordingly, multiple levels must be read when reading multi-bit memory that stores multiple bits in one memory cell; and there may be a risk that the read time is undesirably long.

According to a fifth embodiment described below, by storing one datum by sharing in multiple memory cells, it is possible to reduce the number of reads even in the case where multiple bits are stored in the memory cells.

FIG. 37 to FIG. 39B illustrate an example in which three values (first to third states) are set in one memory cell; and three bits are stored in two cells.

The read operation can be performed once; and the number of reads is the same as the case where one bit of data is stored in one memory cell as shown in FIGS. 35A and 35B.

Figure 37:
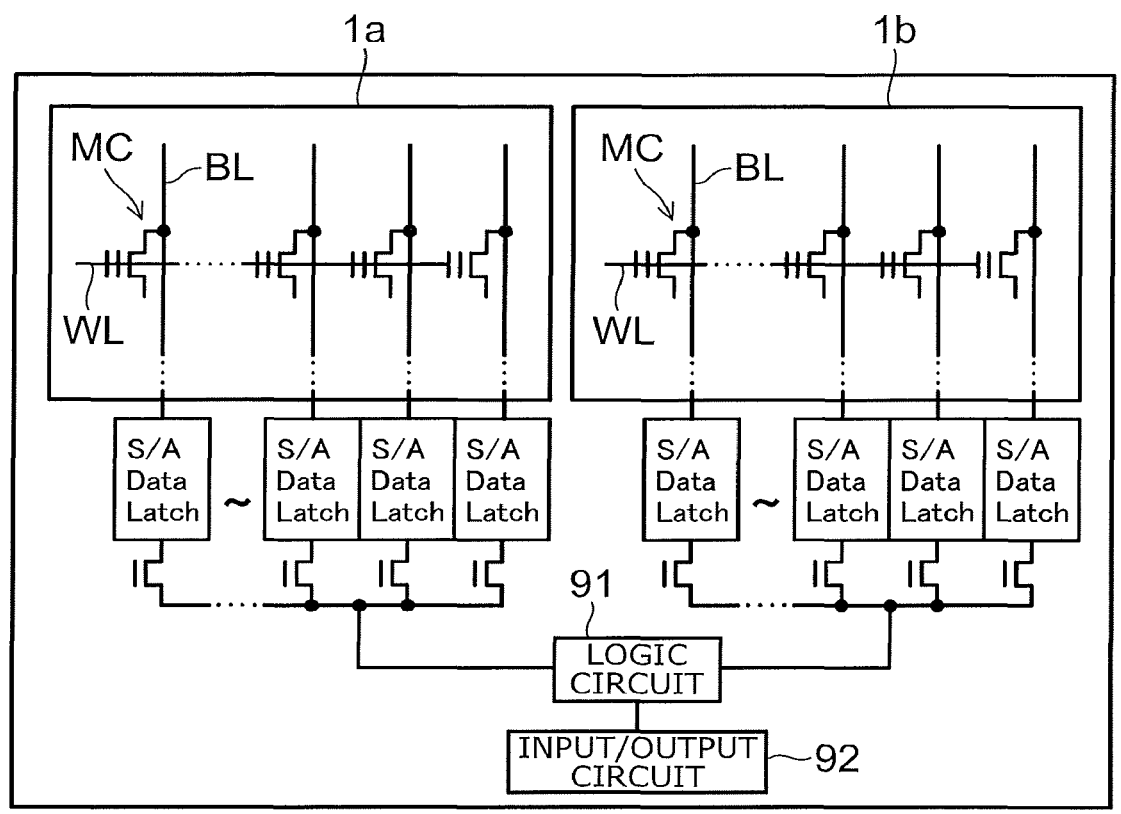
FIG. 37 is a schematic view showing a chip configuration of a semiconductor memory device of a fifth embodiment.

FIG. 37 is a schematic view showing the chip configuration of the semiconductor memory device of the fifth embodiment.

The chip (the semiconductor memory device) includes multiple memory cell arrays. In the example shown in FIG. 37, the chip includes a first memory cell array 1a and a second memory cell array 1b. For example, the first memory cell array 1a and the second memory cell array 1b can be configured similarly to the memory cell array 1 described above shown in FIG. 2.

The first memory cell array 1a and the second memory cell array 1b each include the multiple memory cells MC. The channels (the semiconductor bodies) of the memory cells MC are connected to the bit lines BL; and the gates of the memory cells MC are connected to the word lines WL. It is possible to simultaneously apply a voltage to the word line WL of the cell array so that the voltages are different between the memory cell arrays 1a and 1b.

For example, 1 kB to 16 kB of memory cells MC are linked to one word line WL; and the reading of these memory cells MC is performed simultaneously. The data that is read is retained in multiple S/A Data Latches; and the data of the S/A Data Latches is output outside the chip via a logic circuit (an arithmetic circuit) 91 and an input/output circuit 92.

FIG. 38A is a drawing showing the relationship of the thresholds of the memory cell of the fifth embodiment.

The threshold of the memory cell is set to "Z" by the erase operation.

FIGS. 38B and 38C are drawings showing the voltage of the word line linked to the gate of the memory cell when reading in the fifth embodiment.

When reading the Lower Page, the read level (the read voltage) of the first memory cell array is "AR" and the read level of the second memory cell array is "AR;" when reading the Middle Page, the read level of the first memory cell array is "AR" and the read level of the second memory cell array is "BR;" when reading the Upper Page, the read level of the first memory cell array is "BR" and the read level of the second memory cell array is "AR;" and the datum ("L" or "H") of one word line read from the memory cell array is retained in the S/A Data Latches.

FIG. 39A is a figure showing the relationship between the memory cells and the data that is read in the fifth embodiment.

FIG. 39B is a figure showing the definition of the data that is read.

In the Lower Page, in the case where the threshold of the first memory cell is "Z" and the threshold of the second memory cell is "Z," the read level of the first memory cell array is "AR;" therefore, the cell is set to ON and the bit line is set to the "L" level. The read level of the second memory cell array is "AR;" therefore, the cell is set to ON; and the bit line is set to the "L" level. In the case where the data of the first memory cell array and the second memory cell array respectively is "L" and "L," the read data is set to "1."

In the Middle Page, the read level of the first memory cell array is "AR;" therefore, the cell is set to ON; and the bit line is set to the "L" level. The read level of the second memory cell array is "BR;" therefore, the cell is set to ON; and the bit line is set to the "L" level. In the case where the data of the first memory cell array and the second memory cell array respectively is "L" and "L," the read data is set to "1."

In the Upper Page, the read level of the first memory cell array is "BR;" therefore, the cell is set to ON; and the bit line is set to the "L" level. The read level of the second memory cell array is "AR;" therefore, the cell is set to ON; and the bit line is set to the "L" level. In the case where the data of the first memory cell array and the second memory cell array respectively is "L" and "L," the read data is set to "1."

In the Lower Page, in the case where the threshold of the first memory cell is "Z" and the threshold of the second memory cell is "A," the read level of the first memory cell array is "AR;" therefore, the cell is set to ON; and the bit line is set to the "L" level. The read level of the second memory cell array is "AR;" therefore, the cell is set to OFF; and the bit line is set to the "H" level. In the case where the data of the first memory cell array and the second memory cell array respectively is "L" and "H," the read data is set to "1."

In the Middle Page, the read level of the first memory cell array is "AR;" therefore, the cell is set to ON; and the bit line is set to the "L" level. The read level of the second memory cell array is "BR;" therefore, the cell is set to ON; and the bit line is set to the "L" level. In the case where the data of the first memory cell array and the second memory cell array respectively is "L" and "L," the read data is set to "1."

In the Upper Page, the read level of the first memory cell array is "BR;" therefore, the cell is set to ON; and the bit line is set to the "L" level. The read level of the second memory cell array is "AR;" therefore, the cell is set to OFF; and the bit line is set to the "H" level. In the case where the data of the first memory cell array and the second memory cell array respectively is "L" and "H," the read data is set to "0."

In the Lower Page, in the case where the threshold of the first memory cell is "Z" and the threshold of the second memory cell is "B," the read level of the first memory cell array is "AR;" therefore, the cell is set to ON; and the bit line is set to the "L" level. The read level of the second memory cell array is "AR;" therefore, the cell is set to OFF; and the bit line is set to the "H" level. In the case where the data of the first memory cell array and the second memory cell array respectively is "L" and "H," the read data is set to "1."

In the Middle Page, the read level of the first memory cell array is "AR;" therefore, the cell is set to ON; and the bit line is set to the "L" level. The read level of the second memory cell array is "BR;" therefore, the cell is set to OFF; and the bit line is set to the "H" level. In the case where the data of the first memory cell array and the second memory cell array respectively is "L" and "H," the read data is set to "0."

In the Upper Page, the read level of the first memory cell array is "BR;" therefore, the cell is set to ON; and the bit line is set to the "L" level. The read level of the second memory cell array is "AR;" therefore, the cell is set to OFF; and the bit line is set to the "H" level. In the case where the data of the first memory cell array and the second memory cell array respectively is "L" and "H," the read data is set to "0."

In the Lower Page, in the case where the threshold of the first memory cell is "A" and the threshold of the second memory cell is "Z," the read level of the first memory cell array is "AR;" therefore, the cell is set to OFF; and the bit line is set to the "H" level. The read level of the second memory cell array is "AR;" therefore, the cell is set to ON; and the bit line is set to the "L" level. In the case where the data of the first memory cell array and the second memory cell array respectively is "H" and "L," the read data is set to "1."

In the Middle Page, the read level of the first memory cell array is "AR;" therefore, the cell is set to OFF; and the bit line is set to the "H" level. The read level of the second memory cell array is "BR;" therefore, the cell is set to ON; and the bit line is set to the "L" level. In the case where the data of the first memory cell array and the second memory cell array respectively is "H" and "L," the read data is set to "0."

In the Upper Page, the read level of the first memory cell array is "BR;" therefore, the cell is set to ON; and the bit line is set to the "L" level. The read level of the second memory cell array is "AR;" therefore, the cell is set to ON; and the bit line is set to the "L" level. In the case where the data of the first memory cell array and the second memory cell array respectively is "L" and "L," the read data is set to "1."

Similarly thereafter, the data that is read is determined according to the thresholds of the first memory cell and the second memory cell as shown in FIG. 39A.

In the read operation, first, when the read operation command and address are input from the outside, one of the Lower Page, the Middle Page, or the Upper Page is determined according to the address; one word line WL of the first memory cell array 1a and one word line WL of the second memory cell array 1b shown in FIG. 37 are selected; and the word lines WL are respectively set to the prescribed voltages shown in FIGS. 38B and 38C. Then, the data of the memory cells MC linked to the word lines WL is read via the bit lines BL; and the datum of "L" or "H" is retained respectively in the S/A Data Latches of the first memory cell array 1a and the second memory cell array 1b.

Subsequently, based on an output command from the outside, one set (e.g., the data output unit of 8 bits or 16 bits) of the S/A Data Latches is selected for each of the arrays 1a and 1b; the datum ("L" or "H") is input to the logic circuit (the select arithmetic circuit) 91; and the "1" or "0" datum is determined according to the definition of FIG. 39B and output outside the chip via the input/output circuit 92.

On the other hand, in the program operation, first, the data of the Lower Page is input and retained in the S/A Data Latches of the first memory cell array 1a and the second memory cell array 1b via the input/output circuit 92 and the logic circuit 91. At this time, the same data is retained in the S/A Data Latches of the first memory cell array 1a and the second memory cell array 1b.

Subsequently, similarly to the Lower Page, the data of the Middle Page and the Upper Page is transmitted to the S/A Data Latches of the first memory cell array 1a and the second memory cell array 1b. At this time, the same data is retained in the S/A Data Latches of the first memory cell array 1a and the second memory cell array 1b.

Subsequently, after the input of a program command, the data that is retained in the S/A Data Latches is converted to the data inside the S/A Data Latches for Inhibit, for programming to the "A" level, and for programming to the "B" level for each of the first memory cell array 1a and the second memory cell array 1b according to the table shown in FIG. 40 and is programmed as the prescribed threshold of the memory cell.

In the case where the data input from the outside is Lower Page "1," Middle Page "0," and Upper Page "0," the data to the S/A Data Latches is set as follows. Programming is performed to set the first memory cell array to "Inhibit" (Z) and the second memory cell array to "B." Or, programming is performed to set the first memory cell array to "B" and the second memory cell array to "Inhibit" (Z). In the case where the number of cells for which the programming is not completed is counted partway through the programming, the data is set for predetermined halves of the multiple S/A Data Latches so that the data can be halved.

A modification of the fifth embodiment will now be described with reference to FIG. 41A to FIG. 43.

Figure 41A:
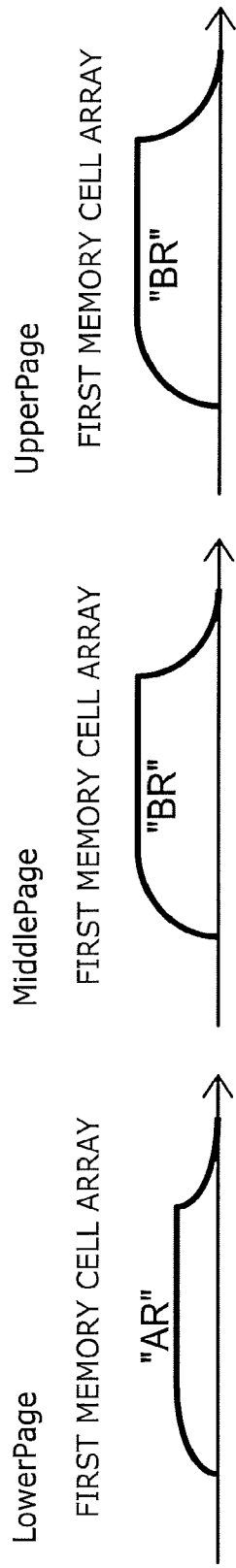
FIGS. 41A and 41B are drawings showing a voltage of a word line connected to a gate of a memory cell when reading in a modification of the fifth embodiment.
Figure 41B:
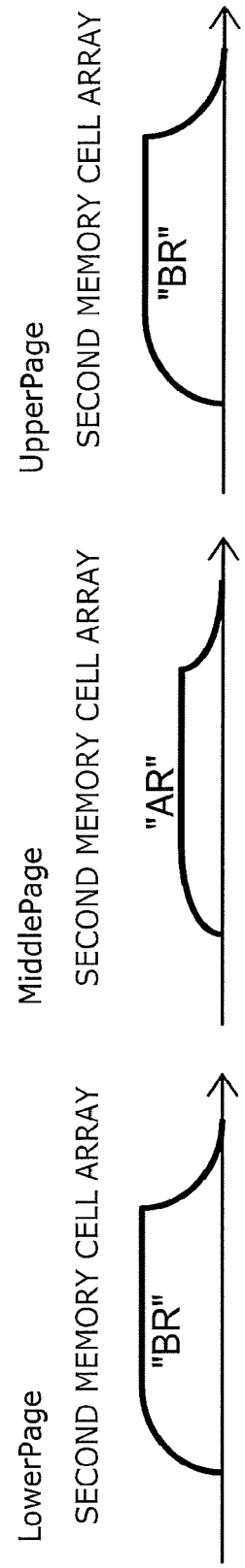

FIGS. 41A and 41B are drawings showing the voltage of the word line linked to the gate of the memory cell when reading in the modification.

When reading the Lower Page, the read level of the first memory cell array is set to "AR" and the read level of the second memory cell array is set to "BR;" when reading the Middle Page, the read level of the first memory cell array is set to "BR" and the read level of the second memory cell array is set to "AR;" and when reading the Upper Page, the read level of the first memory cell array is set to "BR" and the read level of the second memory cell array is set to "BR."

FIG. 42A is a figure illustrating the relationship between the memory cells and the data that is read in the modification.

FIG. 42B is a figure showing the definition of the data that is read.

Figures 43, 44:
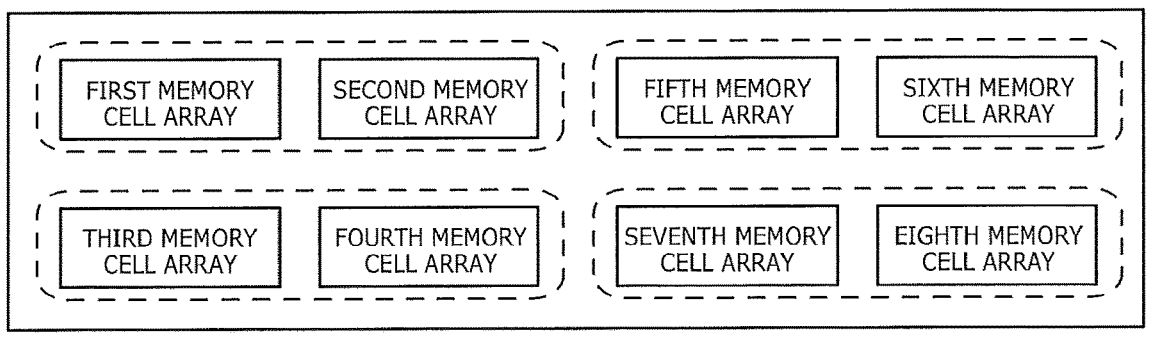
FIG. 43 is an explanation drawing of a data program operation in the modification of the fifth embodiment.
FIG. 44 is a schematic view showing a chip configuration of the semiconductor memory device of the fifth embodiment.

After the input of the program command, the data that is retained in the S/A Data Latches is converted to the data of the S/A Data Latches for Inhibit, for programming to the "A" level, and for programming to the "B" level for each of the first memory cell array and the second memory cell array according to the table shown in FIG. 43 and is programmed as the prescribed threshold of the memory cell.

In the case where the data input from the outside is Lower Page "0," Middle Page "0," and Upper Page "0," the data to the S/A Data Latches is set as follows. Programming is performed to set the first memory cell array to "Inhibit" (Z) and the second memory cell array to "B." Or, programming is performed to set the first memory cell array to "B" and the second memory cell array to "Inhibit" (Z). In the case where the number of cells for which the programming is not completed is counted partway through the programming, the data is set for predetermined halves of the multiple S/A Data Latches so that the data can be halved.

According to the fifth embodiment, by applying the prescribed voltages to the word lines for each of multiple memory cell arrays, even in the case where multiple bits are stored in one memory cell, it is possible to set the number of reads to one read operation; and a read operation is possible in which the number of reads is the same as the case where one bit of data is stored in one memory cell.

According to the fifth embodiment, two memory cell arrays are included; word lines are linked to the gates of the memory cells of each array; voltages that are different between the arrays are applied to the word lines; and three bits are stored in one memory; but there may be three or more memory cell arrays. Also, four or more bits may be stored by providing four, five, or more thresholds of the memory cell in one memory cell.

Although according to the fifth embodiment two memory cell arrays are used as one set and three bits are stored in two cells, for example, the eight physical memory cell arrays shown in FIG. 44 may be used as one set; and the data may be stored in the memory cells of each set.

Figure 45:
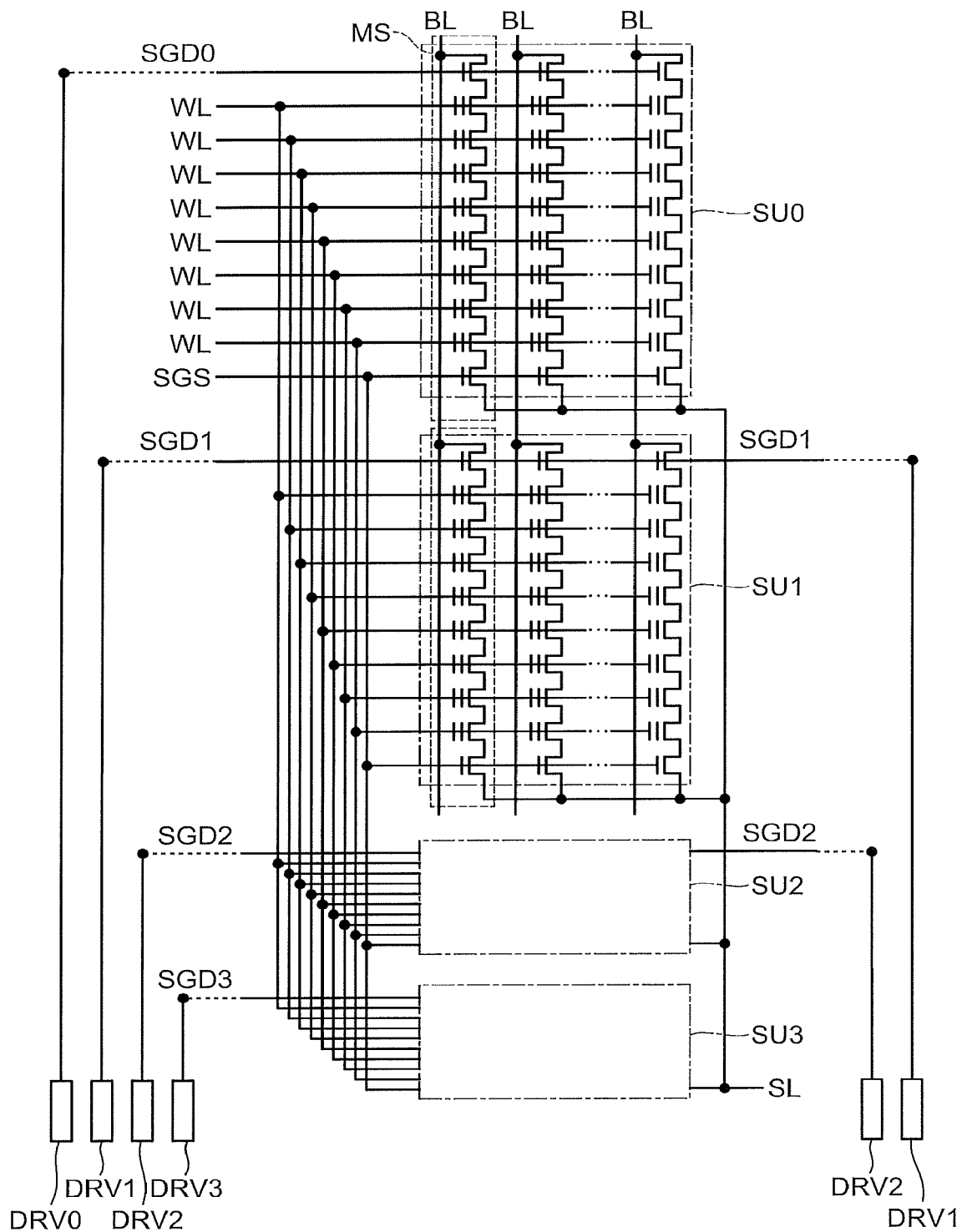
FIG. 45 is a circuit diagram of another example of the semiconductor memory device of the first embodiment.
Figure 46:
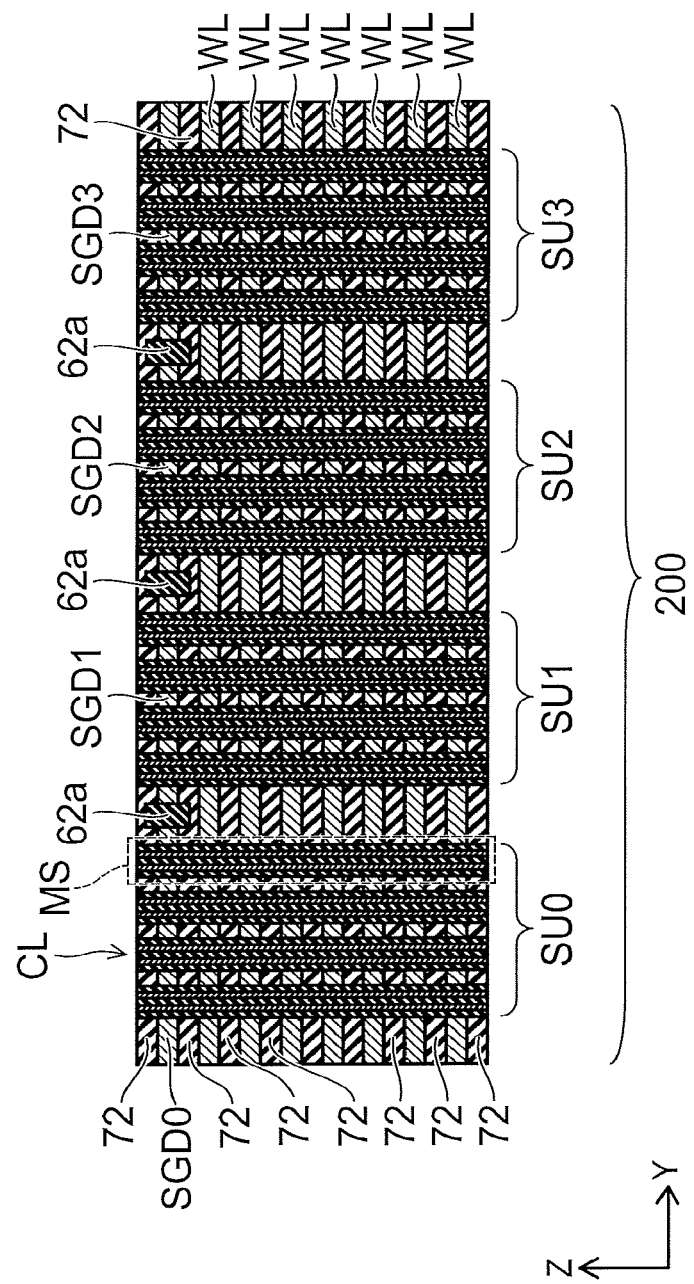
FIG. 46 is a schematic cross-sectional view of the semiconductor memory device shown in FIG. 45 of the first embodiment.
Figure 47A:
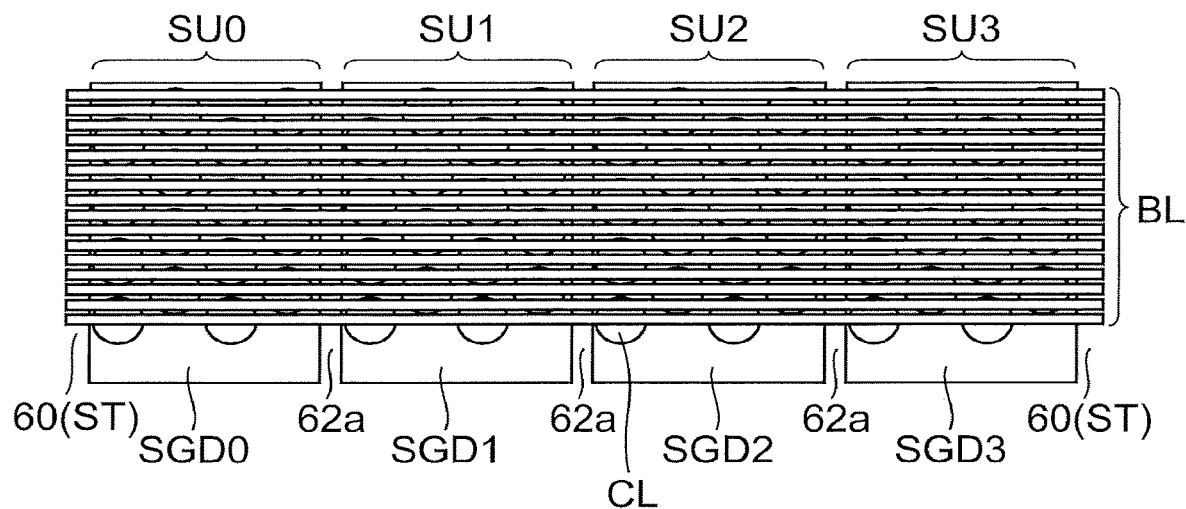
FIGS. 47A and 47B are schematic plan views of the semiconductor memory device shown in FIGS. 45 and 46 of the first embodiment.

FIG. 45 is a circuit diagram of another example of the semiconductor memory device of the first embodiment;

FIG. 46 is a schematic cross-sectional view of the semiconductor memory device shown in FIG. 45 of the first embodiment; and FIG. 47A is a schematic plan view of the layer of the one block 200 where the drain-side select gates SGD0, SDG1, SDG2, and SGD3 are provided.

Figure 47B:
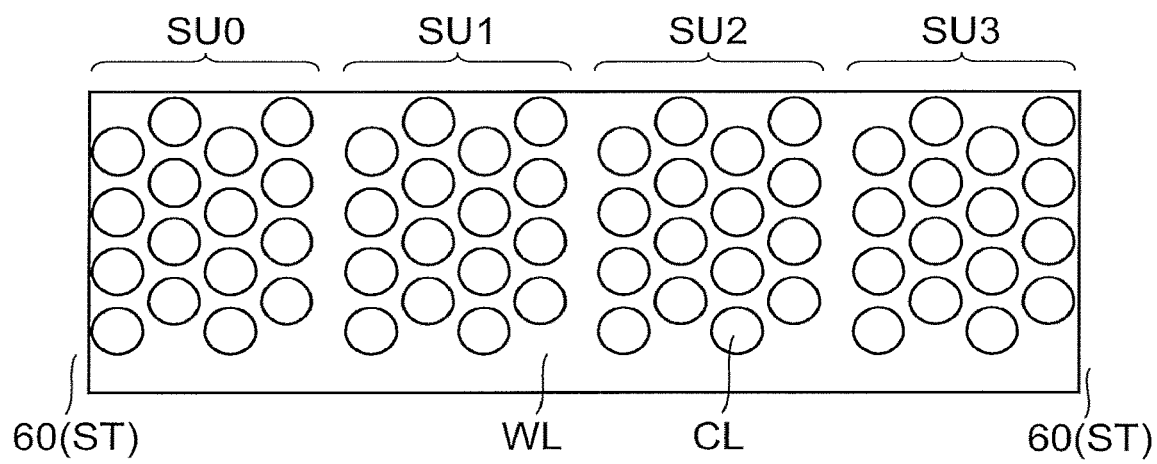

FIG. 47B is a schematic plan view of the layer of the one block 200 where the word line WL is provided.

As shown in FIG. 46 and FIG. 47A, the separation portions 62a divide the one drain-side select gate layer into the first drain-side select gate SGD0, the second drain-side select gate SGD1, the third drain-side select gate SGD2, and the fourth drain-side select gate SGD3.

As shown in FIG. 45, the first drain-side select gate SGD0 is connected to the drive circuit DRV0. The second drain-side select gate SGD1 is connected to the drive circuit DRV1. The third drain-side select gate SGD2 is connected to the drive circuit DRV2. The fourth drain-side select gate SGD3 is connected to the drive circuit DRV3.

The second drain-side select gate SGD1 is connected to the two drive circuits DRV1 from both sides of the word line WL. The second drain-side select gate SGD1 is driven from both sides of the word line WL. The third drain-side select gate SGD2 is connected to the two drive circuits DRV2 from both sides of the word line WL. The third drain-side select gate SGD2 is driven from both sides of the word line WL.

Accordingly, even if the resistance of the drain-side select gate SGD1, SGD2 is high, the rise time of the drain-side select gate SGD1, SGD2 is not delayed as compared with the rise time of the other drain-side select gate SGD0, SGD3.

The word line WL, the drain-side select gate SGD0, and the drain-side select gate SGD3 are driven from one side. The drain-side select gate SGD1 and the drain-side select gate SGD2 are driven from both sides of the word line WL.

When the first string unit SU0 is selected, the first drain-side select transistor having the first drain-side select gate SGD0 is set to ON. The other drain-side select transistors each having the second drain-side select gate SGD1, the third drain-side select gate SGD2 and the fourth drain-side select gate SGD3 are set to OFF.

When the second string unit SU1 is selected, the second drain-side select transistor having the second drain-side select gate SGD1 is set to ON. The other drain-side select transistors each having the first drain-side select gate SGD0, the third drain-side select gate SGD2 and the fourth drain-side select gate SGD3 are set to OFF.

When the third string unit SU2 is selected, the third drain-side select transistor having the third drain-side select gate SGD2 is set to ON. The other drain-side select transistors each having the first drain-side select gate SGD0, the second drain-side select gate SGD3 and the fourth drain-side select gate SGD3 are set to OFF.

When the fourth string unit SU3 is selected, the fourth drain-side select transistor having the fourth drain-side select gate SGD3 is set to ON. The other drain-side select transistors each having the first drain-side select gate SGD0, the second drain-side select gate SGD3 and the third drain-side select gate SGD2 are set to OFF.

Although the two drain-side select gates SGD0 and SGD3 are each driven by the one drive circuit from the one side in the above embodiment, one drain-side select gate or any plurality of drain-side select gates may be driven by the one drive circuit from the one side.

Although the two drain-side select gates SGD1 and SGD2 are each driven by the two drive circuits from the both sides in the above embodiment, one drain-side select gate or any plurality of drain-side select gates may be driven by the two drive circuits from the both sides.

In the embodiments described above, the stacked body 100 that includes the multiple conductive layers 70 and the multiple insulating layers 72 may be formed by alternately stacking the conductive layers 70 and the insulating layers 72 without forming the sacrificial layers 71. Also, in the embodiments described above, a dummy word line may be provided between the drain-side select gate and the word lines and/or between the source-side select gate and the word lines. A prescribed voltage is applied to the dummy word line in the read, program, and erase operations. Also, dummy cells may be preset to a prescribed threshold by an erase operation and a program operation.

The semiconductor memory device according to the embodiment may include the following configuration.

Note 1

A semiconductor memory device, comprising:

first to nth string units (n being a natural number of 3 or more), the first to nth string units each including a memory string, the memory string including a plurality of memory cells and a plurality of select transistors connected in series in a first direction;

a plurality of layers of word lines stacked in the first direction; and (n−1) layers of select gate layers stacked in the first direction, the (n−1) layers of select gate layers including first to (2×(n−1))th select gates electrically isolated from each other, the first string unit being selected by the first to (n−1)th select gates, the kth string unit (k being not less than 1 and not more than n) being selected by the kth to (n+k−2)th select gates, the nth string unit being selected by the nth to (2×(n−1))th select gates.

Note 2

The device according to Note 1, wherein a stacked body including the plurality of layers of word lines and the (n−1) layers of select gate layers is divided into a plurality of blocks in a second direction by a first separation portion, the first separation portion piercing the stacked body, and the first to nth string units in one of the blocks are arranged to be separated from each other in the second direction.

Note 3

The device according to Note 2, wherein one layer of the select gate layers inside the one block is divided into two of the select gates by a second separation portion between mutually-adjacent string units of the string units, the second separation portion divides the one layer of the select gate layers and does not divide the other layers of the select gate layers, and positions in the second direction of the second separation portions provided in different layers of the select gate layers are shifted from each other.

Note 4

The device according to Note 2, wherein the memory string includes:

a semiconductor body extending through the stacked body in the first direction; and a charge storage portion provided between the semiconductor body and one of the word lines.

Note 5

A semiconductor memory device, comprising:

a first string unit and a second string unit, the first string unit and the second string unit each including a memory string, the memory string including a plurality of memory cells and a plurality of select transistors connected in series in a first direction;

a plurality of layers of word lines stacked in the first direction, the plurality of layers of word lines being provided commonly for the memory cells of the first string unit and the memory cells of the second string unit; and a first select gate and a second select gate stacked in the first direction, the first select gate and the second select gate being provided commonly for the select transistors of the first string unit and the select transistors of the second string unit, the first string unit including a first select transistor and a second select transistor, the first select transistor being of a depletion type and being selected by the first select gate, the second select transistor being of an enhancement type, being selected by the second select gate, and being connected in series to the first select transistor, the second string unit including a third select transistor and a fourth select transistor, the third select transistor being of the enhancement type and being selected by the first select gate, the fourth select transistor being of the depletion type, being selected by the second select gate, and being connected in series to the third select transistor.

Note 6

The device according to Note 5, wherein a stacked body including the plurality of layers of word lines, the first select gate, and the second select gate is divided into a plurality of blocks in a second direction by a separation portion, the separation portion piercing the stacked body, and the first string unit and the second string unit in one of the blocks are arranged to be separated from each other in the second direction.

Note 7

The device according to Note 6, wherein the memory string includes:

a semiconductor body extending through the stacked body in the first direction; and a charge storage portion provided between the semiconductor body and one of the word lines, between the semiconductor body and the first select gate, and between the semiconductor body and the second select gate, the first select transistor and the third select transistor are set to the depletion type by an erase operation for the charge storage portion, and the second select transistor and the fourth select transistor are set to the enhancement type by a program operation for the charge storage portion.

Note 8

The device according to Note 5, wherein the first select transistor of the depletion type and the second select transistor of the enhancement type are connected in series in order from the memory cell side between a source line and the memory cells of the first string unit, and the third select transistor of the enhancement type and the fourth select transistor of the depletion type are connected in series in order from the memory cell side between the source line and the memory cells of the second string unit.

Note 9

The device according to Note 8, wherein when the first string unit is selected, the first select transistor, the second select transistor, and the fourth select transistor are set to ON and the third select transistor is set to OFF, and when the second string unit is selected, the first select transistor, the third select transistor, and the fourth select transistor are set to ON and the second select transistor is set to OFF.

Note 10

A semiconductor memory device, comprising:

first to nth string units (n being a natural number of 3 or more), the first to nth string units each including a memory string, the memory string including a plurality of memory cells and a plurality of select transistors connected in series in a first direction;

a plurality of layers of word lines stacked in the first direction; and k layers of select gates (k being a natural number of 3 or more) stacked in the first direction, the memory strings each including a select transistor of a depletion type and a select transistor of an enhancement type connected in series to each other, one string unit of the first to nth string units being selected and the other string units of the first to nth string units being unselected by setting the select gates connected to the select transistors of the depletion type included in the one string unit to a first level and by setting the select gates connected to the select transistors of the enhancement type included in the one string unit to a second level.

Note 11

The device according to Note 10, wherein the one string unit is selected and the other string units are unselected by setting h layers of the select gates of the k layers of the select gates to the first level and by setting (k−h) layers of the select gates of the k layers of the select gates to the second level.

Note 12

The device according to Note 11, wherein n is a number not more than $k!/((k-h)! \times h!)$.

Note 13

The device according to Note 10, wherein a stacked body including the plurality of layers of word lines and the k layers of the select gates is divided into a plurality of blocks in a second direction by a separation portion, the separation portion piercing the stacked body, and the first to nth string units in one of the blocks are arranged to be separated from each other in the second direction.

Note 14

The device according to Note 13, wherein the memory string includes:

a semiconductor body extending through the stacked body in the first direction; and a charge storage portion provided between the semiconductor body and one of the word lines, and between the semiconductor body and the first to nth select gates, the select transistors are set to the depletion type by an erase operation for the charge storage portion, and the select transistors are set to the enhancement type by a program operation for the charge storage portion.

Note 15

The device according to Note 13, wherein the stacked body includes four layers of the select gates, the first to fourth string units in one of the blocks are arranged to be separated from each other in the second direction, the first string unit includes a first select transistor of the depletion type, a second select transistor of the enhancement type, a third select transistor of the enhancement type, and a fourth select transistor of the enhancement type connected in series in order from the memory cell side between a source line and the memory cells of the first string unit, the second string unit includes a fifth select transistor of the enhancement type, a sixth select transistor of the depletion type, a seventh select transistor of the enhancement type, and an eighth select transistor of the enhancement type connected in series in order from the memory cell side between the source line and the memory cells of the second string unit, the third string unit includes a ninth select transistor of the enhancement type, a tenth select transistor of the enhancement type, an eleventh select transistor of the depletion type, and a twelfth select transistor of the enhancement type connected in series in order from the memory cell side between the source line and the memory cells of the third string unit, and the fourth string unit includes a thirteenth select transistor of the enhancement type, a fourteenth select transistor of the enhancement type, a fifteenth select transistor of the enhancement type, and a sixteenth select transistor of the depletion type connected in series in order from the memory cell side between the source line and the memory cells of the fourth string unit.

Note 16

The device according to Note 15, wherein when the first string unit is selected, the first to fourth, sixth to eighth, tenth to twelfth, and fourteenth to sixteenth select transistors are set to ON and the other select transistors are set to OFF, when the second string unit is selected, the first, third to ninth, eleventh to thirteenth, and fifteenth to sixteenth select transistors are set to ON and the other select transistors are set to OFF, when the third string unit is selected, the first to second, fourth to sixth, eighth to fourteenth, and sixteenth select transistors are set to ON and the other select transistors are set to OFF, and when the fourth string unit is selected, the first to third, fifth to seventh, ninth to eleventh, and thirteenth to sixteenth select transistors are set to ON and the other select transistors are set to OFF.

Note 17

The device according to Note 13, wherein the stacked body includes four layers of the select gates, the first to sixth string units in one of the blocks are arranged to be separated from each other in the second direction, the first string unit includes a first select transistor of the depletion type, a second select transistor of the depletion type, a third select transistor of the enhancement type, and a fourth select transistor of the enhancement type connected in series in order from the memory cell side between a source line and the memory cells of the first string unit, the second string unit includes a fifth select transistor of the depletion type, a sixth select transistor of the enhancement type, a seventh select transistor of the depletion type, and an eighth select transistor of the enhancement type connected in series in order from the memory cell side between the source line and the memory cells of the second string unit, the third string unit includes a ninth select transistor of the depletion type, a tenth select transistor of the enhancement type, an eleventh select transistor of the enhancement type, and a twelfth select transistor of the depletion type connected in series in order from the memory cell side between the source line and the memory cells of the third string unit, the fourth string unit includes a thirteenth select transistor of the enhancement type, a fourteenth select transistor of the depletion type, a fifteenth select transistor of the depletion type, and a sixteenth select transistor of the enhancement type connected in series in order from the memory cell side between the source line and the memory cells of the fourth string unit, the fifth string unit includes a seventeenth select transistor of the enhancement type, an eighteenth select transistor of the depletion type, a nineteenth select transistor of the enhancement type, and a twentieth select transistor of the depletion type connected in series in order from the memory cell side between the source line and the memory cells of the fifth string unit, and the sixth string unit includes a twenty-first select transistor of the enhancement type, a twenty-second select transistor of the enhancement type, a twenty-third select transistor of the depletion type, and a twenty-fourth select transistor of the depletion type connected in series in order from the memory cell side between the source line and the memory cells of the sixth string unit.

Note 18

The device according to Note 17, wherein when the first string unit is selected, the first to fifth, seventh to ninth, eleventh to twelfth, fourteenth to sixteenth, eighteenth to twentieth, and twenty-third to twenty-fourth select transistors are set to ON and the other select transistors are set to OFF, when the second string unit is selected, the first to second, fourth to tenth, twelfth, fourteenth to sixteenth, eighteenth, twentieth, and twenty-second to twenty-fourth select transistors are set to ON and the other select transistors are set to OFF, when the third string unit is selected, the first to third, fifth to seventh, ninth to twelfth, fourteenth to fifteenth, eighteenth to twentieth, and twenty-second to twenty-fourth select transistors are set to ON and the other select transistors are set to OFF, when the fourth string unit is selected, the first to second, fourth to fifth, seventh to ninth, twelfth to eighteenth, twentieth to twenty-first, and twenty-third to twenty-fourth select transistors are set to ON and the other select transistors are set to OFF, when the fifth string unit is selected, the first to third, fifth, seventh, ninth, eleventh to fifteenth, seventeenth to twenty-first, and twenty-third to twenty-fourth select transistors are set to ON and the other select transistors are set to OFF, and when the sixth string unit is selected, the first to second, fifth to seventh, ninth to tenth, twelfth to fifteenth, seventeenth to eighteenth, and twentieth to twenty-fourth select transistors are set to ON and the other select transistors are set to OFF.

Note 19

A method for manufacturing the semiconductor memory device according to Note 7, the erase operation and the program operation being performed before shipping.

Note 20

A method for manufacturing the semiconductor memory device according to Note 14, the erase operation and the program operation being performed before shipping.

Note 21

A semiconductor memory device, comprising first to nth memory cells (n being a natural number), the first to nth memory cells each having a plurality of thresholds, the first to nth memory cells being selected simultaneously in a read operation, after the read operation, k pieces of read data (k being n or less) being determined from n pieces of data read from the first to nth memory cells.

Note 22

The device according to Note 21, wherein the first to nth memory cells include a first state, a second state, a third state, and an hth state (h being 3 or more), the first state and the second state are discriminated by applying a first read voltage to gates of the first to nth memory cells, the second state and the third state are discriminated by applying a second read voltage to the gates of the first to nth memory cells, the (h−1)th state and the hth state are discriminated by applying an (h−1)th read voltage to the gates of the first to nth memory cells, and a voltage of the first to (h−1)th read voltages is applied to the first to nth memory cells in the read operation.

Note 23

A semiconductor memory device, comprising a first memory cell and a second memory cell, the first memory cell and the second memory cell each having a plurality of thresholds, the first memory cell and the second memory cell being selected simultaneously in a read operation, after the read operation, one piece of read data is determined from first data read from the first memory cell and second data read from the second memory cell.

Note 24

The device according to Note 23, wherein the first memory cell and the second memory cell each include a first state, a second state, and a third state, the first state and the second state are discriminated by applying a first read voltage to a gate of the first memory cell and a gate of the second memory cell, the second state and the third state are discriminated by applying a second read voltage to the gate of the first memory cell and the gate of the second memory cell, the read operation is performed in a first read operation by applying the first read voltage to the first memory cell and applying the first read voltage to the second memory cell, the read operation is performed in a second read operation by applying the first read voltage to the first memory cell and applying the second read voltage to the second memory cell, and the read operation is performed in a third read operation by applying the second read voltage to the first memory cell and applying the first read voltage to the second memory cell.

Note 25

A semiconductor memory device, comprising:

first to nth string units (n being a natural number of 3 or more), the first to nth string units each including a memory string, the memory string including a plurality of memory cells and a plurality of select transistors connected in series in a first direction;

a plurality of layers of word lines stacked in the first direction; and one select gate layer stacked in the first direction, the one select gate layer including first, second, and nth select gates electrically isolated from each other, the first string unit being selected by the first select gates, the kth string unit (k being not less than 1 and not more than n) being selected by the kth select gates, each of h (h being not less than 1 and not more than n) select gates of the first, second, and nth select gates is connected to one drive circuit, each of i (i being not less than 1 and not more than n) select gates of the first, second, and nth select gates is connected to two drive circuits.

Note 26

The device according to Note 25, wherein the plurality of layers of word lines and the one select gate layer are divided into a plurality of blocks in a second direction by a first separation portion, the first separation portion piercing a stacked body including the plurality of layers of word lines and the one select gate layer, and the first to nth string units in one of the blocks are arranged to be separated from each other in the second direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:

first to nth string units (n being a natural number of 3 or more), the first to nth string units each including a memory string, the memory string including a plurality of memory cells and a plurality of select transistors connected in series in a first direction;

a plurality of layers of word lines stacked in the first direction; and (n−1) layers of select gate layers stacked in the first direction, the (n−1) layers of select gate layers including first to (2×(n−1))th select gates electrically isolated from each other, the first string unit being selected by the first to (n−1)th select gates, the kth string unit (k being not less than 1 and not more than n) being selected by the kth to (n+k−2)th select gates, the nth string unit being selected by the nth to (2×(n−1))th select gates.

2. The device according to claim 1, wherein a stacked body including the plurality of layers of word lines and the (n−1) layers of select gate layers is divided into a plurality of blocks in a second direction by a first separation portion, the first separation portion piercing the stacked body, and the first to nth string units in one of the blocks are arranged to be separated from each other in the second direction.

3. The device according to claim 2, wherein one layer of the select gate layers inside the one block is divided into two of the select gates by a second separation portion between mutually-adjacent string units of the string units, the second separation portion divides the one layer of the select gate layers and does not divide the other layers of the select gate layers, and positions in the second direction of the second separation portions provided in different layers of the select gate layers are shifted from each other.

4. The device according to claim 2, wherein the memory string includes:

a semiconductor body extending through the stacked body in the first direction; and a charge storage portion provided between the semiconductor body and one of the word lines.

5. A semiconductor memory device, comprising:

first to nth string units (n being a natural number of 2 or more), the first to nth string units each including a memory string, the memory string including a plurality of memory cells and a plurality of select transistors connected in series in a first direction;

a plurality of layers of word lines stacked in the first direction; and k layers of select gates (k being a natural number of 2 or more) stacked in the first direction, the memory strings each including a select transistor of a depletion type and a select transistor of an enhancement type connected in series to each other, one string unit of the first to nth string units being selected and the other string units of the first to nth string units being unselected by setting the select gates connected to the select transistors of the depletion type included in the one string unit to a first level and by setting the select gates connected to the select transistors of the enhancement type included in the one string unit to a second level.

6. The device according to claim 5, wherein the one string unit is selected and the other string units are unselected by setting h layers of the select gates of the k layers of the select gates to the first level and by setting (k−h) layers of the select gates of the k layers of the select gates to the second level.

7. The device according to claim 6, wherein n is a number not more than k!/((k−h)!×h!).

8. The device according to claim 5, wherein
a stacked body including the plurality of layers of word lines and the k layers of the select gates is divided into a plurality of blocks in a second direction by a separation portion, the separation portion piercing the stacked body, and
the first to nth string units in one of the blocks are arranged to be separated from each other in the second direction.

9. The device according to claim 8, wherein
the memory string includes:
a semiconductor body extending through the stacked body in the first direction; and
a charge storage portion provided between the semiconductor body and one of the word lines, and between the semiconductor body and the first to nth select gates,
the select transistors are set to the depletion type by an erase operation for the charge storage portion, and
the select transistors are set to the enhancement type by a program operation for the charge storage portion.

10. The device according to claim 8, wherein
the stacked body includes four layers of the select gates,
the first to fourth string units in one of the blocks are arranged to be separated from each other in the second direction,
the first string unit includes a first select transistor of the depletion type, a second select transistor of the enhancement type, a third select transistor of the enhancement type, and a fourth select transistor of the enhancement type connected in series in order from the memory cell side between a source line and the memory cells of the first string unit,
the second string unit includes a fifth select transistor of the enhancement type, a sixth select transistor of the depletion type, a seventh select transistor of the enhancement type, and an eighth select transistor of the enhancement type connected in series in order from the memory cell side between the source line and the memory cells of the second string unit,
the third string unit includes a ninth select transistor of the enhancement type, a tenth select transistor of the enhancement type, an eleventh select transistor of the depletion type, and a twelfth select transistor of the enhancement type connected in series in order from the memory cell side between the source line and the memory cells of the third string unit, and
the fourth string unit includes a thirteenth select transistor of the enhancement type, a fourteenth select transistor of the enhancement type, a fifteenth select transistor of the enhancement type, and a sixteenth select transistor of the depletion type connected in series in order from the memory cell side between the source line and the memory cells of the fourth string unit.

11. The device according to claim 10, wherein
when the first string unit is selected, the first to fourth, sixth to eighth, tenth to twelfth, and fourteenth to sixteenth select transistors are set to ON and the other select transistors are set to OFF,
when the second string unit is selected, the first, third to ninth, eleventh to thirteenth, and fifteenth to sixteenth select transistors are set to ON and the other select transistors are set to OFF,
when the third string unit is selected, the first to second, fourth to sixth, eighth to fourteenth, and sixteenth select transistors are set to ON and the other select transistors are set to OFF, and
when the fourth string unit is selected, the first to third, fifth to seventh, ninth to eleventh, and thirteenth to sixteenth select transistors are set to ON and the other select transistors are set to OFF.

12. The device according to claim 8, wherein
the stacked body includes four layers of the select gates,
the first to sixth string units in one of the blocks are arranged to be separated from each other in the second direction,
the first string unit includes a first select transistor of the depletion type, a second select transistor of the depletion type, a third select transistor of the enhancement type, and a fourth select transistor of the enhancement type connected in series in order from the memory cell side between a source line and the memory cells of the first string unit,
the second string unit includes a fifth select transistor of the depletion type, a sixth select transistor of the enhancement type, a seventh select transistor of the depletion type, and an eighth select transistor of the enhancement type connected in series in order from the memory cell side between the source line and the memory cells of the second string unit,
the third string unit includes a ninth select transistor of the depletion type, a tenth select transistor of the enhancement type, an eleventh select transistor of the enhancement type, and a twelfth select transistor of the depletion type connected in series in order from the memory cell side between the source line and the memory cells of the third string unit,
the fourth string unit includes a thirteenth select transistor of the enhancement type, a fourteenth select transistor of the depletion type, a fifteenth select transistor of the depletion type, and a sixteenth select transistor of the enhancement type connected in series in order from the memory cell side between the source line and the memory cells of the fourth string unit,
the fifth string unit includes a seventeenth select transistor of the enhancement type, an eighteenth select transistor of the depletion type, a nineteenth select transistor of the enhancement type, and a twentieth select transistor of the depletion type connected in series in order from the memory cell side between the source line and the memory cells of the fifth string unit, and
the sixth string unit includes a twenty-first select transistor of the enhancement type, a twenty-second select transistor of the enhancement type, a twenty-third select transistor of the depletion type, and a twenty-fourth select transistor of the depletion type connected in series in order from the memory cell side between the source line and the memory cells of the sixth string unit.

13. The device according to claim 12, wherein
when the first string unit is selected, the first to fifth, seventh to ninth, eleventh to twelfth, fourteenth to sixteenth, eighteenth to twentieth, and twenty-third to twenty-fourth select transistors are set to ON and the other select transistors are set to OFF,
when the second string unit is selected, the first to second, fourth to tenth, twelfth, fourteenth to sixteenth, eighteenth, twentieth, and twenty-second to twenty-fourth select transistors are set to ON and the other select transistors are set to OFF,
when the third string unit is selected, the first to third, fifth to seventh, ninth to twelfth, fourteenth to fifteenth, eighteenth to twentieth, and twenty-second to twenty-fourth select transistors are set to ON and the other select transistors are set to OFF,
when the fourth string unit is selected, the first to second, fourth to fifth, seventh to ninth, twelfth to eighteenth, twentieth to twenty-first, and twenty-third to twenty-fourth select transistors are set to ON and the other select transistors are set to OFF,
when the fifth string unit is selected, the first to third, fifth, seventh, ninth, eleventh to fifteenth, seventeenth to twenty-first, and twenty-third to twenty-fourth select transistors are set to ON and the other select transistors are set to OFF, and
when the sixth string unit is selected, the first to second, fifth to seventh, ninth to tenth, twelfth to fifteenth, seventeenth to eighteenth, and twentieth to twenty-fourth select transistors are set to ON and the other select transistors are set to OFF.

14. The device according to claim 8, wherein
the stacked body includes two layers of the select gates,
the first to second string units in one of the blocks are arranged to be separated from each other in the second direction,
the first string unit includes a first select transistor of the depletion type, and a second select transistor of the enhancement type connected in series in order from the memory cell side between a source line and the memory cells of the first string unit, and
the second string unit includes a third select transistor of the enhancement type, and a fourth select transistor of the depletion type connected in series in order from the memory cell side between the source line and the memory cells of the second string unit.

15. A semiconductor memory device, comprising first to nth memory cells (n being a natural number of 2 or more), the first to nth memory cells each having a plurality of thresholds,
the first to nth memory cells being selected simultaneously in a read operation,
after the read operation, k pieces of read data (k being n or less) being determined from n pieces of data read from the first to nth memory cells.

16. The device according to claim 15, wherein
the first to nth memory cells include a first state, a second state, a third state, and an hth state (h being 3 or more),
the first state and the second state are discriminated by applying a first read voltage to gates of the first to nth memory cells,
the second state and the third state are discriminated by applying a second read voltage to the gates of the first to nth memory cells,
the (h−1)th state and the hth state are discriminated by applying an (h−1)th read voltage to the gates of the first to nth memory cells, and
a voltage of the first to (h−1)th read voltages is applied to the first to nth memory cells in the read operation.

* * * * *